US 6,627,960 B2

(12) United States Patent
Nii et al.

(10) Patent No.: US 6,627,960 B2
(45) Date of Patent: Sep. 30, 2003

(54) SEMICONDUCTOR DATA STORAGE APPARATUS

(75) Inventors: Koji Nii, Tokyo (JP); Yoshinori Okada, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 16 days.

(21) Appl. No.: 09/883,354

(22) Filed: Jun. 19, 2001

(65) Prior Publication Data
US 2002/0024049 A1 Feb. 28, 2002

(30) Foreign Application Priority Data
Aug. 23, 2000 (JP) .......................... 2000-253078

(51) Int. Cl.[7] .......................... H01L 29/76; H01L 27/11
(52) U.S. Cl. .......................... 257/371; 257/393; 257/903; 257/206
(58) Field of Search .......................... 257/903, 904, 257/369, 371, 67, 393, 206

(56) References Cited
U.S. PATENT DOCUMENTS
5,281,843 A * 1/1994 Ochii et al. .................. 257/903
5,338,963 A 8/1994 Klaasen et al.

FOREIGN PATENT DOCUMENTS
| JP | 62-33392 | 2/1987 |
| JP | 7-161844 | 6/1995 |
| JP | 7-263577 | 10/1995 |
| JP | 9-270469 | 10/1997 |

* cited by examiner

Primary Examiner—Minh Loan Tran
(74) Attorney, Agent, or Firm—Leydig, Voit & Mayer, Ltd.

(57) ABSTRACT

An SRAM memory cell includes two inverters connected in complement with each other. Each inverter includes one NMOS transistor and one PMOS transistor. The gate of the NMOS transistor in one inverter is connected to the drain of the NMOS transistor in the other inverter and this forms a first node. The drain of the NMOS transistor in one inverter is connected to the gate of the NMOS transistor in the other inverter and this forms a second node. The drain of an another PMOS transistor and the gate of still another PMOS transistor are connected to the first node. The drain of the still another PMOS transistor and the gate of the another PMOS transistor are connected to the second node. The gate capacitance and drain capacitance of these PMOS transistors is appended to the two nodes.

15 Claims, 43 Drawing Sheets

▓ CONTACT HOLE

☒ VIA HOLE

▩ CONTACT HOLE + VIA HOLE

SEMICONDUCTOR DATA STORAGE APPARATUS

FIELD OF THE INVENTION

The present invention in general relates to a semiconductor storage apparatus comprising a SRAM (Static Random Access Memory) memory cell. In particular, this invention relates to the semiconductor storage apparatus for improving soft error resilience.

BACKGROUND OF THE INVENTION

In recent years, there is an increasing demand for lighter and thinner electronic devices which function at high-speed. At present, a microcomputer must be mounted in such electronic devices. The constitution of the microcomputer requires a large-capacity and high-speed memory. In view of the rapid proliferation of high-performance personal computers, there is a demand for a large-scale cache memory in order to achieve high-speed processing. That is, there is a demand for a high-speed and large-scale RAM which is used by a CPU when executing control programs and the like.

Generally, a DRAM (Dynamic RAM) and an SRAM (static RAM) are used as the RAM. The SRAM is usually used as the section needed for high-speed processing such as the cache memory mentioned above. Two types of SRAM memory cell constitutions are known. The two types are, a high-resistance load type comprising four transistors and two high-resistance elements, and a CMOS comprising six transistors. These days the CMOS SRAM is used more often since it has extremely low current leakage when holding data and is consequently highly reliable.

FIG. 55 is a circuit diagram showing a memory cell of a conventional CMOS SRAM. FIG. 55 shows only the circuit sections of the memory cell which maintain memory, and omits the MOS transistor for access which is needed for reading and writing the memory status. As shown in FIG. 55, the memory cell can be expressed by two inverters INV1 and INV2 which connect an input terminal and an output terminal in complement.

FIG. 56 is a circuit diagram showing the internal circuit constitution of the inverters INV1 and INV2, that is, a MOS inverter circuit. As shown in FIG. 56, each of the inverters INV1 and INV2 comprises one PMOS transistor PM1 and one NMOS transistor NM1. The source of the PMOS transistor PM1 is connected to a power line $V_{DD}$ and the source of the NMOS transistor NM1 is connected to a ground line GND. The drains of the two transistors are connected together. These commonly connected drains form an output terminal OUT. The gates of the two transistors are connected together. These commonly connected gates form an input terminal IN. The inverter function is realized by a CMOS constitution wherein the PMOS transistor PM1 functions as a load transistor and the NMOS transistor NM1 functions as a drive transistor.

The operation of the CMOS inverter circuit shown in FIG. 56 will be explained. When a potential at high logical level (hereafter, "H"), i.e. $V_{DD}$ potential, is applied to the input terminal IN, the PMOS transistor PM1 switches OFF and the NMOS transistor NM1 switches ON.

Consequently, the output terminal OUT is electrically connected via the NMOS transistor NM1 to the ground line, and its potential becomes low logical level (hereafter, "L"), i.e. GND potential. Conversely, when a potential at logical level "L", i.e. the GND potential, is applied to the input terminal IN, the NMOS transistor NM1 switches OFF and the PMOS transistor PM1 switches ON. Consequently, the output terminal OUT is electrically connected via the PMOS transistor PM1 to the power line, and its potential becomes logical level "H", i.e. the $V_{DD}$ potential. Thus, there is a complementary relationship between the logic of the input and output of the CMOS inverter circuit.

Subsequently, the conventional memory cell shown in FIG. 55 will be explained. The input terminal of the inverter INV1 and the output terminal of the inverter INV2 are connected together, and the output terminal of the inverter INV1 and the input terminal of the inverter INV2 are connected together. Therefore, there is a complementary relationship between the memory nodes NA and NB in FIG. 55.

For instance, when the storage node NA has a potential of logical level "H", the storage node NB is stable at a potential of logical level "L", and vice versa. In this way, the memory cell comprising the inverters has two different stable logical states depending on whether the two storage nodes NA and NB are at the "H" or "L" levels, and the logical state of the memory cell is held as one bit of stored data.

The semiconductor storage apparatus comprising the CMOS inverter circuit has extremely good stability and so far there have been no problems regarding noise tolerance. However, in the case of a large-capacity memory formed by integrating a great number of memory cells such as that described above, the memory cell area per bit becomes extremely small, affecting the charge generated when the circuit is struck by ionizing radiation. That is, the storing status of the memory cells is made unstable by the emission of radiation, increasing the possibility of errors such as inverted data storage.

This phenomenon is termed a "soft error" and is caused by α rays which are emitted from the materials used for packaging and inter connections. A soft error is particularly likely to occur as the power voltage decreases. For this reason, the matter of how to increase tolerance against soft errors is an important issue in recent semiconductor storage apparatuses which are driven at low power.

Various semiconductor storage apparatuses wherein soft-error tolerance is increased by increasing the capacitance of the storage nodes have been proposed. For example, according to the "semiconductor memory apparatus" disclosed in Japanese Patent Application Laid-Open No. 9-27046, a capacitor is formed by inserting a thin active region between the storage nodes (i.e. the connections between the gates of the driving transistors and the gates of the load transistors forming the CMOS inverter) and the semiconductor substrate, thereby increasing the capacitance of the storage node sections.

On the other hand, there is a nonvolatile semiconductor storage apparatus comprising a memory cell for SRAM, a transistor for access and several capacitors. In this nonvolatile semiconductor storage apparatus, the capacitance of the storage nodes is an important matter.

According to this nonvolatile semiconductor storage apparatus, the potential is determined by dividing the capacitance of the multiple capacitors and data is written. The relative sizes of the capacitances of the capacitors connected at the nodes is read when the power is switched ON. Therefore, it has been difficult to suitably design the capacitors. Japanese Patent Application Laid-Open No. 62-33392 discloses a "nonvolatile semiconductor storage apparatus" in which the capacitors are eliminated by connecting the gate of an MOS transistor having a floating gate to the storage node of the SRAM memory cell instead of the capacitor, thereby forming a nonvolatile memory section.

However, in order to meet demands for a more highly-integrated semiconductor storage apparatus having larger capacity, the constituent elements of the memory cell must be made minute. This leads to the disadvantages that the capacitance of the storage node section becomes even smaller, increasing the possibility of soft errors.

To solve this problem, conventional memory cells such as that disclosed in Japanese Patent Application Laid-Open No. 9-270469 described above must use a specific semiconductor layout pattern in order to increase the capacitance of the storage node sections. The process of redesigning the layout pattern so as to cope with high integration of the memory cell in the future are complex, and there may not be any easy solutions.

According to the "nonvolatile semiconductor storage apparatus" disclosed in Japanese Patent Application Laid-Open No. 62-33392 mentioned above, the MOS transistor connected to the storage node of the SRAM memory cell comprises a nonvolatile memory section, and consequently must have a layout enabling a floating gate to be provided. Moreover, the storage state of the floating gate may be altered as a result of the emission of α rays. This "nonvolatile semiconductor memory apparatus" cannot simultaneously realize the nonvolatile memory function and soft error countermeasures, nor is it intended to do so.

SUMMARY OF THE INVENTION

It is an object of this invention to obtain a semiconductor storage apparatus in which soft error countermeasures have been implemented, that is, to increase the capacity of storage nodes by providing a PMOS transistor and NMOS transistor having established processes of design and manufacturing to an SRAM memory cell and connecting the gates of the added MOS transistors to the storage nodes.

In the semiconductor storage apparatus according to one aspect of this invention, load transistors such as, for example, diode-connected MOS transistors are connected to the drains of a first NMOS transistor and a second NMOS transistor NM1, thereby obtaining an SRAM memory cell. The drain of a first PMOS transistor and the gate of a second PMOS transistor are connected to a first node which is a storage node. The drain of the second PMOS transistor and the gate of the first PMOS transistor are connected to a second node which is another storage node. The gate capacity and drain capacity of the PMOS transistors can be added to the storage nodes.

In the semiconductor storage apparatus according to another aspect of this invention, shared diffusion regions for providing the drains and sources of the first, third, fifth and seventh NMOS transistors and connecting them together can easily be provided therebetween. Furthermore, shared diffusion regions for providing the drains and sources of the second, fourth, sixth and eighth NMOS transistors and connecting them together can easily be provided therebetween.

Other objects and features of this invention will become apparent from the following description with reference to the accompanying drawings.

BRIEF DESCRIPTION OF THE DRAWINGS

FIG. 21 is a diagram showing the layout of the SRAM memory cell comprising the semiconductor storage apparatus according to the seventh embodiment;

FIG. 22 is a diagram showing various codes of connector holes, via holes, and the like.

DESCRIPTION OF THE PREFERRED EMBODIMENTS

Preferred embodiments of the semiconductor storage apparatus of the present invention will be explained in detail with reference to the drawings. This invention is not restricted to these embodiments.

To begin with, the semiconductor storage apparatus according to a first embodiment will be explained. The semiconductor storage apparatus according to the first embodiment comprises two PMOS transistors. The sources of the PMOS transistors are connected together, their drains are connected to one of two storage nodes, and their gates are connected to the other of the two storage nodes.

Figure 1:
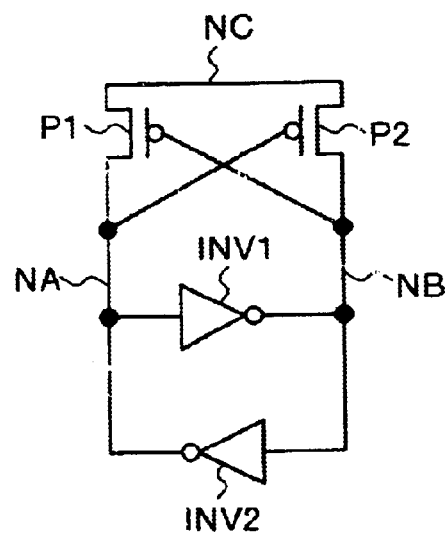
FIG. 1 is a circuit diagram showing an SRAM memory cell comprising a semiconductor storage apparatus according to a first embodiment.

FIG. 1 is a circuit diagram showing an SRAM memory cell comprising the semiconductor storage apparatus according to the first embodiment. Like the conventional memory cell, the SRAM memory cell comprising the semiconductor storage apparatus according to the first embodiment comprises two inverters INV1 and INV2 which are connected in complement.

A storage node NA is formed on the wire connecting the input terminal of the inverter INV1 and the output terminal of the inverter INV2, and a storage node NB is formed on the wire connecting the input terminal of the inverter INV2 and the output terminal of the inverter INV1.

In this semiconductor storage apparatus, two PMOS transistors P1 and P2 are provided in addition to the two inverters INV1 and INV2. The sources of the two PMOS transistors P1 and P2 are connected together, thereby forming an internal node NC. The drain of the PMOS transistor P1 is connected to the storage node NA and the gate is connected to the storage node NB. The drain of the PMOS transistor P2 is connected to the storage node NB and the gate is connected to the storage node NA.

The operation of the SRAM memory cell comprising the semiconductor storage apparatus according to this embodiment, that is, the SRAM memory cell shown in FIG. 1, will be explained. When the potential of the storage node NA has a logical level "H", the potential of the storage node NB stabilizes at a logical level "L", and vice versa. Consequently, the memory cell which comprises the inverters INV1 and INV2 has two different stable logical statuses depending on whether the logical levels of the two storage nodes NA and NM are "H" or "L". This logical status is held as one bit of stored data.

Since the gate of the PMOS transistor P2 is connected to the storage node NA, the PMOS transistor P2 switches ON and OFF in accordance with the logical status of the storage node NA. Similarly, since the gate of the PMOS transistor P1 is connected to the storage node NB, the PMOS transistor P1 switches ON and OFF in accordance with the logical status of the storage node NB.

For example, when the potential of the storage node NA has a logical level "H" (i.e. when the potential of the storage node NB has a logical level "L"), the PMOS transistor P1 switches ON and the PMOS transistor P2 switches OFF. The charge at the storage node NA fluctuates in accordance with the source potential of the PMOS transistor P1, but no charge is supplied to the source of the PMOS transistor P1 since it is connected to the source of the PMOS transistor P2 which is now OFF.

On the contrary, when the potential of the storage node NA has a logical level "L" (i.e. Whew the potential of the storage node NB has a logical level "H"), the PMOS transistor P1 switches OFF and the PMOS transistor P2 switches ON. The charge at the storage node NB fluctuates in accordance with the source potential of the PMOS transistor P2, but no charge is supplied to the source of the PMOS transistor P2 since it is connected to the source of the PMOS transistor P1 which is now OFF.

That is, the changes in the ON/OFF status of the PMOS transistor P1 and P2 do not affect the storage stability of the storage nodes NA and NB.

Since the drain of the PMOS transistor P1 and the gate of the PMOS transistor P2 are connected to the storage node NA, their respective drain and gate capacities are appended to the storage node NA. When the PMOS transistor P1 is ON, the source capacities of the PMOS transistors P1 and P2 are also appended to the storage node NA.

Similarly, since the drain of the PMOS transistor P2 and the gate of the PMOS transistor P1 are connected to the storage node NB, their respective drain and gate capacities are appended to the storage node NB. When the PMOS transistor P2 is ON, the source capacities of the PMOS transistors P1 and P2 are also appended to the storage node NB. In other words, the capacities of the storage node NA and NB sections are larger than in the conventional SRAM memory cell.

As described above, the semiconductor storage apparatus according to the first embodiment comprises two PMOS transistors P1 and P2, the drain of the PMOS transistor P1 and the gate of the PMOS transistor P2 being connected to the storage node NA, and the drain of the PMOS transistor P2 and the gate of the PMOS transistor P1 being connected to the storage node NB. Therefore, the capacity of the drain of the PMOS transistor P1 and the capacity of the gate of the PMOS transistor P2 can be appended to the storage node NA, and the capacity of the drain of the PMOS transistor P2 and the capacity of the gate of the PMOS transistor P1 can be appended to the storage node NB. Consequently, mistakes such as inversion of stored data caused by external factors such as α rays are unlikely to happen, and soft error tolerance can be increased.

Since the source of the PMOS transistor P1 is connected to the source of the PMOS transistor P2, the source capacities of the PMOS transistors P1 and P2 can be appended to the storage nodes NA and NB when the storage nodes are at logical level "H". Therefore, soft error tolerance can be further increased.

Since the processes of designing and manufacturing the newly provided PMOS transistors P1 and P2 are established, a variety of layout patterns can be used for semiconductor storage apparatuses having different storage capacities. The PMOS transistors P1 and P2 can be created in the same manufacturing process as the MOS transistors which comprise the inverters INV1 and INV2 by using the same master pattern. Therefore, it is possible to increase the capacity of the storage nodes NA and NB without the addition of complex design and manufacturing processes.

Figure 2:
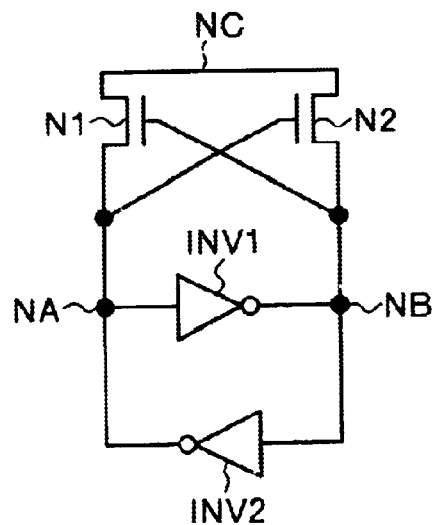
FIG. 2 is a circuit diagram showing another example of an SRAM memory cell comprising a semiconductor storage apparatus according to the first embodiment.

As an another example of the configuration in the first embodiment, NMOS transistors may be provided instead of the PMOS transistors. FIG. 2 is a circuit diagram which shows a semiconductor storage apparatus in which NMOS transistors are provided instead of the PMOS transistors. As shown in FIG. 2, the NMOS transistors N1 and N2 are the one that are newly provided. The sources of these NMOS transistors N1 and N2 are connected together to form an internal node NC. The drain of the NMOS transistor N1 is connected to the storage node NA and its gate is connected to the storage node NB. The drain of the NMOS transistor N2 is connected to the storage node NB and its gate is connected to the storage node NA. The same effects as when the PMOS transistors are provided are obtained even if the PMOS transistors are replaced with NMOS transistors.

Subsequently, a semiconductor storage apparatus according to a second embodiment will be explained. The semiconductor storage apparatus according to the second embodiment is characterized in that, in the SRAM memory cell of the semiconductor storage apparatus of the first embodiment, a transistor for access is provided to the storage nodes NA and NB and enables stored data to be read and written.

Figure 3:
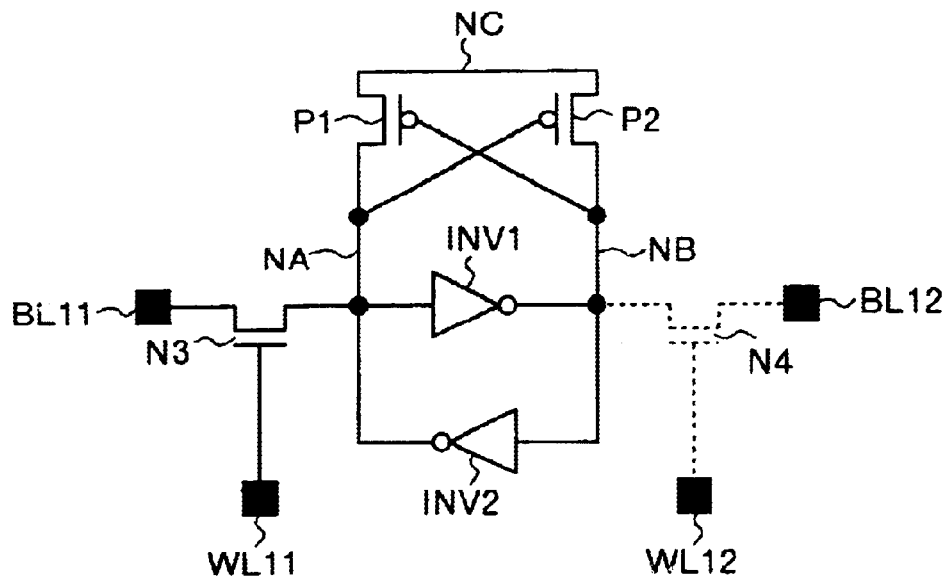
FIG. 3 is a circuit diagram showing an SRAM memory cell comprising a semiconductor storage apparatus according to a second embodiment.

FIG. 3 is a circuit diagram showing a transistor for access connected to the SRAM memory cell shown in FIG. 1. In FIG. 3, parts which are identical to those in FIG. 1 are represented by identical legends and further explanation thereof is omitted in order to avoid repetition of explanation. In FIG. 3, connection terminals BL11 and BL12 represent terminals connecting to the bit line, and connection terminals WL11 and WL12 represent terminals connecting to the word line.

The semiconductor storage apparatus according to the second embodiment is provided with an NMOS transistor N3, in addition to the configuration of the first embodiment, for access to the SRAM memory cell. The source of the NMOS transistor N3 is connected to the storage node NA, the drain is connected to the connection terminal BL11, and the gate is connected to the connection terminal WL11.

The operation of the SRAM memory cell shown in FIG. 3 will be explained. When the terminal WL11 connected to the word line is at logical status "L", the NMOS transistor N3 is OFF, and the storage node NA is electrically cut off from the connection terminal BL11 which is connected to the bit line and corresponds to the terminal for reading and writing data. That is, a state of holding stored data is maintained.

When an external signal shifts the logical level of the terminal WL11 to "H", the NMOS transistor N3 switches from OFF to ON, whereby the storage node NA becomes electrically connected to the connection terminal BL11. When no write voltage is applied from the outside to the connection terminal BL11, the data which is stored at the storage node NA is transmitted via the NMOS transistor N3 to the connection terminal BL11, i.e. the data is read out.

On the other hand, when the terminal WL11 is at logical level "H" and a write voltage is applied from the outside to the terminal BL11 (i.e. Whew an outside device not shown in FIG. 3 strongly drives the terminal BL11 which is at logical level "L" or "H"), the write voltage is transmitted via the NMOS transistor N3 to the storage node NA, and the storage node NA is rewritten to a logical status matching that of the write voltage. When a signal from the outside shifts the logical status of the connection terminal WL11 from "H" to "L", the storage node NA returns to data storage status once again.

As described above, the NMOS transistor N3 for access is provided to the storage node NA of the first embodiment is the semiconductor storage apparatus of the second embodiment. Therefore, it is possible to read and write data to/from the semiconductor storage apparatus having the advantages of the first embodiment, i.e. having increased tolerance to soft errors.

As shown by a dotted line in FIG. 3, an NMOS transistor N4 for access may also be provided to the storage node NB. The source of the NMOS transistor N4 is connected to the storage node NB, the drain is connected to the terminal BL12 connecting to the bit line, and the gate is connected to the terminal WL12 connecting to the word line. The operation of the NMOS transistor N4 for access is the same as the operation of the NMOS transistor N3 described above, and will not be explained further to avoid repetition of explanation.

In many cases, during normal SRAM operation, the connection terminals WL11 and W12 are commonly connected and the connection terminals BL11 and BL12 operate in complement with each other. However, the NMOS transistors N3 and N4 can be operated independently of each other.

Figure 4:
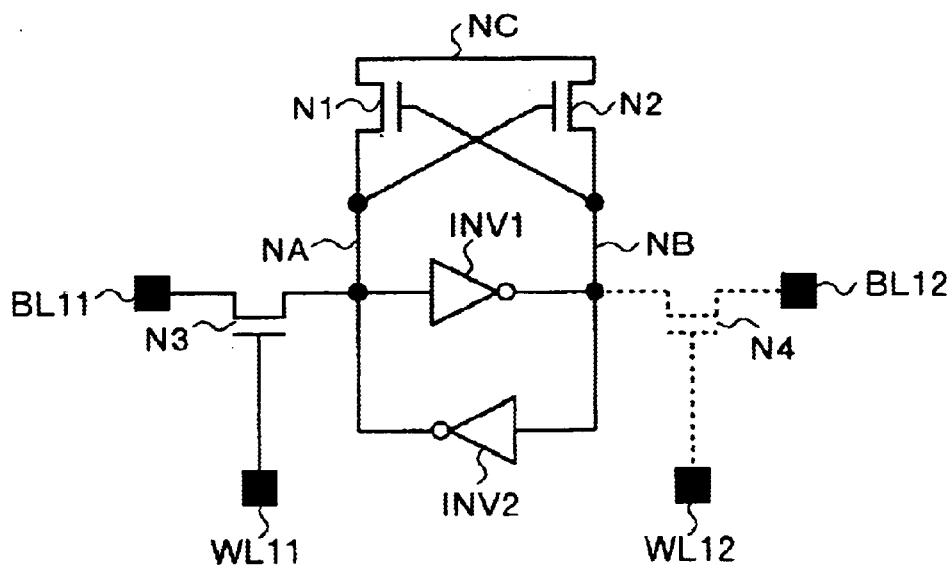
FIG. 4 is a circuit diagram showing another example of an SRAM memory cell comprising a semiconductor storage apparatus according to the second embodiment.

FIG. 4 is a circuit diagram showing a case in which the PMOS transistors P1 and P2 in FIG. 3 are replaced with NMOS transistors N1 and N2 respectively. As shown in FIG. 4, data can be read and written by connecting the NMOS transistors N3 and N4 even in the case when an NMOS transistor is added in order to increase capacity.

Figure 5:
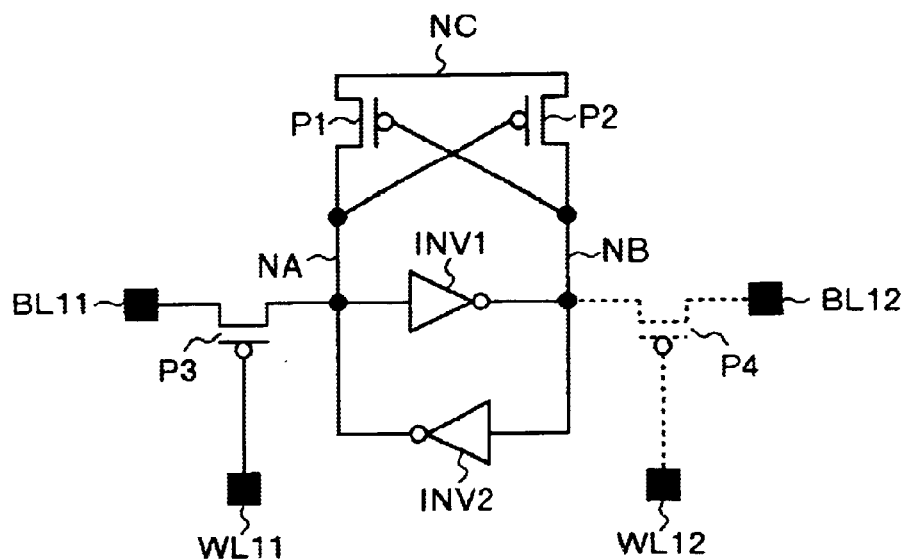
FIG. 5 is a circuit diagram showing the case where the NMOS transistors for access in the SRAM memory cell comprising the semiconductor storage apparatus according to the second embodiment are replaced by PMOS transistors.
Figure 6:
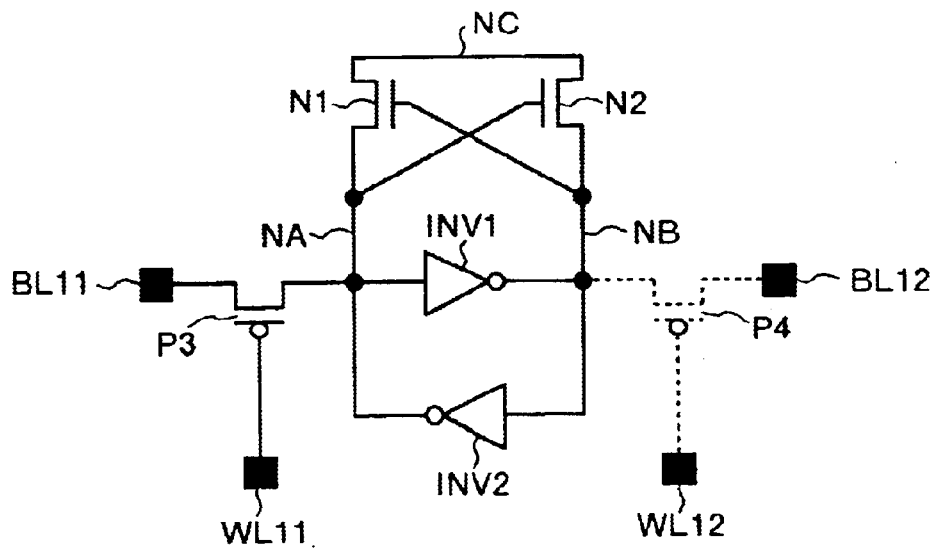
FIG. 6 is a circuit diagram showing the case where the NMOS transistors for access in another example of the SRAM memory cell comprising the semiconductor storage apparatus according to the second embodiment are replaced by PMOS transistors.

It is obvious that a PMOS transistor may be used as the MOS transistor for access. FIG. 5 shows a circuit in which PMOS transistors for access P3 and P4 are provided instead of the NMOS transistors for access N3 and N4 shown in FIG. 3. FIG. 6 shows a circuit in which PMOS transistors for access P3 and P4 are provided instead of the NMOS transistors for access N3 and N4 shown in FIG. 4. The circuits of FIG. 5 and FIG. 6 have all the advantage of the first embodiment, i.e. increasing tolerance to soft errors, while also making it possible to read and write data.

A semiconductor storage apparatus according to a third embodiment will be explained. The semiconductor storage apparatus according to the third embodiment is characterized in that, in the SRAM memory cell of the semiconductor storage apparatus of the first embodiment, two transistors for access are provided to each of the storage nodes NA and NB and enable stored data to be read and written, thereby forming a two-port SRAM.

Figure 7:
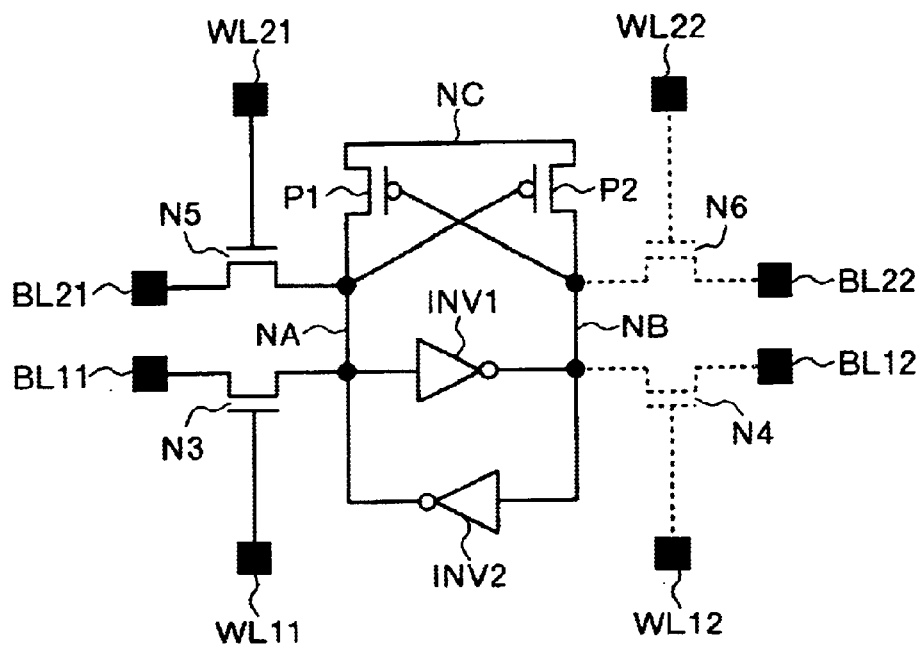
FIG. 7 is a circuit diagram showing an SRAM memory cell comprising the semiconductor storage apparatus according to a third embodiment.
Figure 8:
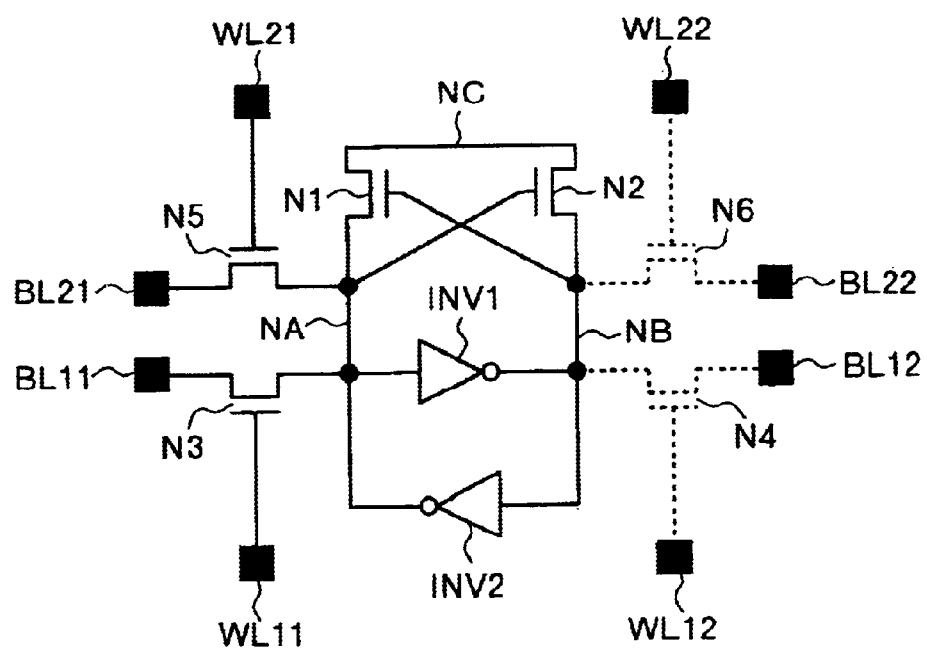
FIG. 8 is a circuit diagram showing another example of an SRAM memory cell comprising the semiconductor storage apparatus according to the third embodiment.

FIG. 7 is a circuit diagram for a case in which two transistors for access connected to each of the storage nodes NA and NB shown in FIG. 1. FIG. 8 is a circuit diagram for a case in which two transistors for access connected to each of the storage nodes NA and NB shown in FIG. 2. In these figures, parts which are common to those in FIG. 1 and FIG. 2 are represented by identical legends and further explanation thereof is omitted in order to avoid repetition of explanation. In these figures, terminals BL11, BL12, BL21 and BL22 represent terminals that are connected to the bit line, and terminals WL11, WL12, WL21 and WL22 represent terminals that are connected to the word line.

The semiconductor storage apparatus according to the third embodiment is provided with NMOS transistors N3 and N4 for access to the SRAM memory cell of the first embodiment. The source of the NMOS transistor N3 is connected to the storage node NA, its drain is connected to the connection terminal BL11, and its gate is connected to the connection terminal WL11. The source of the NMOS transistor N5 is also connected to the storage node NA, its drain is connected to the connection terminal BL21, and its gate is connected to the connection terminal WL21.

The operation of the SRAM memory cell shown in FIG. 7 and FIG. 8 will be explained. When the logical status of the terminals WL11 and WL21 which connect to the word line is "L", the NMOS transistors N3 and N5 are OFF, and the storage node NA is electrically cut off from the terminals BL11 and BL21 which connect to the bit line and correspond to terminals for reading and writing data. That is, a state of holding stored data is maintained.

When an external signal shifts the logical status of the terminals WL11 and WL21 which connect to the word line from "L" to "H", the NMOS transistors N3 and N5 switch from OFF to ON, whereby the storage node NA becomes electrically connected to the connection terminals BL11 and BL21. When no write voltage is applied from the outside to the connection terminals BL11 and BL21, the data which is stored at the storage node NA is transmitted via the NMOS transistors N3 and N5 to the connection terminals BL11 and BL21, i.e. the data is read out.

On the other hand, when the connection terminals WL11 and WL21 have a logical status of "H" and a write voltage is applied from the outside to the connection terminals BL11 and BL21 (i.e. Whew an outside device not shown in FIG. 3 strongly drives the connection terminals BL11 and BL21 at the L or H level), the write voltage is transmitted via the NMOS transistors N3 and N5 to the storage node NA, and the storage node NA is rewritten to a logical status matching that of the write voltage. When the signal from the outside shifts the logical status of the connection terminals WL11 and WL21 from "H" to "L", the storage node NA returns to data storage status once again.

As described above, two NMOS transistors for access N3 and N5 are provided to the storage node NA of the first embodiment in the semiconductor storage apparatus of the third embodiment. Therefore, it is possible to read and write data to/from a two-port SRAM semiconductor storage apparatus having the advantages of the first embodiment, i.e. having increased tolerance to soft errors.

As shown by dotted lines in FIG. 7 and FIG. 8, NMOS transistors for access N4 and N6 may also be provided to the storage node NB. The source of the NMOS transistor N4 is connected to the storage node NB, its drain is connected to the terminal BL12 connecting to the bit line, and its gate is connected to the terminal WL12 connecting to the word line. The source of the NMOS transistor N6 is connected to the storage node NB, its drain is connected to the terminal BL22 connecting to the bit line, and its gate is connected to the terminal WL22 connecting to the word line. The operation of the NMOS transistors for access N4 and N6 is the same as the operation of the NMOS transistors N3 and N5 described above, and will not be explained further in order to avoid repetition of explanation.

Figure 9:
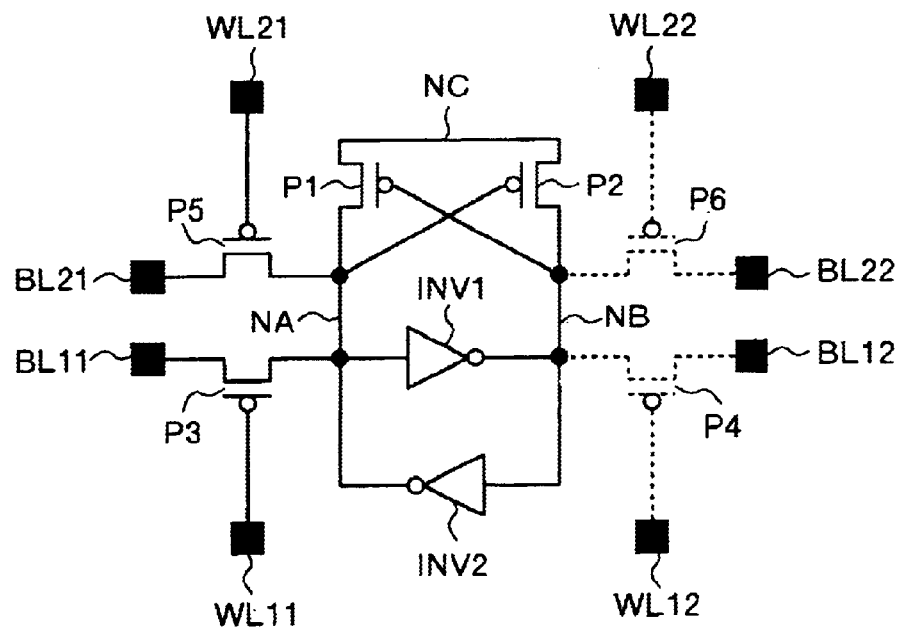
FIG. 9 is a circuit diagram showing the case where two PMOS transistors are connected as transistors for access to each storage node in the SRAM memory cell comprising the semiconductor storage apparatus according to the third embodiment.
Figure 10:
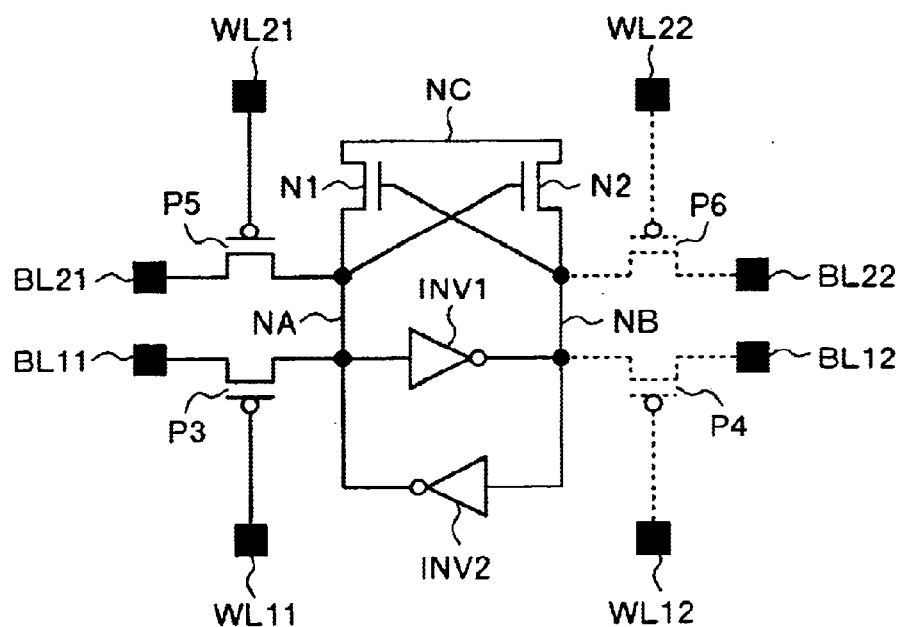
FIG. 10 is a circuit diagram showing the case where two PMOS transistors are connected as transistors for access to each storage node in another example of the SRAM memory cell comprising the semiconductor storage apparatus according to the third embodiment.

As mentioned above, it is obvious to use PMOS transistors as the MOS transistors for access. FIG. 9 show a circuit in the case in which PMOS transistors for access P3, P4, P5 and P6 are provided instead of the NMOS transistors for access N3, N4, N5 and N6 shown in FIG. 7. FIG. 10 show a circuit in the case in which PMOS transistors for access P3, P4, P5 and P6 are provided instead of the NMOS transistors for access N3, N4, N5 and N6 shown in FIG. 8. The circuits of FIG. 9 and FIG. 10 achieve the advantage of the first embodiment, i.e. increasing tolerance to soft errors, while also making it possible to read and write data to/from the two-port SRAM.

Subsequently, a semiconductor storage apparatus according to a fourth embodiment will be explained. The semiconductor storage apparatus according to the fourth embodiment comprises two PMOS transistors, the sources and drains of each being connected together. The drains of the PMOS transistors connect to one of two storage nodes and the gates of the PMOS transistors connect to the other of the two storage nodes.

Figure 11:
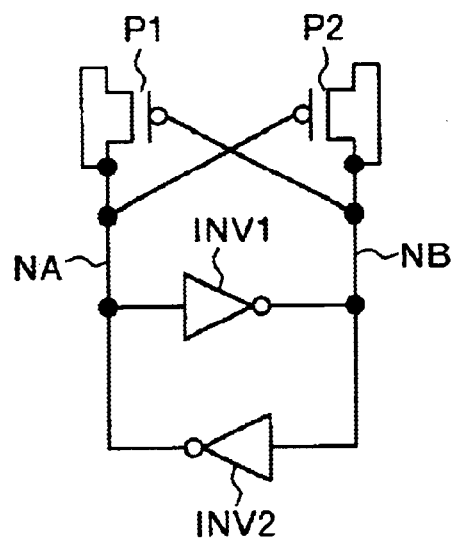
FIG. 11 is a circuit diagram showing an SRAM memory cell comprising the semiconductor storage apparatus according to a fourth embodiment.

FIG. 11 is a circuit diagram showing an SRAM memory cell comprising the semiconductor storage apparatus according to the fourth embodiment. In the SRAM memory cell of the semiconductor storage apparatus according to the fourth embodiment, the source and drain of the PMOS transistor P1 are connected together and the source and drain of the PMOS transistor P2 are connected together. This feature differs from the constitution of the first embodiment. The rest of the constitution is the same and therefore will not be explained further.

Only the operation of the SRAM memory cell shown in FIG. 11 which differ from the operation of the first embodiment will be explained here. The gate of the PMOS transistor P2 is connected to the storage node NA. Consequently, the PMOS transistor P2 switches ON and OFF in accordance with the logical status of the storage node NA. The gate of the PMOS transistor P1 is connected to the storage node NB. Consequently, the PMOS transistor P1 switches ON and OFF in accordance with the logical status of the storage node NB. When the PMOS transistors P1 and P2 switch ON and OFF, this does not affect the two stable logical statuses of the storage nodes NA and NB.

For example, when the storage node NA is stable at the "H" level, the PMOS transistor P1 is OFF and the PMOS transistor P2 is ON. Since the source and drain of the PMOS transistor P2 are connected together, they have the same potential as the storage node NB and consequently hold the "L" level, despite the fact that the PMOS transistor P2 is ON. That is, the storage nodes NA and NB are not affected by the fact that the PMOS transistor P2 is ON.

Similarly, since the source and drain of the PMOS transistor P1 are connected together, they have the same potential as the storage node NA and consequently hold the "H" level, despite the fact that the PMOS transistor P1 is OFF. That is, the storage nodes NA and NB are not affected by the fact that the PMOS transistor P1 is OFF.

Conversely, when the storage node NA is stable at the "L" level, the PMOS transistor P1 is ON and the PMOS transistor P2 is OFF. Since the source and drain of the PMOS transistor P1 are connected together, they have the same potential as the storage node NB and consequently hold the "H" level, despite the fact that the PMOS transistor P1 is ON. Likewise, since the source and drain of the PMOS transistor P2 are connected together, they have the same potential as the storage node NA and consequently hold the "L" level, despite the fact that the PMOS transistor P2 is OFF.

Therefore, the stable storage states of the two storage nodes NA and NB are not affected when the PMOS transistors P1 and P2 switch ON and OFF. By connecting the storage node NA to the gate of the PMOS transistor P2 and to the drain and source of the PMOS transistor P1, the gate capacity of the PMOS transistor P2 and the drain capacity and source capacity of the PMOS transistor P1 are appended to the storage node NA. Similarly, by connecting the storage node NB to the gate of the PMOS transistor P1 and to the drain and source of the PMOS transistor P2, the gate capacity of the PMOS transistor P1 and the drain capacity and source capacity of the PMOS transistor P2 are appended to the storage node NB. As a consequence, the capacities of the storage nodes NA and NB are greater than those of conventional SRAM memory cells.

As described above, according to semiconductor storage apparatus of the fourth embodiment, the drain of the newly provided PMOS transistor P1 and the source and gate of the newly provided PMOS transistor P2 are connected to the storage node NA of the SRAM memory cell, thereby increasing the capacity of the storage node NA. Moreover, the drain of the newly provided PMOS transistor P2 and the source and gate of the newly provided PMOS transistor P1 are connected to the storage node NB of the SRAM memory cell, thereby increasing the capacity of the storage node NB. Therefore, the same effects as the first embodiment can be achieved.

Figure 12:
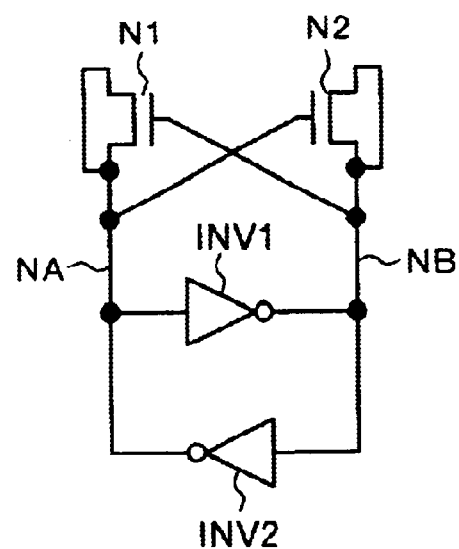
FIG. 12 is a circuit diagram showing another example of an SRAM memory cell comprising the semiconductor storage apparatus according to a fourth embodiment.

Obviously, NMOS transistors may be provided instead of the PMOS transistors. FIG. 12 shows a circuit diagram in this case. As shown in FIG. 12, two NMOS transistors N1 and N2 are provided instead of the PMOS transistors P1 and P2 shown in FIG. 11. The drains of the PMOS transistor N1 is connected to the source of the PMOS transistor N2. Similarly, the drains of the PMOS transistor N2 is connected to the source of the PMOS transistor N1. Further, the drain of the NMOS transistor N1 is connected to the storage node NA and its gate is connected to the storage node NB. On the other hand, the drain of the NMOS transistor N2 is connected to the storage node NB and its gate is connected to the storage node NA. The same effects as in any of the above-described circuits are obtained with the circuit of FIG. 12.

As in the second and third embodiments, data can be read and written in the fourth embodiment by connecting multiple MOS transistors for access.

Subsequently, the semiconductor storage apparatus according to a fifth embodiment will be explained. The semiconductor storage apparatus according to the fifth embodiment is characterized in that the sources of the two PMOS transistors in the fourth embodiment are open.

Figure 13:
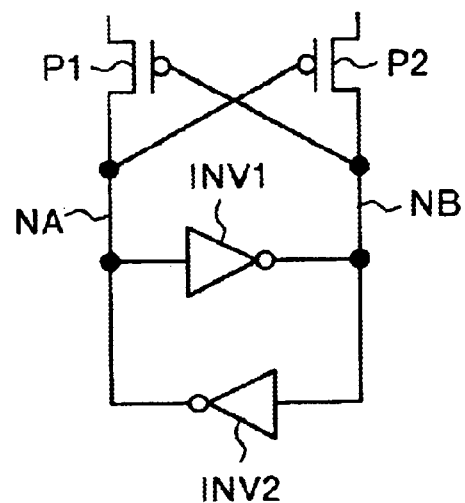
FIG. 13 is a circuit diagram showing an SRAM memory cell comprising the semiconductor storage apparatus according to a fifth embodiment.

FIG. 13 is a circuit diagram showing an SRAM memory cell comprising the semiconductor storage apparatus according to the fifth embodiment. As shown in FIG. 13, in the SRAM memory cell of the semiconductor storage apparatus according to the fifth embodiment, the drain of the PMOS transistor P1 and the gate of the PMOS transistor P2 are connected to the storage node NA. Furthermore, the drain of the PMOS transistor P2 and the gate of the PMOS transistor P1 are connected to the storage node NB, and the sources of the PMOS transistors P1 and P2 are left open. The rest of the constitution was described in the fourth embodiment and will not be explained further in order to avoid repetition of explanation.

As in the fourth embodiment, in the SRAM memory cell shown in FIG. 13, the two stable storage states of the storage nodes NA and NB are not affect when the PMOS transistors P1 and P2 switch ON and OFF. The gate capacity of the PMOS transistor P2 and the drain capacity of the PMOS transistor P1 are appended to the storage node NA. Similarly, the gate capacity of the PMOS transistor P1 and the drain capacity of the PMOS transistor P2 are appended to the storage node NB. As a consequence, the capacities of the storage nodes NA and NB are greater than those of conventional SRAM memory cells.

As described above, according to the semiconductor storage apparatus of the fifth embodiment, the drain of the newly provided PMOS transistor P1 and the gate of the newly provided PMOS transistor P2 are connected to the storage node NA, thereby increasing the capacity of the storage node NA, and the gate of the newly provided PMOS transistor P1 and the drain of the newly provided PMOS transistor P2 are connected to the storage node NB, thereby increasing the capacity of the storage node NB. Therefore, the same effects as those of the first embodiment can be obtained.

Figure 14:
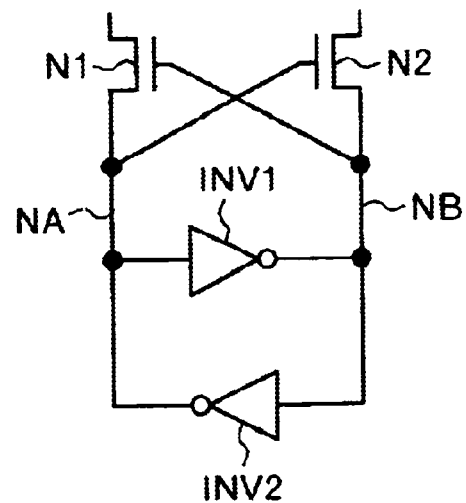
FIG. 14 is a circuit diagram showing another example of an SRAM memory cell comprising the semiconductor storage apparatus according to the fifth embodiment.

Obviously, NMOS transistors may be provided instead of the PMOS transistors. FIG. 14 is a circuit diagram which shows that case. As shown in FIG. 14, NMOS transistors N1 and N2 are provided instead of the PMOS transistors P1 and P2 shown in FIG. 13. The drain of the NMOS transistor N1 is connected to the storage node NA, its gate is connected to the storage node NB, and its source is open. The drain of the NMOS transistor N2 is connected to the storage node NB, its gate is connected to the storage node NA, and its source is open. In this case, the same effects as above are obtained.

Subsequently, the semiconductor storage apparatus according to a sixth embodiment will be explained. The semiconductor storage apparatus according to the sixth embodiment is characterized in that the MOS transistors which are provided in the fourth and fifth embodiments have different polarities.

Figure 15:
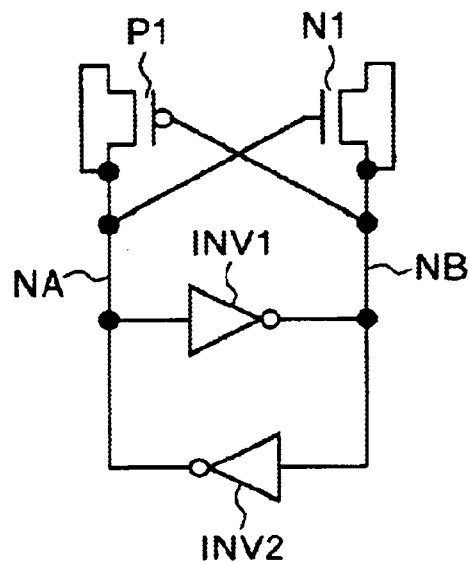
FIG. 15 is a circuit diagram showing an SRAM memory cell comprising the semiconductor storage apparatus according to a sixth embodiment.
Figure 16:
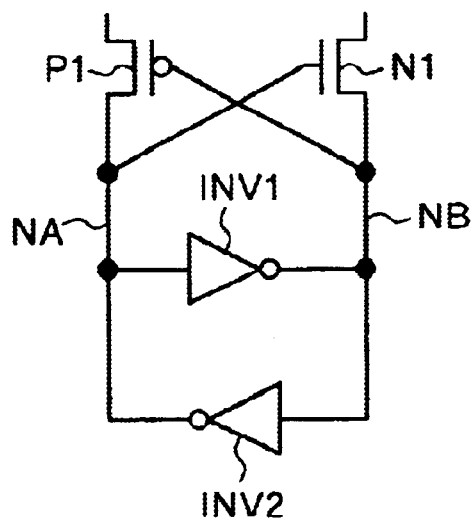
FIG. 16 is a circuit diagram showing another example of an SRAM memory cell comprising the semiconductor storage apparatus according to the sixth embodiment.

FIG. 15 is a circuit diagram showing an SRAM memory cell comprising the semiconductor storage apparatus according to the sixth embodiment. FIG. 15 shows the case in which the NMOS transistor N1 is provided instead of the PMOS transistor P2 shown in FIG. 11. FIG. 16 is a circuit diagram showing another example of the SRAM memory cell comprising the semiconductor storage apparatus according to the sixth embodiment. FIG. 16 shows the case in which the NMOS transistor N1 is provided instead of the PMOS transistor P2 shown in FIG. 13.

In this way, the same effects of the fourth and fifth embodiments can be obtained by selecting MOS transistors which have different polarities as the MOS transistors to be appended to the storage nodes NA and NB.

Subsequently, the semiconductor storage apparatus according to a seventh embodiment will be explained. The seventh embodiment illustrates the specific constitution of the layout shown in FIG. 3 and described in the second embodiment.

Figure 17:
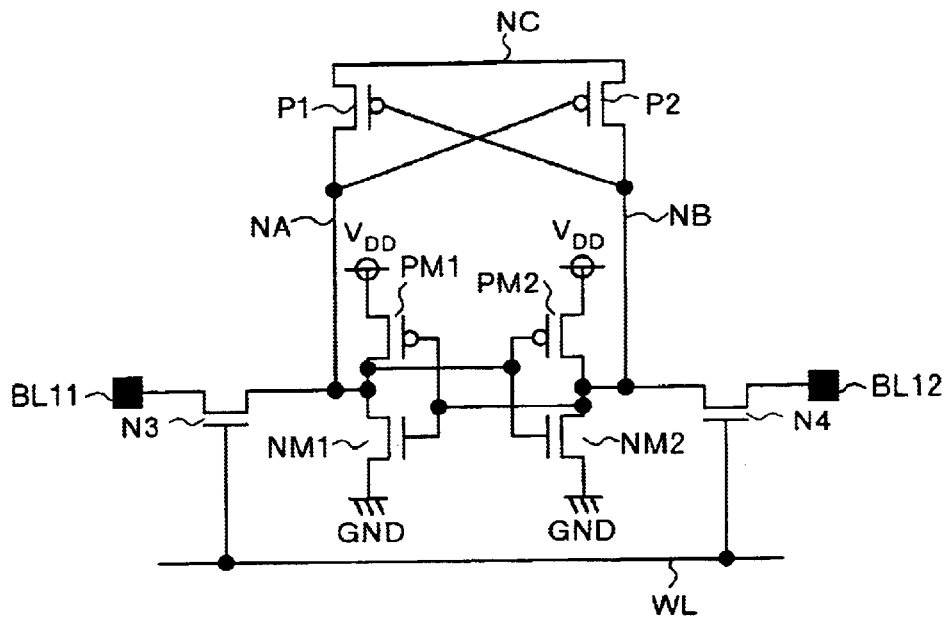
FIG. 17 is a circuit diagram showing an SRAM memory cell comprising the semiconductor storage apparatus according to a seventh embodiment.

FIG. 17 is a circuit diagram showing the SRAM memory cell of the semiconductor storage apparatus according to the seventh embodiment. As shown in FIG. 17, the PMOS transistor PM1 and the NMOS transistor NM1 comprise a first CMOS inverter, and the PMOS transistor PM2 and the NMOS transistor NM2 comprise a second CMOS inverter. Input and output terminals between these CMOS inverters are crisscross connected.

The MOS transistors PM1, PM2, NM1 and NM2 form a flip-flop. In FIG. 17, the logical status can be read and written at the storage node NA, which constitutes the output point of the first CMOS inverter and the input point of the second CMOS inverter, and at the storage node NB, which constitutes the output point of the second CMOS inverter and the input point of the first CMOS inverter.

Two PMOS transistors P1 and P2 are provided. The sources of these PMOS transistors P1 and P2 are connected to each other and form an internal node NC. The drain of the PMOS transistor P1 is connected to the storage node NA and its gate is connected to the storage node NB. The drain of the PMOS transistor P2 is connected to the storage node NB and its gate is connected to the storage node NA.

The NMOS transistors N3 and N4 function as MOS transistors for access. The gate of the NMOS transistor N3 is connected to the word line WL, its source is connected to the storage node NA, and its drain is connected to a regular-phase bit line BL11. The gate of the NMOS transistor N4 is connected to the word line WL, its source is connected to the storage node NB, and its drain is connected to an inverse-phase bit line BL12.

The circuit diagram of FIG. 17 shows a case in which the terminals WL11 and WL12 shown in FIG. 3 are connected to one word line WL. Consequently, it is possible to read and write stored values by selecting the word line WL, the regular-phase bit line BL11, and the inverse-phase bit line BL12 shown in FIG. 17.

FIG. 18 to FIG. 21 show layouts of the SRAM memory cell of the semiconductor storage apparatus according to the seventh embodiment. Specifically, FIG. 18 to FIG. 21 show the layers in the order in which they are laminated. FIG. 22 is a diagram showing the various codes of the contact holes, via holes and the like shown in FIG. 18 to FIG. 21. Same codes will also be used in other embodiments described hereafter.

Figure 18:
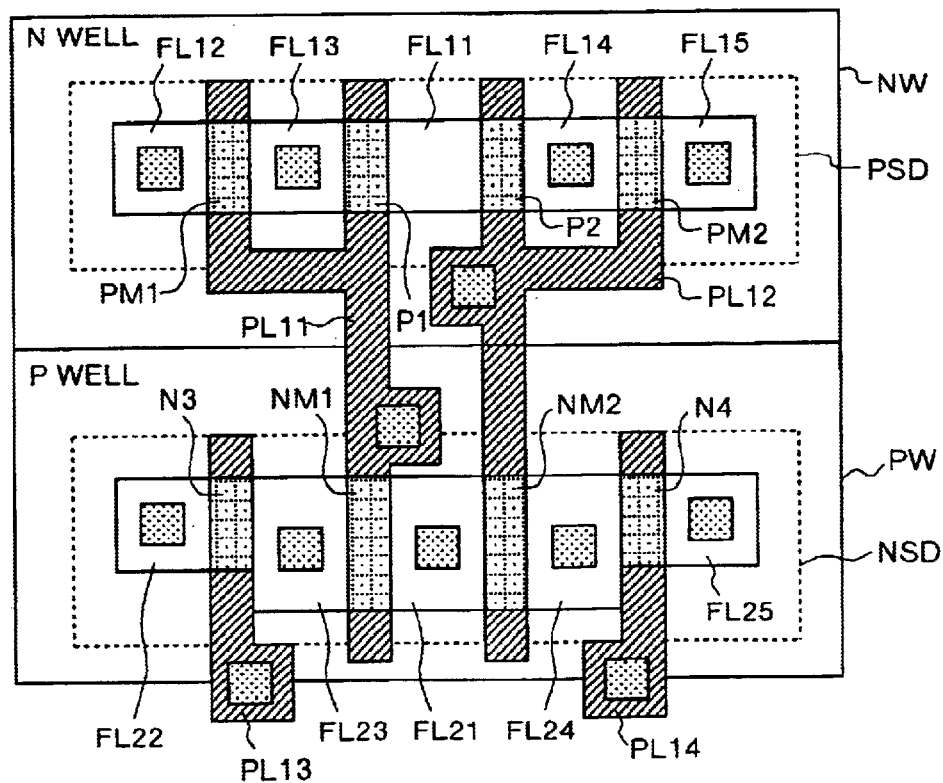
FIG. 18 is a diagram showing the layout of the SRAM memory cell comprising the semiconductor storage apparatus according to the seventh embodiment.

FIG. 18 shows a well region formed in a semiconductor substrate, a diffusion region formed in the well region, and a polysilicon interconnection layer formed thereabove.

As shown in FIG. 18, in the memory cell of the semiconductor storage apparatus according to the seventh embodiment, an N well region NW and a P well region PW are provided parallel to the top face of the semiconductor substrate and are closely adjacent to each other. There is a separating region between the N well region NW and the P well region PW, but this is not shown in FIG. 18.

Firstly, a P$^+$ source drain region PSD is provided in the N well region NW by injecting P-type impurities, and an N$^+$ source drain region NSD is provided in the P well region PW. The PMOS transistors PM1, PM2, P1 and P2 of FIG. 17 are provided in the P$^+$ source drain region PSD, and the NMOS transistors NM1, NM2, N1 and N2 of FIG. 17 are provided in the N$^+$ source drain region NSD.

The structure of each of the layers shown in FIG. 18 to FIG. 21 will be explained in order. In the layer shown in FIG. 18, two polysilicon interconnection layers PL11 and PL12 are provided across the P+ source drain region PSD and the N+ source drain region NSD, and extend at right angles to the interface (hereinafter termed "well interface") between the N well region NW and the P well region PW.

As shown in FIG. 18, two polysilicon interconnection layers PL13 and PL14 are provided over the P well region PW, and extend at right angles to the well interface.

P+ diffusion regions FL11 to FL13 are provided by injecting P-type impurities on either side of the two sections of the polysilicon interconnection layer PL11 on the P+ source drain region PSD, thereby forming the PMOS transistors PM1 and PM2 which use the polysilicon interconnection layer PL11 as a gate electrode. P+ diffusion regions FL11, FL14 and FL15 are formed by injecting P-type impurities on either side of the two sections of the polysilicon interconnection layer PL12 on the P+ source drain region PSD, thereby forming the PMOS transistors P1 and P2 which use the polysilicon interconnection layer PL12 as a gate electrode.

Since the PMOS transistors PM1, PM2, P1 and P2 are aligned with the polysilicon interconnection layers PL11 and PL12, the P+ diffusion regions FL11 to FL15 can be provided in a straight line parallel to the well interface. Therefore, the P+ diffusion regions FL11, FL13 and FL14 can be shared by adjacent PMOS transistors.

According to the circuit diagram of FIG. 17, sharing the P+ diffusion region FL11 forms an internal node NC which connects the sources of the PMOS transistors P1 and P2, sharing the P+ diffusion region FL13 connects the drains of the PMOS transistors PM1 and P1, and sharing the P+ diffusion region FL14 connects the drains of the PMOS transistors PM2 and P2. This sharing reduces the area occupied by the PMOS transistors.

N+ diffusion regions FL21 and FL23 are provided by injecting N-type impurities on either side of the two sections of the polysilicon interconnection layer PL11 on the N+ source drain region NSD, thereby forming the NMOS transistor NM1 which uses the polysilicon interconnection layer PL11 as a gate electrode. N+ diffusion regions FL21 and FL24 are formed by injecting N-type impurities on either side of the two sections of the polysilicon interconnection layer PL12 on the N+ source drain region NSD, thereby forming the NMOS transistor NM2 which uses the polysilicon interconnection layer PL12 as a gate electrode.

N+ diffusion regions FL22 and FL23 are provided by injecting N-type impurities on either side of the two sections of the polysilicon interconnection layer PL13 on the N+ source drain region NSD, thereby forming the NMOS transistor N3 which uses the polysilicon interconnection layer PL13 as a gate electrode. N+ diffusion regions FL24 and FL25 are formed by injecting N-type impurities on either side of the two sections of the polysilicon interconnection layer PL14 on the N+ source drain region NSD, thereby forming the NMOS transistor N4 which uses the polysilicon interconnection layer PL14 as a gate electrode.

As in the formation of the PMOS transistors described above, since the NMOS transistors NM1, NM2, N3 and N4 are aligned with the polysilicon interconnection layers PL11 and PL12, the N+ diffusion regions FL21 to FL25 can be provided in a straight line parallel to the well interface. Therefore, the N+ diffusion regions FL21, FL23 and FL24 can be shared by adjacent NMOS transistors.

According to the circuit diagram of FIG. 17, sharing the N+ diffusion region FL21 connects the sources of the NMOS transistors NM1 and NM2, sharing the N+ diffusion region FL23 connects the drain of the NMOS transistors NM1 to the source of the NMOS transistor N3, and sharing the N+ diffusion region FL24 connects the drain of the NMOS transistor NM2 to the source of the NMOS transistor N4. This sharing reduces the area occupied by the NMOS transistors.

As shown in FIG. 18, one connector hole is provided in each of the polysilicon interconnection layers PL11, PL12, PL13 and PL14, the P+ diffusion regions FL12, FL13, FL14 and FL15, and the N+ diffusion regions FL21 to 25. The connector holes electrically connect these layers/regions with the layer above.

Figure 19:
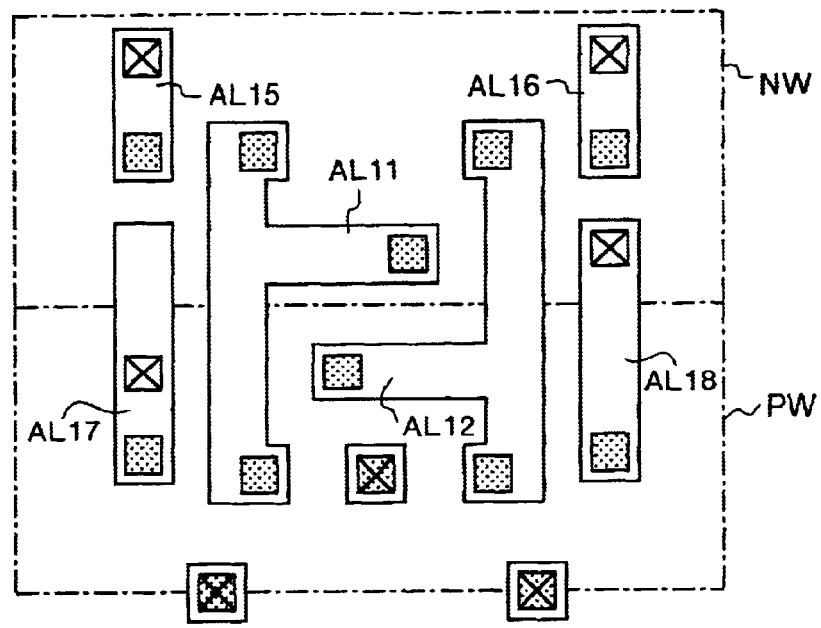
FIG. 19 is a diagram showing the layout of the SRAM memory cell comprising the semiconductor storage apparatus according to the seventh embodiment.

Subsequently, the layer provided on the layer shown in FIG. 18 will be explained. FIG. 19 shows a layer comprising a first metal interconnection layer which is provided on the layer shown in FIG. 18. The layer shown in FIG. 19 comprises a first metal interconnection layer AL11 for electrically connecting the P+ diffusion region FL13, the N+ diffusion region FL23 and the polysilicon interconnection layer PL12. According to the circuit constitution shown in FIG. 17, the first metal interconnection layer AL11 connects the drain of the PMOS transistor PM1, the drain of the NMOS transistor NM1, the drain of the PMOS transistor P1, the gate of the PMOS transistor P2, the gate of the PMOS transistor PM2, the gate of the NMOS transistor NM2, and the source of the NMOS transistor N3.

A first metal interconnection layer AL12 is also provided, and electrically connects the P+ diffusion region FL14, the N+ diffusion region FL24 and the polysilicon interconnection layer PL11. According to the circuit constitution shown in FIG. 17, the first metal inter connection layer AL12 connects the drain of the PMOS transistor PM2, the drain of the NMOS transistor NM2, the drain of the PMOS transistor P2, the gate of the PMOS transistor P1, the gate of the PMOS transistor PM1, the gate of the NMOS transistor NM1, and the source of the NMOS transistor N4.

The layer shown in FIG. 19 further comprises a first metal interconnection layer AL15 for moving the connection point of the P+ diffusion region FL12 of the layer below, a first metal interconnection layer AL16 for moving the connection point of the P+ diffusion region FL15, a first metal interconnection layer AL17 for moving the connection point of the N+ diffusion region FL22, and a first metal interconnection layer AL18 for moving the connection point of the N+ diffusion region FL25.

Figure 20:
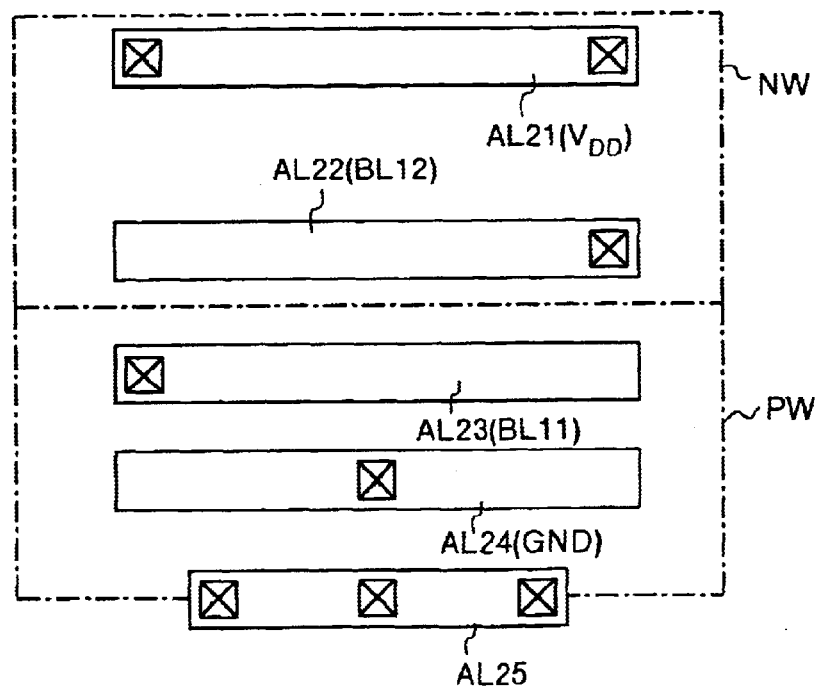
FIG. 20 is a diagram showing the layout of the SRAM memory cell comprising the semiconductor storage apparatus according to the seventh embodiment.

Subsequently, a layer which is provided on the layer shown in FIG. 19 will be explained. FIG. 20 shows a layer comprising a second metal interconnection layer which is provided on the layer shown in FIG. 19. The layer shown in FIG. 20 comprises a second metal interconnection layer AL21 for applying a power potential $V_{DD}$ via the first metal interconnection layer AL15 of FIG. 19 to the P+ diffusion region FL12, and applying the power potential $V_{DD}$ via the first metal interconnection layer AL16 to the P+ diffusion region FL15. The second metal interconnection layer AL21 functions as a power line and, according to the circuit constitution of FIG. 17, connects the sources of the PMOS transistors PM1 and PM2 to the power source.

A second metal interconnection layer AL24 is also provided, and applies a ground potential GND via the contact hole+via hole shown in FIG. 19 to the N+ diffusion region FL21. The second metal interconnection layer AL24 functions as a ground line and, according to the circuit constitution of FIG. 17, grounds the sources of the NMOS transistors NM1 and NM2.

The layer shown in FIG. 20 further comprises a second metal interconnection layer AL22 which is connected via the first metal interconnection layer AL18 of FIG. 19 to the N+ diffusion region FL25 of the layer below and functions as an inverse-phase bit line BL12, a second metal interconnection layer AL23 which is connected via the first metal interconnection layer AL17 to the N+ diffusion region FL22 and functions as an regular-phase bit line BL12, and a second metal interconnection layer AL25 which connects via the contact hole+via hole shown in FIG. 19 to the polysilicon interconnection layers PL13 and PL14 of the layer below.

In the circuit diagram shown in FIG. 17, the second metal interconnection layers AL22 and AL23 connect the drain of the NMOS transistor for access N4 to the inverse-phase bit line BL12, and connect the drain of the NMOS transistor for access N3 to the regular-phase bit line BL11.

The second metal interconnection layers AL21 to AL25 can be provided in a straight line extending parallel to the well interface mentioned above. In a single memory cell, this makes it possible to shorten the lengths of the regular-phase bit line BL11 and the inverse-phase bit line BL12.

Figures 21, 22:
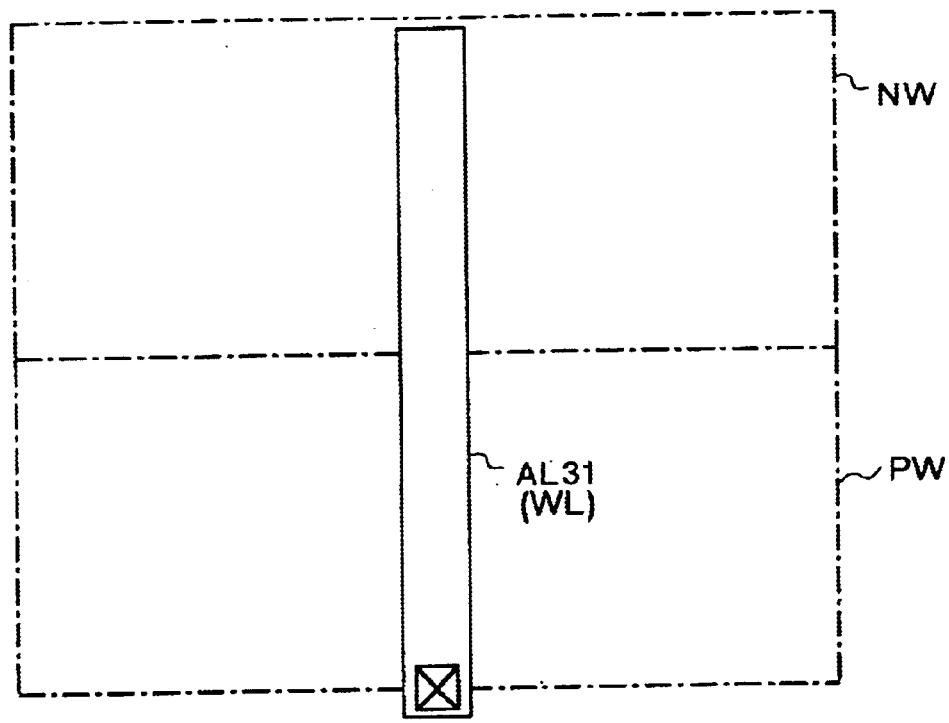

Subsequently, a layer provided on the layer shown in FIG. 20 will be explained. FIG. 21 shows a layer comprising a third metal interconnection layer which is provided on the layer shown in FIG. 20. The layer of FIG. 20 comprises a third metal interconnection layer AL31 which connects the polysilicon interconnection layers PL13 and PL14 and functions as a word line WL. In the circuit constitution of FIG. 17, the third metal interconnection layer AL31 connects the gates of the NMOS transistors N3 and N4 to the word line WL.

As described above, according to the semiconductor storage apparatus of the seventh embodiment, the sources of the PMOS transistors P1 and P2 for increasing the capacity of the storage nodes NA and NB share the P+ diffusion region FL11. The connection between the drain of the PMOS transistor P1 and the drain of the PMOS transistor PM1, that is, the connection between the storage node NA and the PMOS transistor P1 is achieved by sharing the P+ diffusion region FL13. The connection between the drain of the PMOS transistor P2 and the drain of the PMOS transistor PM2, that is, the connection between the storage node NB and the PMOS transistor P2 is achieved by sharing the P+ diffusion region FL14. As a consequence, the area occupied by the newly appended PMOS transistors P1 and P2 can be reduced, thereby enabling the memory cell array to be integrated more highly.

Subsequently, the semiconductor storage apparatus according to an eighth embodiment will be explained. The eighth embodiment explains the constitution of a layout which realizes the circuit of FIG. 17 by using a CMOS gate array.

Figure 23:
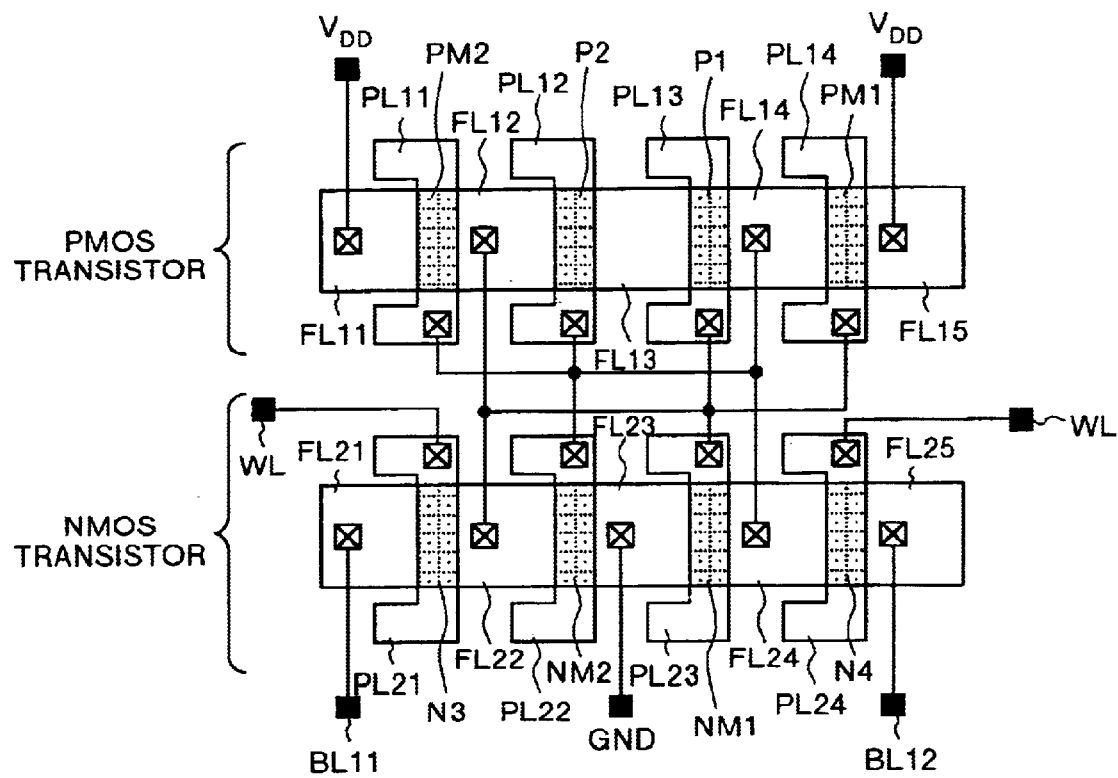
FIG. 23 is a diagram showing the layout of a SRAM memory cell comprising the semiconductor storage apparatus according to an eighth embodiment.

FIG. 23 shows the layout of an SRAM memory cell of the semiconductor storage apparatus according to the eighth embodiment. In particular, FIG. 23 shows four transistors of the cell which comprises PMOS transistors and NMOS transistors. In FIG. 23, the P+ diffusion regions FL12 to FL14 in the PMOS transistor region provide sources and drains, and in addition, share the sources and drains of the adjoining PMOS transistors. As a result of this sharing, the four PMOS transistors are arranged so that their sources and drains are connected together.

Similarly, in FIG. 23, the N+ diffusion regions FL22 to FL24 in the NMOS transistor region provide sources and drains, and in addition, share the sources and drains of the adjoining NMOS transistors. As a result of this sharing, the four NMOS transistors are arranged so that their sources and drains are connected together.

The four PMOS transistors in FIG. 23 correspond from left to right to the four PMOS transistors PM2, P2, P1 and PM1 shown in FIG. 17. The four NMOS transistors in FIG. 23 correspond from left to right to the four NMOS transistors N3, NM2, NM1 and N4 shown in FIG. 17.

In FIG. 23, the PMOS transistor PM2 has the P+ diffusion regions FL11 and FL12 as its source and drain respectively, and has the polysilicon interconnection layer PL11 as its gate. The PMOS transistor P2 has the P+ diffusion regions FL12 and FL13 as its drain and source respectively, and has the polysilicon interconnection layer PL12 as its gate. The PMOS transistor P1 has the P+ diffusion regions FL13 and FL14 as its source and drain respectively, and has the polysilicon interconnection layer PL13 as its gate. The PMOS transistor PM1 has the P+ diffusion regions FL14 and FL15 as its drain and source respectively, and has the polysilicon interconnection layer PL14 as its gate.

Similarly, in FIG. 23, the NMOS transistor N3 has the N+ diffusion regions FL21 and FL22 as its drain and source respectively, and has the polysilicon interconnection layer PL21 as its gate. The NMOS transistor NM2 has the N+ diffusion regions FL22 and FL23 as its drain and source respectively, and has the polysilicon interconnection layer PL22 as its gate. The NMOS transistor NM1 has the N+ diffusion regions FL23 and FL24 as its source and drain respectively, and has the polysilicon interconnection layer PL23 as its gate. The NMOS transistor N4 has the N+ diffusion regions FL24 and FL25 as its source and drain respectively, and has the polysilicon interconnection layer PL24 as its gate.

As shown in FIG. 23, the polysilicon interconnection layers PL11, PL12, PL22 and the diffusion regions FL14 and FL24 are connected together, and the polysilicon interconnection layers PL13, PL23, PL14 and diffusion regions FL12 and FL22 are connected together as functions blocks for the CMOS gate array in correspondence with the MOS transistors. The P+ diffusion regions FL11 and FL15 are connected to the power line $V_{DD}$, the N+ diffusion region FL23 is connected to the ground line GND, the polysilicon interconnection layers PL21 and PL24 are connected to the word line WL, the N+ diffusion region FL21 is connected to the regular-phase bit line BL11, and the N+ diffusion region FL25 is connected to the reverse-phase bit line BL12.

Consequently, the circuit of FIG. 17 can be realized by using a CMOS gate array. When the constitution of the conventional SRAM memory cell, i.e. the circuit of FIG. 17 without the PMOS transistors P1 and P2, is realized by a CMOS gate array, eight transistors are required, including MOS transistors for isolation. In this embodiment, eight MOS transistors are used even in the case where the PMOS transistors P1 and P2 for appending capacity storage nodes have been added, and thus the number of MOS transistors is the same as in the conventional constitution.

As described above, according to the semiconductor storage apparatus of the eighth embodiment, the SRAM memory cell comprising the PMOS transistors P1 and P2 for increasing the capacity of the storage nodes NA and NB can be realized by using a CMOS gate array. In comparison with the case where the conventional SRAM memory cell constitution is realized by a CMOS gate array, in this embodiment the number of MOS transistors which are used does not change even when the PMOS transistors P1 and P2 are appended, thereby preventing the scale of the circuit from increasing.

Subsequently, a ninth embodiment of the semiconductor storage apparatus will be explained. The ninth embodiment illustrates a specific layout of the two-port SRAM memory cell of FIG. 9 which was described in the third embodiment.

Figure 24:
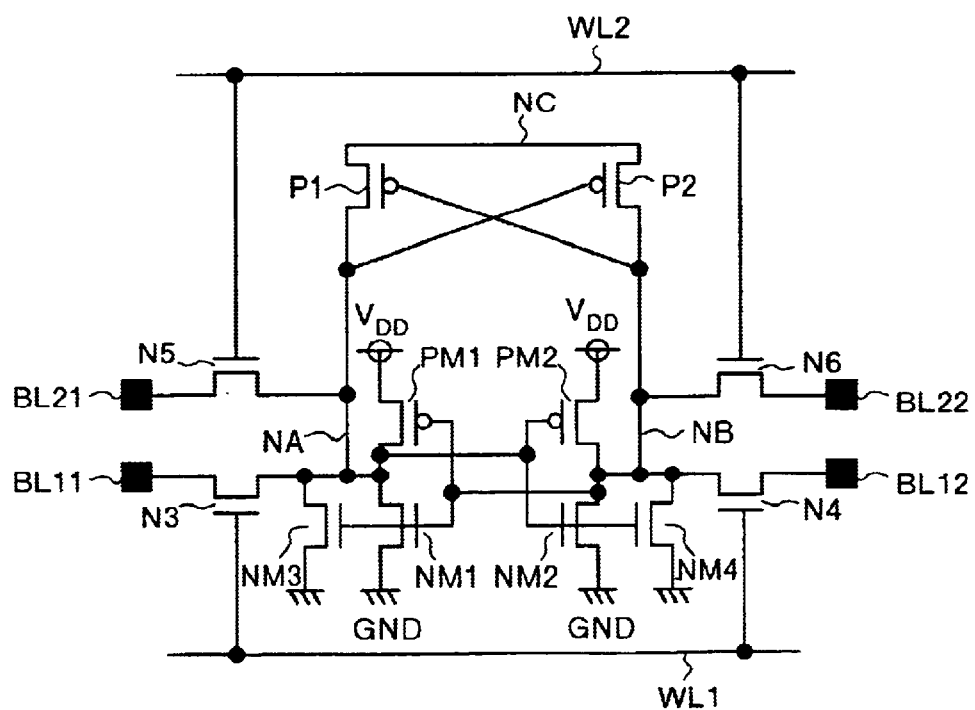
FIG. 24 is a circuit diagram showing an SRAM memory cell comprising the semiconductor storage apparatus according to a ninth embodiment.

FIG. 24 is a circuit diagram showing the SRAM memory cell of the semiconductor storage apparatus according to the ninth embodiment. In FIG. 24, a first CMOS inverter comprises the PMOS transistor PM1 and the NMOS transistors NM1 and NM3, and a second CMOS inverter comprises the PMOS transistor PM2 and the NMOS transistors NM2 and NM4. The input and output terminal between these CMOS inverters are crisscross connected.

The MOS transistors PM1, PM2, NM1, NM2, NM3 and NM4 form a flip-flop. In FIG. 24, the logical status can be read and written at the storage node NA, which constitutes the output point of the first CMOS inverter and the input point of the second CMOS inverter, and at the storage node NB, which constitutes the output point of the second CMOS inverter and the input point of the first CMOS inverter.

Two PMOS transistors P1 and P2 are provided. The sources of these PMOS transistors P1 and P2 are connected to each other and an internal node NC is formed. The drain of the PMOS transistor P1 is connected to the storage node NA and its gate is connected to the storage node NB. The drain of the PMOS transistor P2 is connected to the storage node NB and its gate is connected to the storage node NA.

Each of the NMOS transistors N3, N4, N5 and N6 functions as an MOS transistor for access. The gate of the NMOS transistor N3 is connected to a first word line WL1, its source is connected to the storage node NA, and its drain is connected to a first regular-phase bit line BL11. The gate of the NMOS transistor N5 is connected to a second word line WL2, its source is connected to the storage node NA, and its drain is connected to a second inverse-phase bit line BL21.

The gate of the NMOS transistor N4 is connected to the first word line WL1, its source is connected to the storage node NB, and its drain is connected to a first inverse-phase bit line BL12. The gate of the NMOS transistor N6 is connected to the second word line WL2, its source is connected to the storage node NB, and its drain is connected to a second inverse-phase bit line BL22.

The circuit diagram of FIG. 24 shows the state in which the word line terminals WL11 and WL12 of FIG. 3 are connected by the common first word line WL1, and the word line terminals WL21 and WL22 are connected by the common second word line WL2. Consequently, it is possible to read stored values at the first port by selecting the first word line WL1, the first regular-phase bit line BL11, and the first inverse-phase bit line BL12, and to read stored values at the second port by selecting the second word line WL2, the second regular-phase bit line BL21, and the second inverse-phase bit line BL22.

Figure 25:
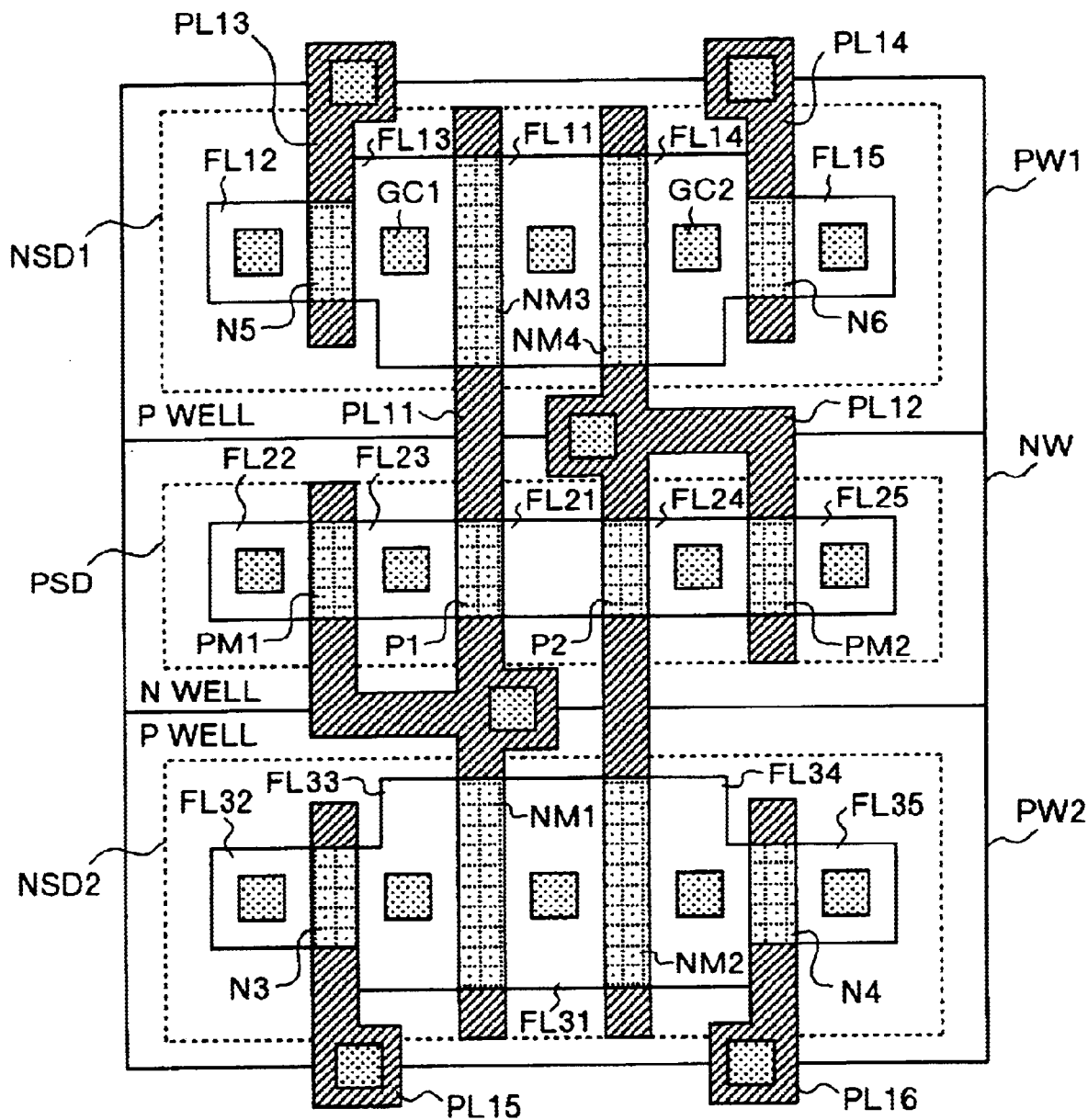
FIG. 25 is a diagram showing the layout of the SRAM memory cell comprising the semiconductor storage apparatus according to the ninth embodiment.

FIG. 25 to FIG. 28 show layouts of the SRAM memory cell of the semiconductor storage apparatus according to the ninth embodiment. FIG. 25 shows a well region formed in a semiconductor substrate, a diffusion region formed in the well region, and a polysilicon interconnection layer formed thereabove.

As shown in FIG. 25, in the memory cell of the semiconductor storage apparatus according to the ninth embodiment, a first P well region PW1, an N well region NW and a second P well region PW2 are provided in that order in the plane direction on the semiconductor substrate. That is, the two P well regions PW1 and PW2 are divided on either side of the N well region NW.

The well regions are provided such that the interface between the first P well region PW1 and the N well region NW (hereinafter termed "first well interface") is parallel to the interface between the second P well region PW2 and the N well region NW (hereinafter termed "second well interface"). There are separating regions between the N well region NW and the first P well region PW1, and between the N well region NW and the second P well regions PW2, but these are not shown in FIG. 25.

An $N^+$ source drain region NSD1 is provided in the P well region PW1, a $P^+$ source drain region PSD for injecting P-type impurities is provided in the N well region NW, and an $N^+$ source drain region NSD2 is provided in the P well region PW2.

The NMOS transistors NM3, NM4, N5 and N6 shown in FIG. 24 are provided in the $N^+$ source drain region NSD1, the PMOS transistors PM1, PM2, P1 and P2 shown in FIG. 24 are provided in the $P^+$ source drain region PSD, and the NMOS transistors NM1, NM2, N3 and N4 shown in FIG. 24 are provided in the $N^+$ source drain region NSD2.

The structure of each of the layers shown in FIG. 25 to FIG. 28 will be explained in order. In the layer shown in FIG. 25, two polysilicon interconnection layers PL11 and PL12 are provided across the $N^+$ source drain region NSD1, the $P^+$ source drain region PSD, and the $N^+$ source drain region NSD2, and extend at right angles to the first and second well interfaces.

As shown in FIG. 25, two polysilicon interconnection layers PL13 and PL14 are provided on the P well region PW1, and extend at right angles to the first well interface. Similarly, two polysilicon interconnection layers PL15 and PL16 are provided on the P well region PW2, and extend at right angles to the second well interface.

$P^+$ diffusion regions FL21 to FL23 are provided by injecting P-type impurities on each side of the two parallel-advancing sections of the polysilicon interconnection layer PL11 on the $P^+$ source drain region PSD, thereby forming the PMOS transistors PM1 and P1 having the polysilicon interconnection layer PL11 as a gate electrode. $P^+$ diffusion regions FL21, FL24 and FL25 are formed by injecting P-type impurities on either side of the two parallel-advancing sections of the polysilicon interconnection layer PL12 on the $P^+$ source drain region PSD, thereby forming the PMOS transistors P2 and PM2 having the polysilicon interconnection layer PL12 as a gate electrode.

Since the PMOS transistors PM1, PM2, P1 and P2 are aligned with the polysilicon interconnection layers PL11 and PL12, the $P^+$ diffusion regions FL21 to FL25 can be provided in a straight line which is parallel to the first and second well interfaces. Therefore, the $P^+$ diffusion regions FL21, FL23 and FL24 can be shared by adjacent PMOS transistors.

According to the circuit diagram of FIG. 24, sharing the $P^+$ diffusion region FL21 forms an internal node NC which connects the sources of the PMOS transistors P1 and P2, sharing the $P^+$ diffusion region FL23 connects the drains of the PMOS transistors PM1 and P1, and sharing the $P^+$ diffusion region FL14 connects the drains of the PMOS transistors PM2 and P2. Sharing in this way reduces the area occupied by the PMOS transistors.

$N^+$ diffusion regions FL11 and FL13 are provided by injecting N-type impurities on either side of the section of the polysilicon interconnection layer PL11 on the $N^+$ source drain region NSD2, thereby forming the NMOS transistor NM3 which has the polysilicon interconnection layer PL11 as its gate electrode. $N^+$ diffusion regions FL11 and FL14 are provided by injecting N-type impurities on either side of the polysilicon interconnection layer PL12 on the $N^+$ source drain region NSD1, thereby forming the NMOS transistor NM4 which has the polysilicon interconnection layer PL12 as its gate electrode.

N+ diffusion regions FL12 and FL13 are provided by injecting N-type impurities on either side of the polysilicon interconnection layer PL13 on the N+ source drain region NSD1, thereby forming the NMOS transistor N5 which has the polysilicon interconnection layer PL13 as its gate electrode. N+ diffusion regions FL14 and FL15 are provided by injecting N-type impurities on either side of the polysilicon interconnection layer PL14 on the N+ source drain region NSD1, thereby forming the NMOS transistor N6 which has the polysilicon interconnection layer PL14 as its gate electrode.

As in the case of the PMOS transistors described above, since the polysilicon interconnection layers PL11, PL12, PL13 and PL14 are aligned with the NMOS transistors NM3, NM4, N5 and N6, the N+ diffusion regions FL11 to FL15 can be provided in a straight line which is parallel to the well interfaces. Therefore, the N+ diffusion regions FL11, FL13 and FL14 can be shared by adjacent NMOS transistors.

According to the circuit diagram of FIG. 24, sharing the N+ diffusion region FL11 connects the sources of the NMOS transistors NM3 and NM4, sharing the N+ diffusion region FL13 connects the drain of the NMOS transistor NM3 to the source of the NMOS transistor N5, and sharing the N+ diffusion region FL14 connects the drain of the NMOS transistor NM4 to the source of the NMOS transistor N6. Sharing the diffusion regions in this way reduces the area occupied by the NMOS transistors.

N+ diffusion regions FL31 and FL33 are provided by injecting N-type impurities on either side of the section of the polysilicon interconnection layer PL11 on the N+ source drain region NSD2, thereby forming the NMOS transistor NM1 which has the polysilicon interconnection layer PL11 as its gate electrode. N+ diffusion regions FL31 and FL34 are provided by injecting N-type impurities on either side of the polysilicon interconnection layer PL12 on the N+ source drain region NSD2, thereby forming the NMOS transistor NM2 which has the polysilicon interconnection layer PL12 as its gate electrode.

N+ diffusion regions FL32 and FL33 are provided by injecting N-type impurities on either side of the polysilicon interconnection layer PL15 on the N+ source drain region NSD2, thereby forming the NMOS transistor N3 which has the polysilicon interconnection layer PL15 as its gate electrode. N+ diffusion regions FL34 and FL35 are provided by injecting N-type impurities on either side of the polysilicon interconnection layer PL16 on the N+ source drain region NSD2, thereby forming the NMOS transistor N4 which has the polysilicon interconnection layer PL16 as its gate electrode.

As in the case of the PMOS transistors described above, since the polysilicon interconnection layers PL11, PL12, PL13 and PL14 are aligned with the NMOS transistors NM1, NM2, N3 and N4, the N+ diffusion regions FL31 to FL35 can be provided in a straight line which is parallel to the well interfaces. Therefore, the N+ diffusion regions FL31, FL33 and FL34 can be shared by adjacent NMOS transistors.

According to the circuit diagram of FIG. 24, sharing the N+ diffusion region FL31 connects the sources of the NMOS transistors NM1 and NM2, sharing the N+ diffusion region FL33 connects the drain of the NMOS transistors NM1 to the source of the NMOS transistor N3, and sharing the N+ diffusion region FL34 connects the drain of the NMOS transistor NM2 to the source of the NMOS transistor N4. Sharing the diffusion regions in this way reduces the area occupied by the NMOS transistors.

As shown in FIG. 25, one connector hole is provided in each of the polysilicon interconnection layers PL11, PL12, PL13, PL14, PL15 and PL16, the P+ diffusion regions FL22 to 25, and the N+ diffusion regions FL11 to 15 and FL31 to 35. The connector holes electrically connect these layers/regions with the layer above.

Figure 26:
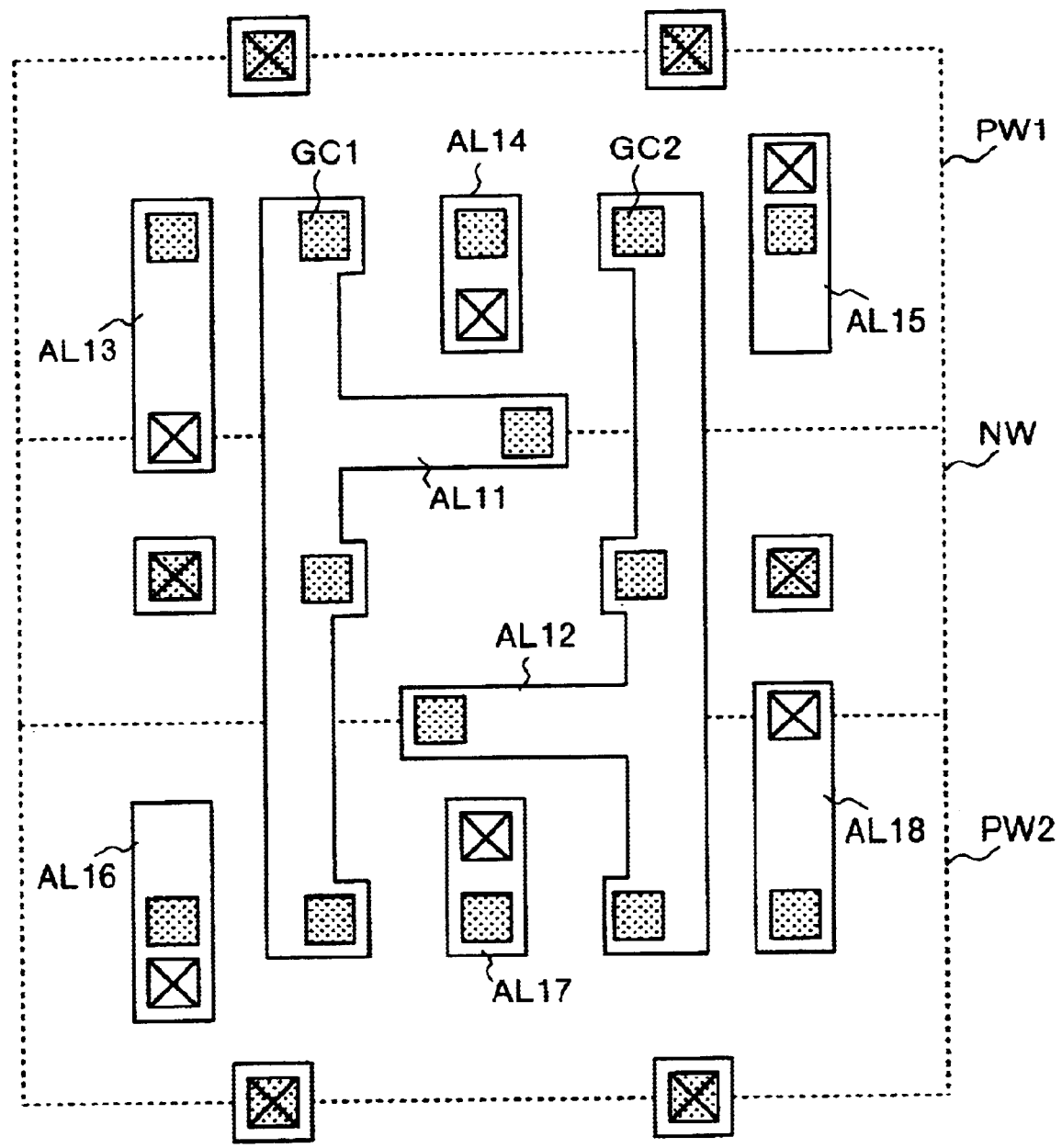
FIG. 26 is a diagram showing the layout of the SRAM memory cell comprising the semiconductor storage apparatus according to the ninth embodiment.

Subsequently, the layer provided on the layer shown in FIG. 25 will be explained. FIG. 26 shows a layer comprising a first metal interconnection layer which is provided on the layer shown in FIG. 25. The layer shown in FIG. 26 comprises a first metal interconnection layer AL11 for electrically connecting the N+ diffusion regions FL13 and FL33, the P+ diffusion region FL23 and the polysilicon interconnection layer PL12. According to the circuit constitution shown in FIG. 24, the first metal interconnection layer AL11 connects the drain of the PMOS transistor PM1, the drain of the NMOS transistor NM1, the drain of the NMOS transistor N3, the drain of the PMOS transistor P1, the gate of the PMOS transistor P2, the gate of the PMOS transistor PM2, the gate of the NMOS transistor NM2, the source of the NMOS transistor N3, and the source of the NMOS transistor N5.

A first metal interconnection layer AL12 is also provided for electrically connecting the P+ diffusion regions FL14 and FL34, the P+ diffusion region FL24 and the polysilicon interconnection layer PL11. According to the circuit constitution shown in FIG. 24, the first metal interconnection layer AL12 connects the drain of the PMOS transistor PM2, the drain of the NMOS transistor NM2, the drain of the NMOS transistor NM4, the drain of the PMOS transistor P2, the gate of the PMOS transistor P1, the gate of the PMOS transistor PM1, the gate of the NMOS transistor NM1, the source of the NMOS transistor N4, and the source of the NMOS transistor N6.

The layer shown in FIG. 26 further comprises a first metal interconnection layer AL13 for moving the connection point of the P+ diffusion region FL12 of the layer below, a first metal interconnection layer AL14 for moving the connection point of the P+ diffusion region FL11, a first metal interconnection layer AL15 for moving the connection point of the N+ diffusion region FL15, a first metal interconnection layer AL16 for moving the connection point of the N+ diffusion region FL32, a first metal interconnection layer AL17 for moving the connection point of the N+ diffusion region FL31, and a first metal interconnection layer AL18 for moving the connection point of the N+ diffusion region FL35.

Figure 27:
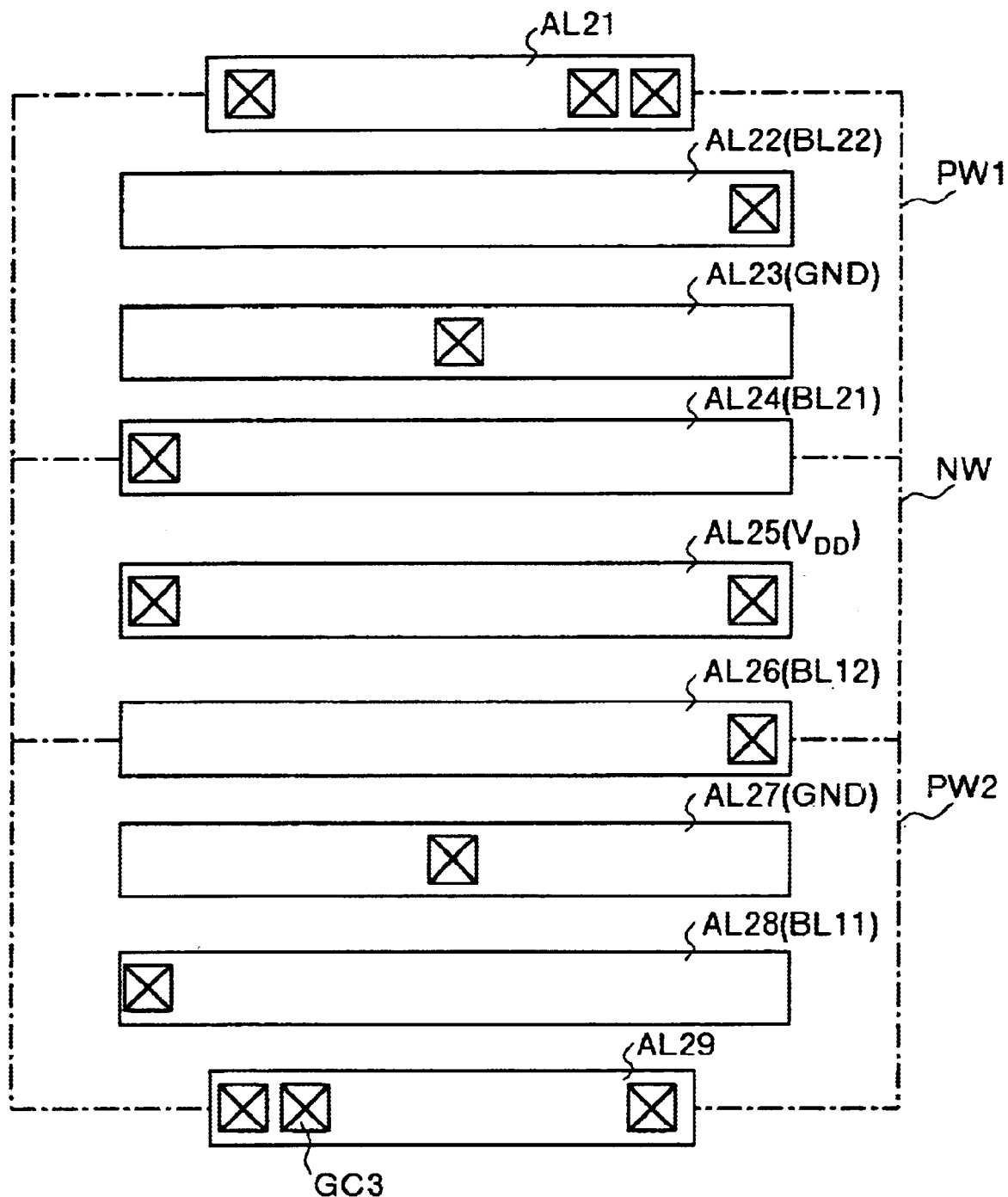
FIG. 27 is a diagram showing the layout of the SRAM memory cell comprising the semiconductor storage apparatus according to the ninth embodiment.

Subsequently, a layer which is provided on the layer shown in FIG. 26 will be explained. FIG. 27 shows a layer comprising a second metal interconnection layer which is provided on the layer shown in FIG. 26. The layer shown in FIG. 27 comprises a second metal interconnection layer AL25 for applying a power potential $V_{DD}$ via the connector hole+via hole of FIG. 26 to the P+ diffusion regions FL22 and FL25. The second metal interconnection layer AL25 functions as a power line and, according to the circuit constitution of FIG. 24, connects the sources of the PMOS transistors PM1 and PM2 to the power source.

A second metal interconnection layer AL23 is provided, and applies a ground potential GND via the first metal interconnection layer AL14 shown in FIG. 26 to the N+ diffusion region FL11. The second metal interconnection layer AL23 functions as a ground line and, according to the circuit constitution of FIG. 24, grounds the sources of the NMOS transistors NM3 and NM4.

Furthermore, a second metal interconnection layer AL27 is provided, and applies a ground potential GND via the first metal interconnection layer AL17 shown in FIG. 26 to the $N^+$ diffusion region FL31. The second metal interconnection layer AL27 functions as a ground line and, according to the circuit constitution of FIG. 24, grounds the sources of the NMOS transistors NM1 and NM2.

The layer shown in FIG. 27 further comprises a second metal interconnection layer AL22 which is connected via the first metal interconnection layer AL15 of FIG. 26 to the $N^+$ diffusion region FL15 of the layer below and functions as an inverse-phase bit line BL22, a second metal interconnection layer AL24 which is connected via the first metal interconnection layer AL13 to the $N^+$ diffusion region FL12 and functions as an regular-phase bit line BL21, a second metal interconnection layer AL26 which connects via the first metal interconnection layer AL18 shown in FIG. 26 to the $N^+$ diffusion region FL35 of the layer below and functions as a first inverse-phase bit line BL12, and a second metal interconnection layer AL28 which connects via the first metal interconnection layer AL16 to the $N^+$ diffusion region FL32 and functions as a first regular-phase bit line BL11.

A second metal interconnection layer AL21 is connected via the connector hole+via hole of FIG. 26 to the polysilicon interconnection layers PL13 and PL14 of the layer below, and a second metal interconnection layer AL29 is connected via the connector hole+via hole of FIG. 26 to the polysilicon interconnection layers PL15 and PL16 of the layer below.

In the circuit diagram shown in FIG. 24, the second metal interconnection layers AL22 and AL24 connect the drain of the NMOS transistor for access N6 to the second inverse-phase bit line BL22, and connect the drain of the NMOS transistor for access N5 to the second regular-phase bit line BL21. The second metal interconnection layers AL26 and AL28 connect the drain of the NMOS transistor for access N4 to the first inverse-phase bit line BL12, and connect the drain of the NMOS transistor for access N3 to the first regular-phase bit line BL11.

The second metal interconnection layers AL21 to AL29 can be provided in a straight line extending parallel to the first and second well interfaces. In a single memory cell, this makes it possible to shorten the lengths of the first regular-phase bit line BL11, the first inverse-phase bit line BL12, the second regular-phase bit line BL21, and the second inverse-phase bit line BL22.

Figure 28:
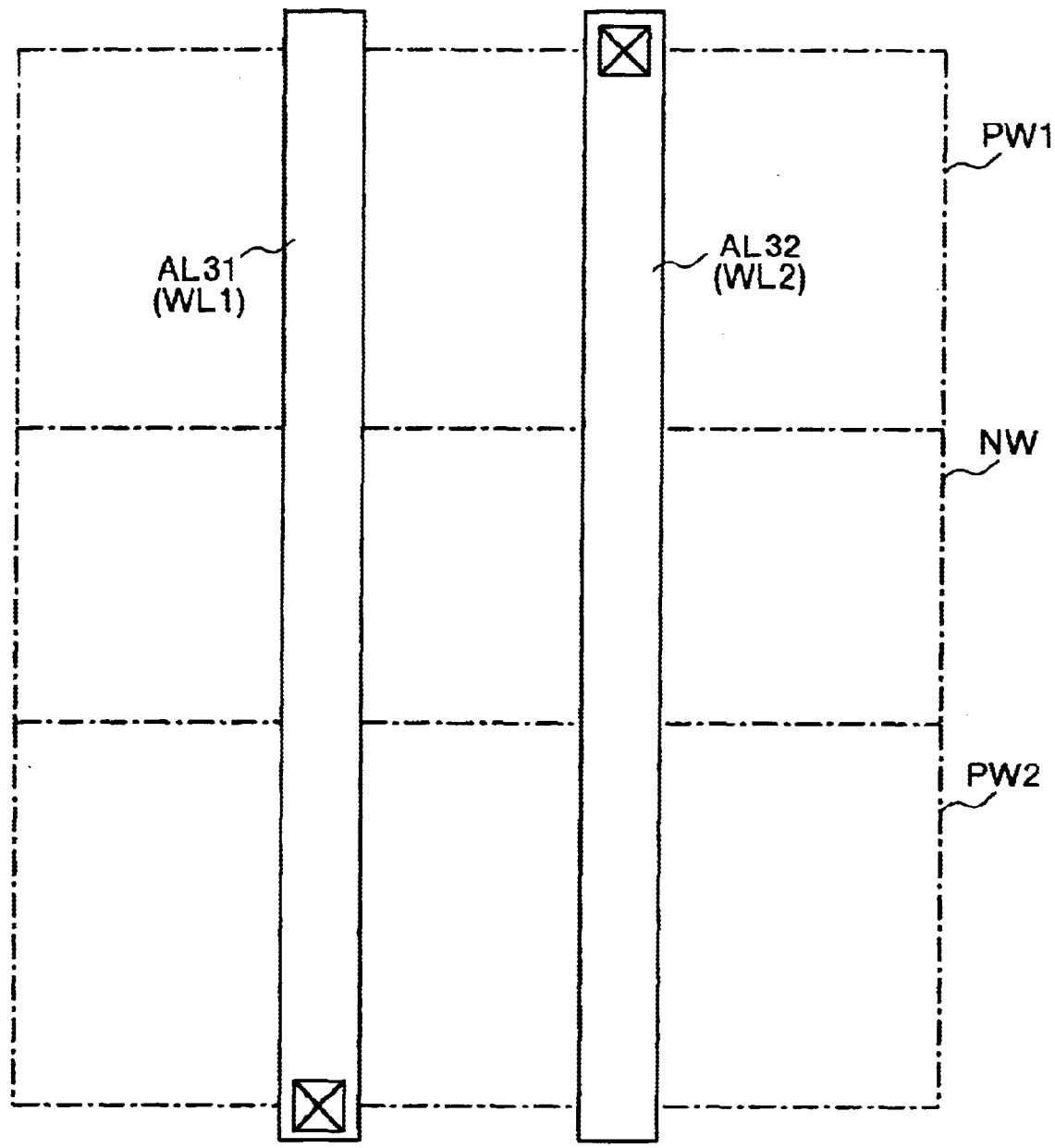
FIG. 28 is a diagram showing the layout of the SRAM memory cell comprising the semiconductor storage apparatus according to the ninth embodiment.

Subsequently, a layer provided on the layer shown in FIG. 27 will be explained. FIG. 28 shows a layer comprising a third metal interconnection layer which is provided on the layer shown in FIG. 27. The layer of FIG. 28 comprises a third metal interconnection layer AL31 which connects the polysilicon interconnection layers PL15 and PL16 via the second metal interconnection layer AL29 of the layer below, and functions as a first word line WL1. In the circuit constitution of FIG. 24, the third metal interconnection layer AL31 connects the gates of the NMOS transistors N3 and N4 to the first word line WL1.

The layer of FIG. 28 further comprises a third metal interconnection layer AL32 which connects the polysilicon interconnection layers PL13 and PL14 via the second metal interconnection layer AL2 of the layer below, and functions as a second word line WL2. In the circuit constitution of FIG. 24, the third metal interconnection layer AL32 connects the gates of the NMOS transistors N5 and N6 to the second word line WL2.

As described above, according to the semiconductor storage apparatus of the ninth embodiment, the sources of the PMOS transistors P1 and P2 for increasing the capacity of the storage nodes NA and NB share the $P^+$ diffusion region FL21. The connection between the drain of the PMOS transistor P1 and the drain of the PMOS transistor PM1, that is, the connection between the storage node NA and the PMOS transistor P1 is achieved by sharing the $P^+$ diffusion region FL23. The connection between the drain of the PMOS transistor P2 and the drain of the PMOS transistor PM2, that is, the connection between the storage node NB and the PMOS transistor P2 is achieved by sharing the $P^+$ diffusion region FL24. As a consequence, the area occupied by the newly appended PMOS transistors P1 and P2 can be reduced, thereby enabling the memory cell array to be integrated more highly.

Subsequently, the semiconductor storage apparatus according to a tenth embodiment will be explained. The tenth embodiment describes another example of the constitution of the two-port SRAM memory cell described in the ninth embodiment.

Figure 29:
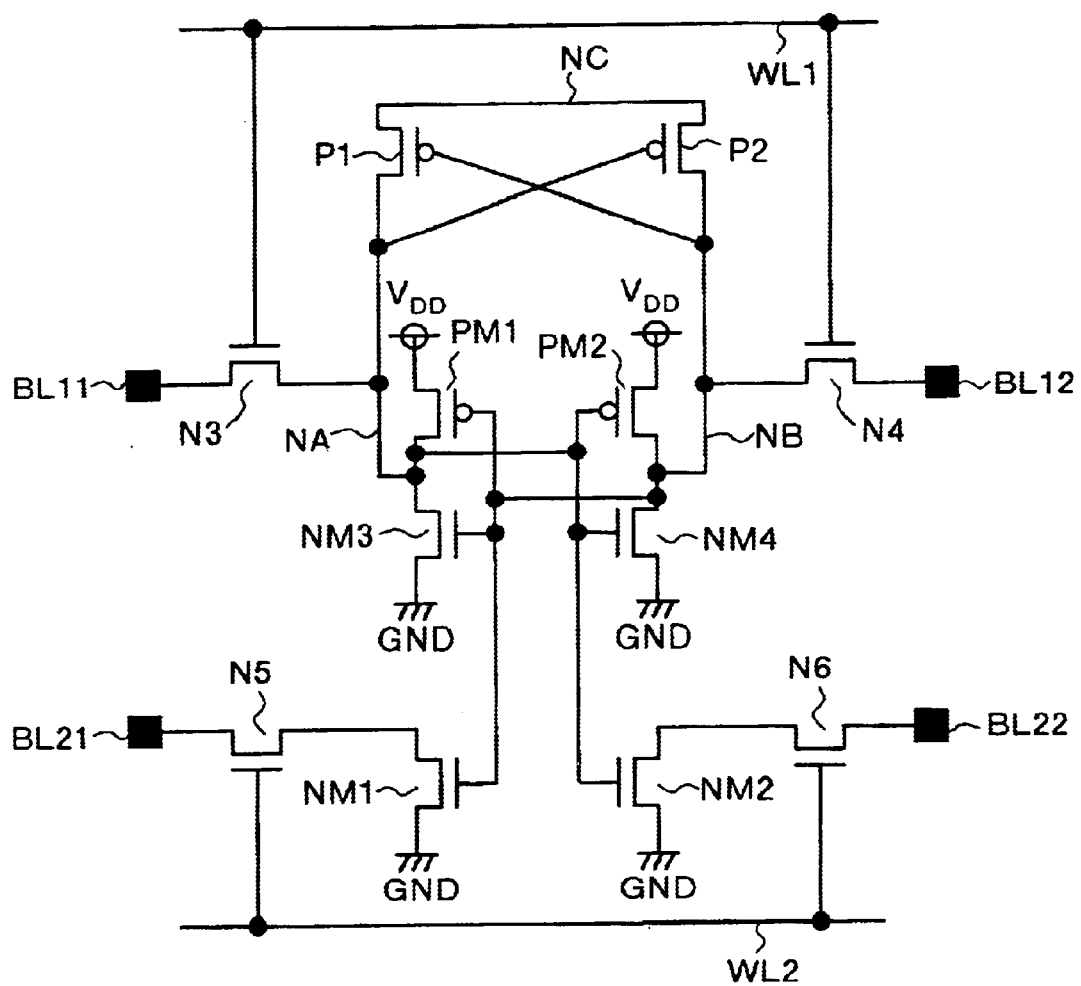
FIG. 29 is a circuit diagram showing an SRAM memory cell comprising the semiconductor storage apparatus according to a tenth embodiment.

FIG. 29 is a circuit diagram showing an SRAM memory cell of the semiconductor storage apparatus according to the tenth embodiment. As shown in FIG. 29, the constitution of the tenth embodiment differs from that of the ninth embodiment in respect of the fact that, in the circuit diagram shown in FIG. 24, the drain of the NMOS transistor NM1 is connected to only to the source of the NMOS transistor for access N5 and the drain of the NMOS transistor NM2 is connected to only to the source of the NMOS transistor for access N6. Conversely, the NMOS transistor for access N5 is connected only to the drain of the NMOS transistor NM1 and the NMOS transistor for access N6 is connected only to the drain of the NMOS transistor NM2. All the other constitution is the same as that shown in FIG. 24 and further explanation will therefore be omitted in order to avoid repetition of explanation.

The two-port SRAM memory cell shown in FIG. 29 differs from the circuit of FIG. 24 in that the second port, which comprises the second word line WL2, the second regular-phase bit line BL21 and the second inverse-phase bit line BL22, is a port for reading only. Although this second port cannot write data, it has an advantage that there is no danger of data stored in the memory cell being destroyed during reading since the NMOS transistors NM3 and NM4 provide a buffer in the memory cell.

Figure 30:
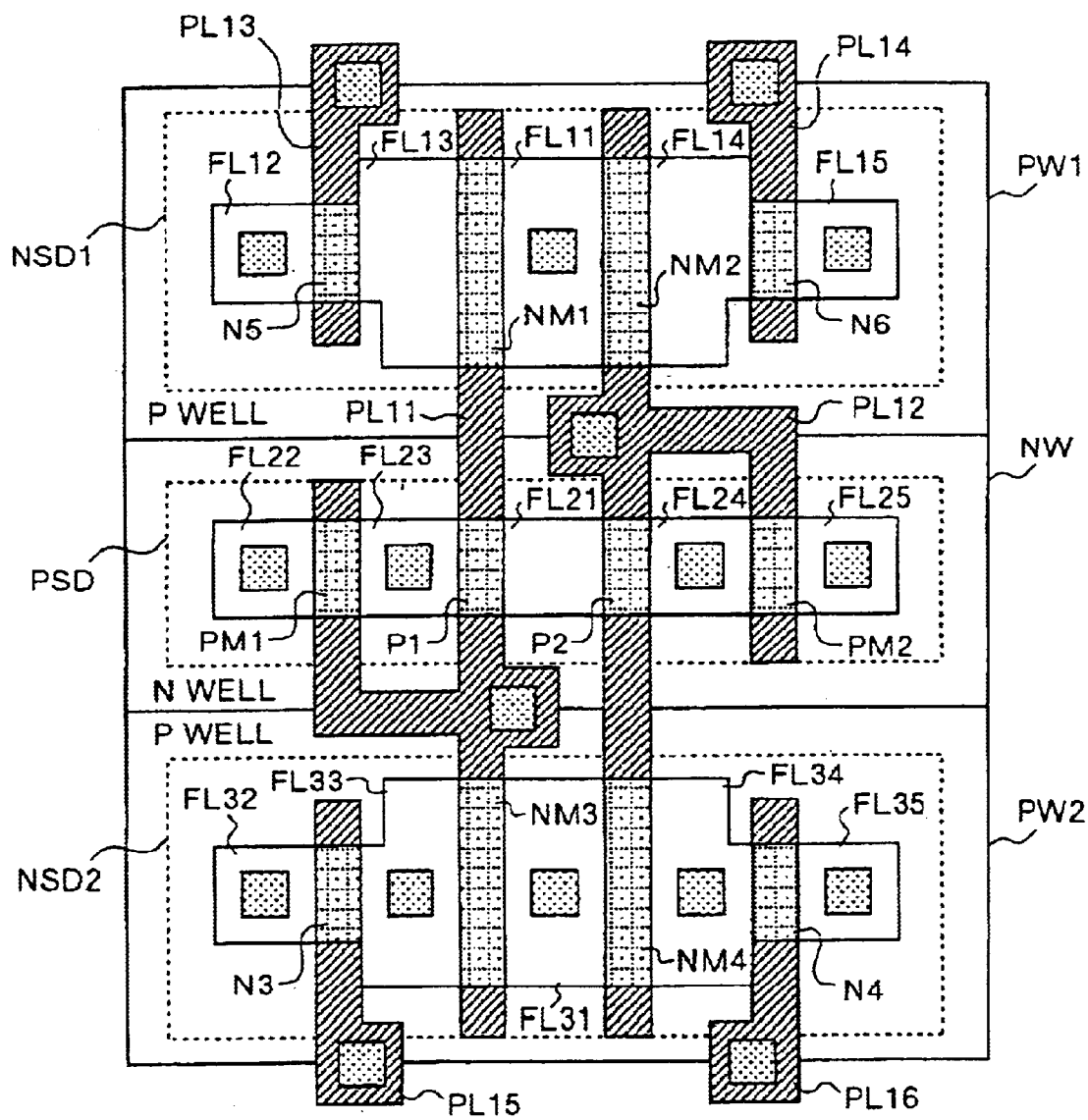
FIG. 30 is a diagram showing the layout of the SRAM memory cell comprising the semiconductor storage apparatus according to the tenth embodiment.
Figure 31:
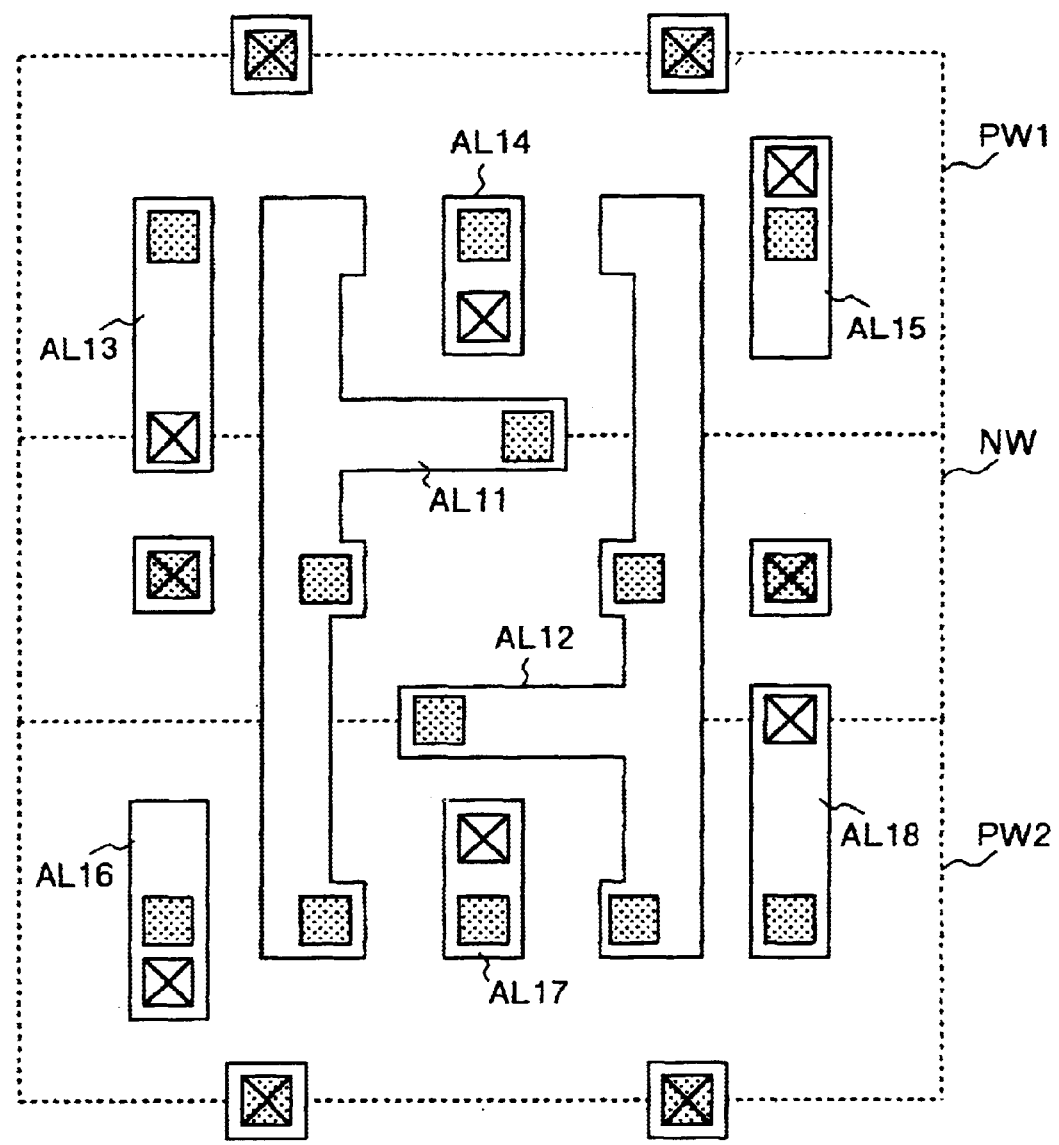
FIG. 31 is a diagram showing the layout of the SRAM memory cell comprising the semiconductor storage apparatus according to the tenth embodiment.

FIG. 30 and FIG. 31 are diagram showing the layout of a memory cell of the semiconductor storage apparatus according to the tenth embodiment. FIG. 30 shows a layout corresponding to that of FIG. 25, differing in that the contact hole GC1 on the $N^+$ diffusion region FL13 and the contact hole GC2 on the $N^+$ diffusion region FL14 shown in FIG. 25 have been removed. Since the constitution is in other respects the same as that of FIG. 25, it will not be explained further.

FIG. 31 shows a layout corresponding to that of FIG. 26, differing in that the contact hole GC1 on the first metal interconnection layer AL11 and the contact hole GC2 on the first metal interconnection layer AL12 shown in FIG. 26 have been removed. Since the constitution of the layout is in other respects the same as that of FIG. 26, it will not be explained further. The layers provided on the layer shown in FIG. 31 are identical to those described in FIG. 27 and FIG. 28, will not be explained further.

As described above, according to the semiconductor storage apparatus of the tenth embodiment, even though the second port in the two-port SRAM memory cell constitution described in the ninth embodiment is a read-only port, the effects of the ninth embodiment can still be obtained.

Subsequently, the semiconductor storage apparatus according to an eleventh embodiment will be explained. The eleventh embodiment provides another example of the constitution of the two-port SPAM memory cell described in the tenth embodiment.

Figure 32:
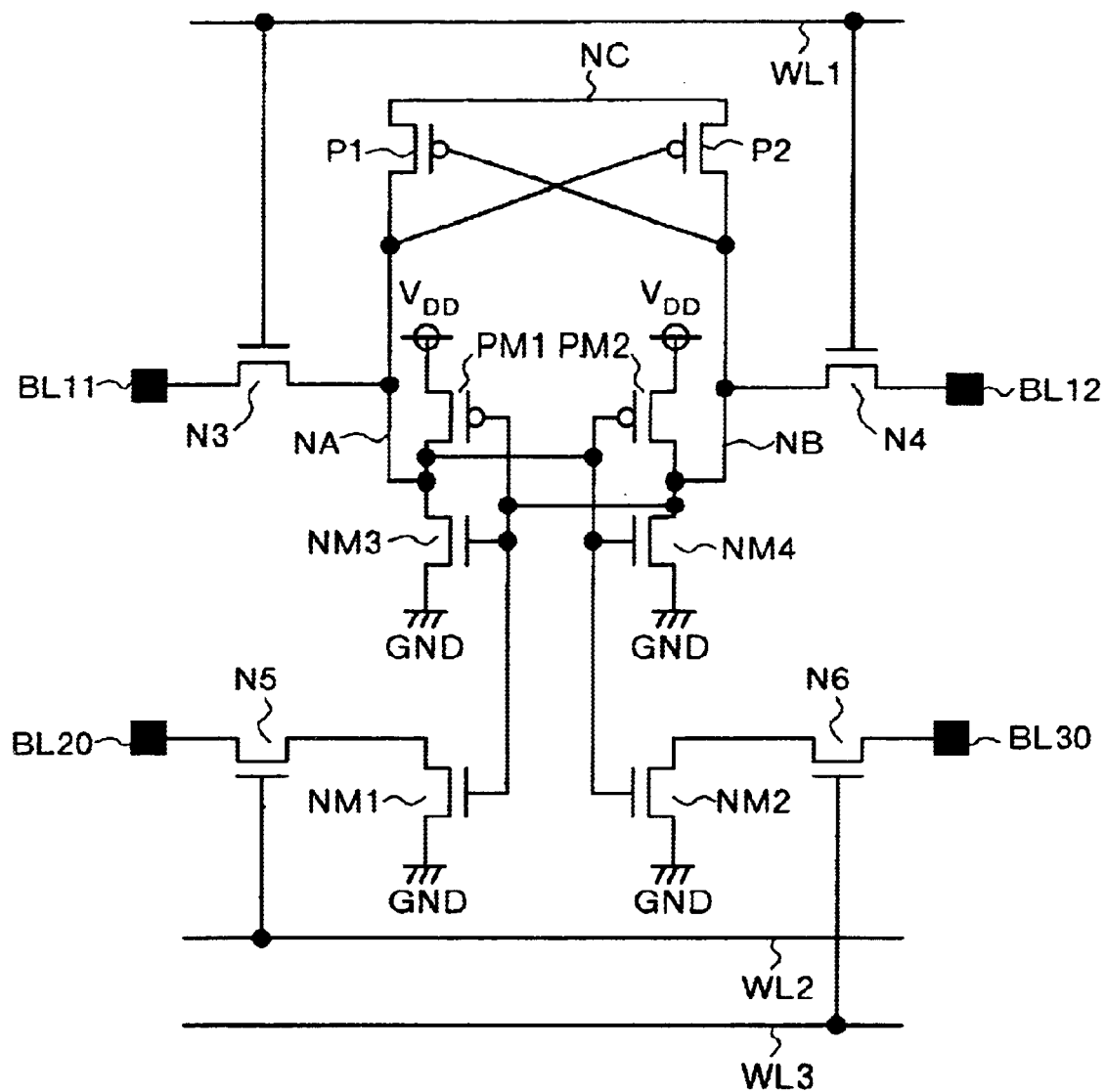
FIG. 32 is a circuit diagram showing an SRAM memory cell comprising the semiconductor storage apparatus according to an eleventh embodiment.

FIG. 32 is a circuit diagram showing an SRAM memory cell of the semiconductor storage apparatus according to the eleventh embodiment. As shown in FIG. 32, the SRAM memory cell of the eleventh embodiment is characterized in that, in the circuit shown in FIG. 29, the gate of the NMOS transistor for access N5 is connected to the second word line WL2 and the gate of the NMOS transistor for access N6 is connected to a third word line WL3, thereby creating a three-port SRAM memory cell. All the other constitution is the same as that shown in FIG. 29 and further explanation will therefore be omitted in order to avoid repetition of explanation.

In FIG. 32, the second word line WL2 and the second bit line BL20 comprise a second port for reading only, and the third word line WL3 and a third bit line BL30 comprise a third port for reading only.

Figure 33:
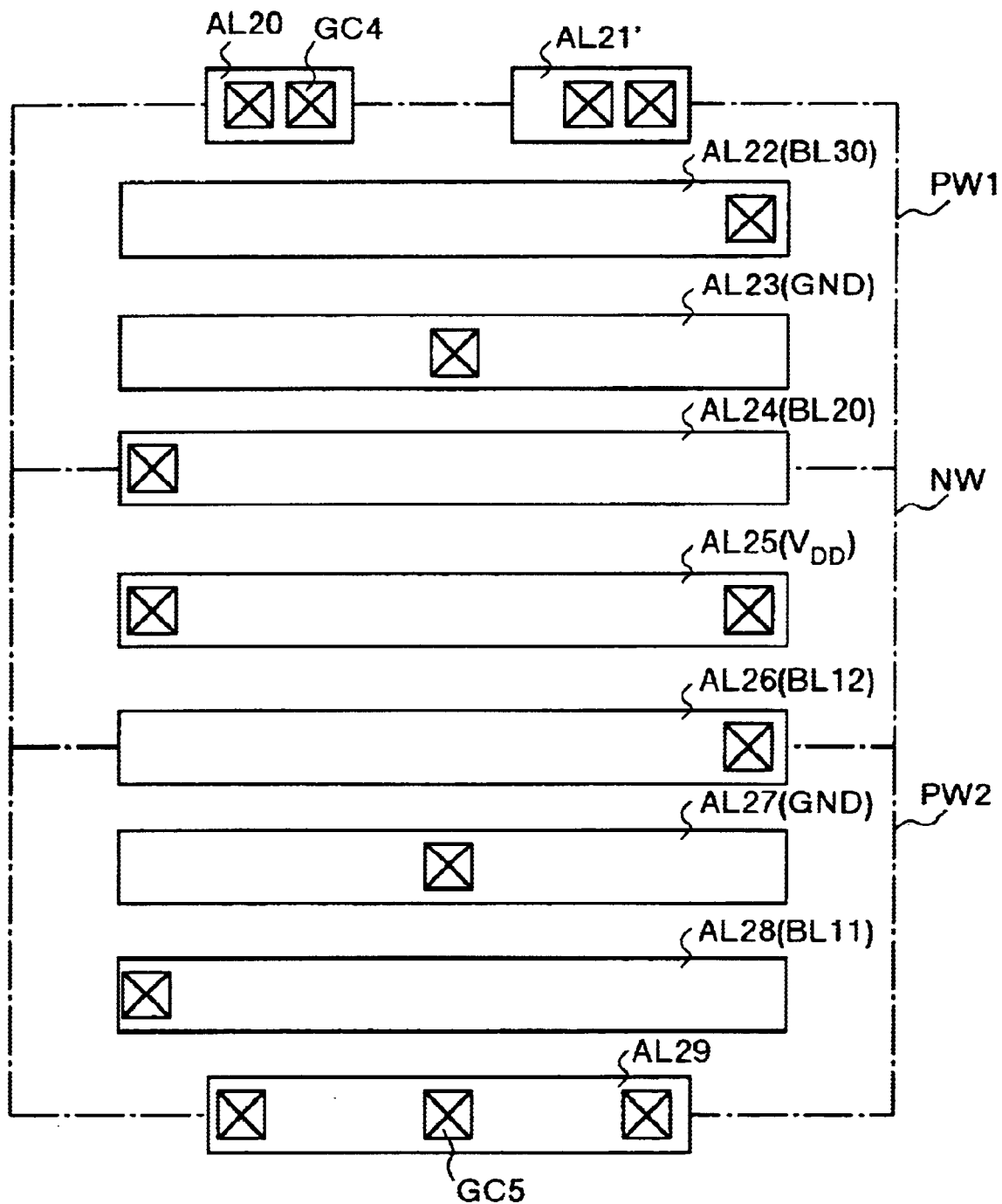
FIG. 33 is a diagram showing the layout of the SRAM memory cell comprising the semiconductor storage apparatus according to the eleventh embodiment.
Figure 34:
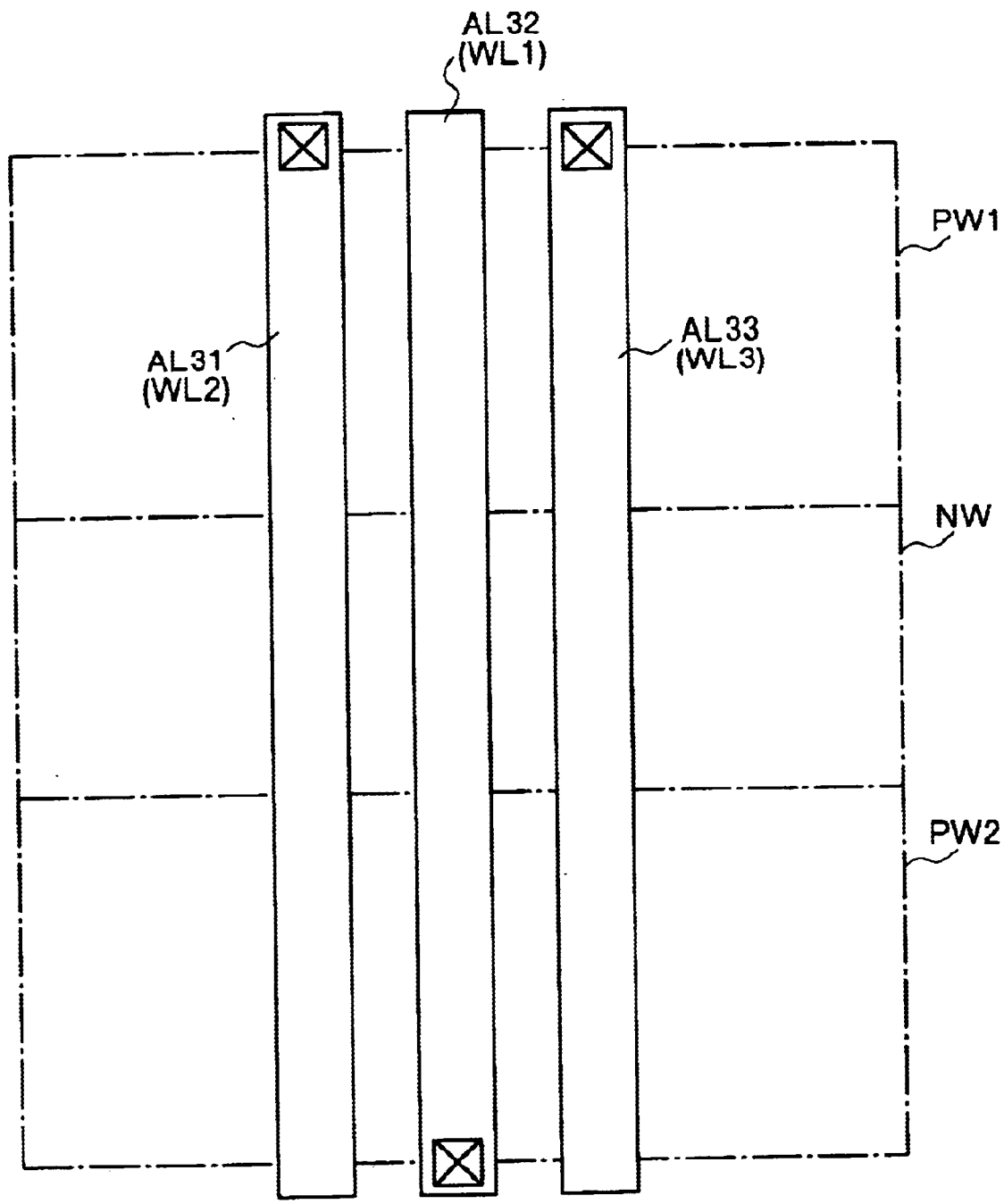
FIG. 34 is a diagram showing the layout of the SRAM memory cell comprising the semiconductor storage apparatus according to the eleventh embodiment.

The layout diagrams of the memory cell of the semiconductor storage apparatus according to the eleventh embodiment are the same sequentially from the bottom layer as those of FIG. 30 and FIG. 31, and will not be explained further here. FIG. 33 and FIG. 34 are diagrams showing the layout of the memory cell of the semiconductor storage apparatus according to the eleventh embodiment. FIG. 33 shows a layer corresponding to that of FIG. 27 which is provided on top of FIG. 30. FIG. 33 differs from FIG. 27 in that the second metal interconnection layer AL21 shown in FIG. 27 is split into a second metal interconnection layer AL20 and a second metal interconnection layer A21', and a contact hole GC4 is newly provided on the second metal interconnection layer AL20.

FIG. 33 further differs from FIG. 27 in that the contact hole GC3 on the second metal interconnection layer AL29 is removed and replaced by a contact hole GC5. In all other respects, the constitution of the layout is the same as that of FIG. 27 and will not be explained further.

FIG. 34 shows the layout of the layer corresponding to FIG. 28. The layer shown in FIG. 34 comprises a third metal interconnection layer AL32 which connects the polysilicon interconnection layers PL15 and PL16' via the second metal interconnection layer AL29 of the layer below and functions as a first word line WL1. That is, the third metal interconnection layer AL32 connects the NMOS transistors N3 and N4 in the circuit of FIG. 32 to the first word line WL1.

The layer shown in FIG. 34 further comprises a third metal interconnection layer AL31 which connects the polysilicon interconnection layer PL13 to the second word line WL2 via the second metal interconnection layer AL20 of the layer below. That is, the third metal interconnection layer AL31 connects the NMOS transistor N5 to the second word line WL2 in the circuit of FIG. 32.

Moreover, the layer shown in FIG. 34 further comprises a third metal interconnection layer AL33 which connects the polysilicon interconnection layer PL14 to the third word line WL3 via the second metal interconnection layer AL21' of the layer below. That is, the third metal interconnection layer AL33 connects the NMOS transistor N6 to the third word line WL3 in the circuit of FIG. 32.

As described above, according to the semiconductor storage apparatus of the eleventh embodiment, the effects of the tenth embodiment can be achieved even in the case where, in the constitution of the two-port SRAM memory cell shown in the eighth embodiment, the NMOS transistors N5 and N6 which comprise the port for reading only are allocated to separate word lines to obtain a three-port SRAM memory cell constitution.

Subsequently, the semiconductor storage apparatus according to a twelfth embodiment will be explained. The twelfth embodiment describes an example of a circuit constitution of a contrast memory (CAM) cell.

Figure 35:
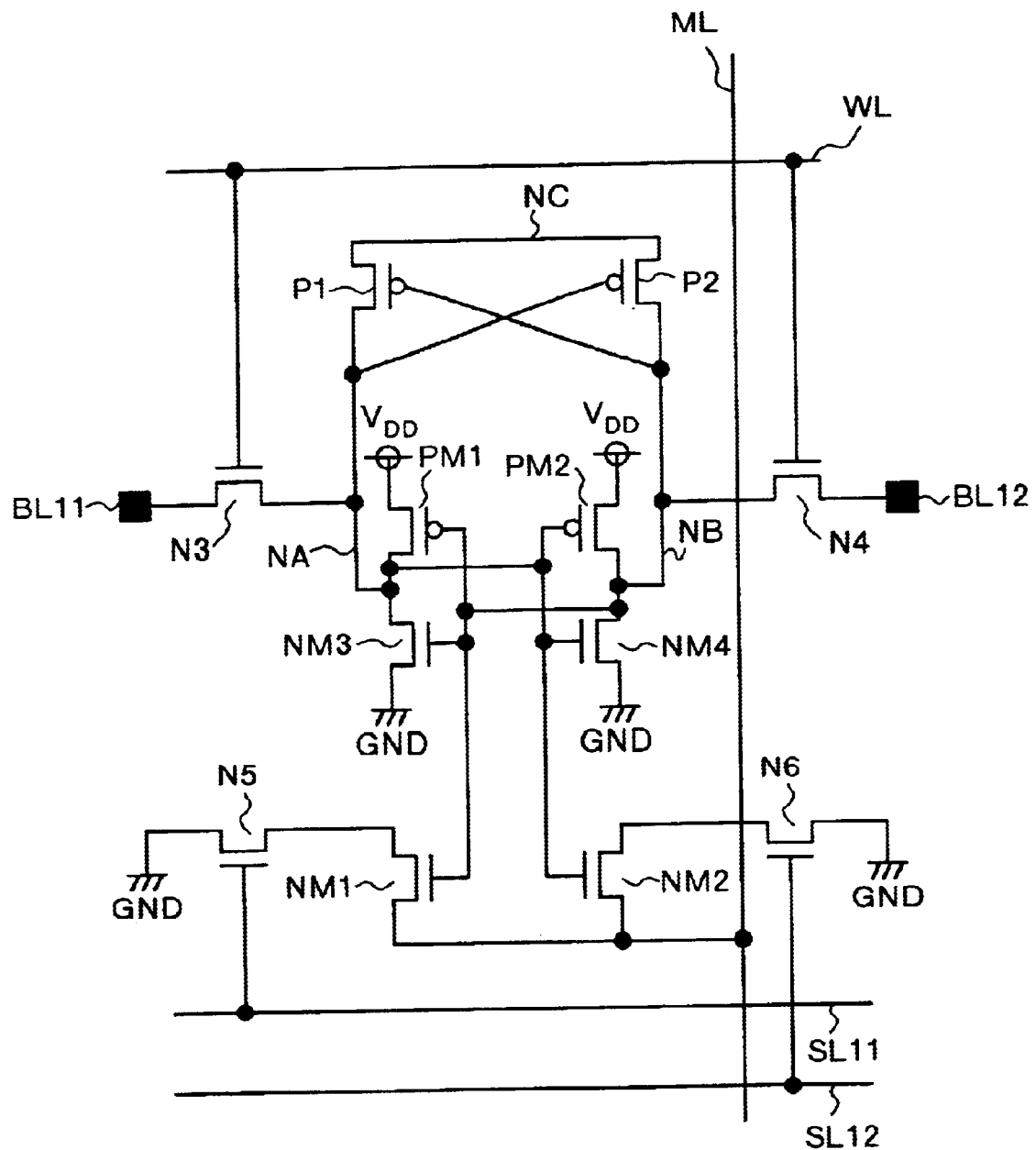
FIG. 35 is a circuit diagram showing an SRAM memory cell comprising the semiconductor storage apparatus according to a twelfth embodiment.
Figure 36:
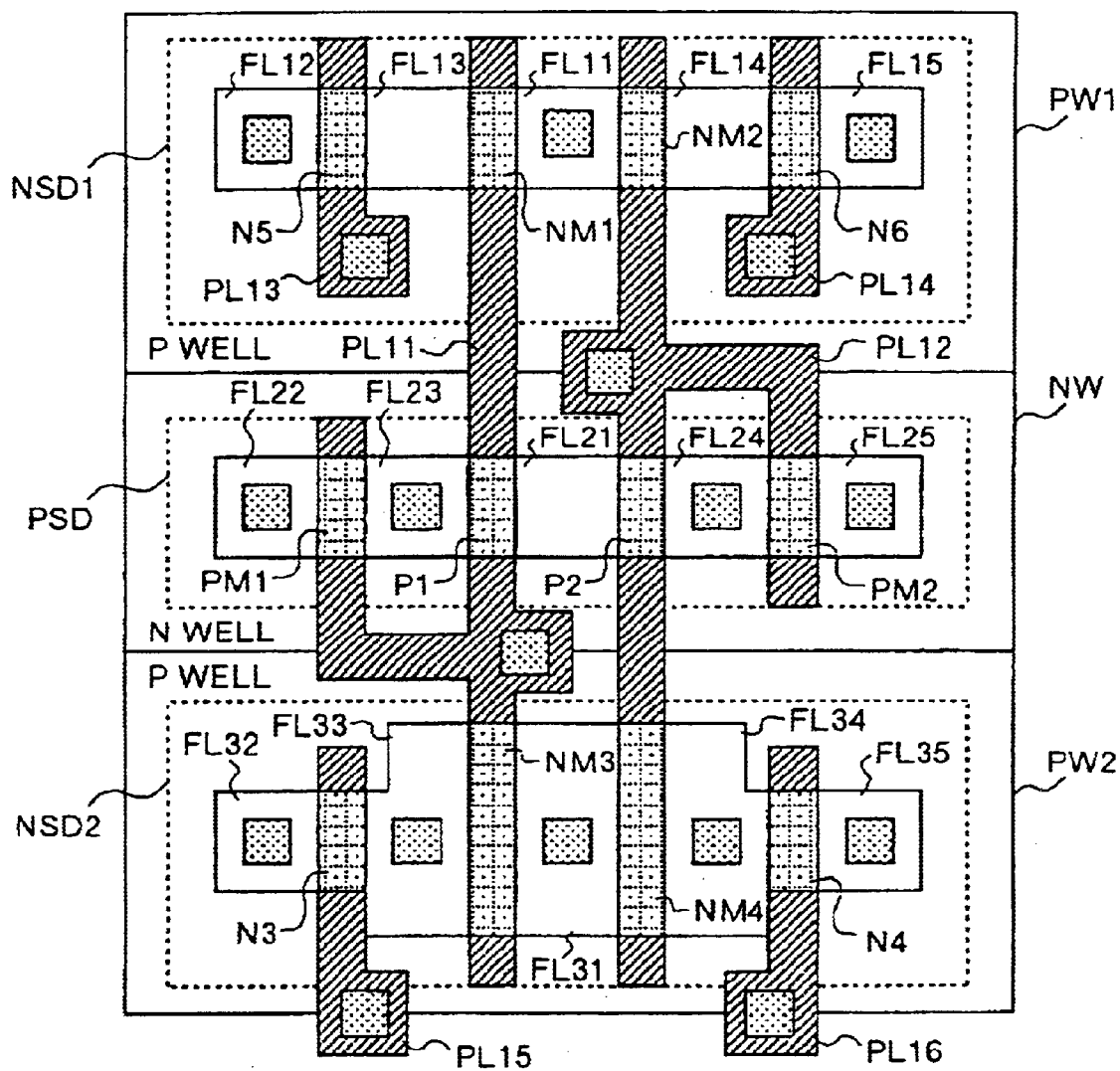
FIG. 36 is a diagram showing the layout of the SRAM memory cell comprising the semiconductor storage apparatus according to the twelfth embodiment.
Figure 37:
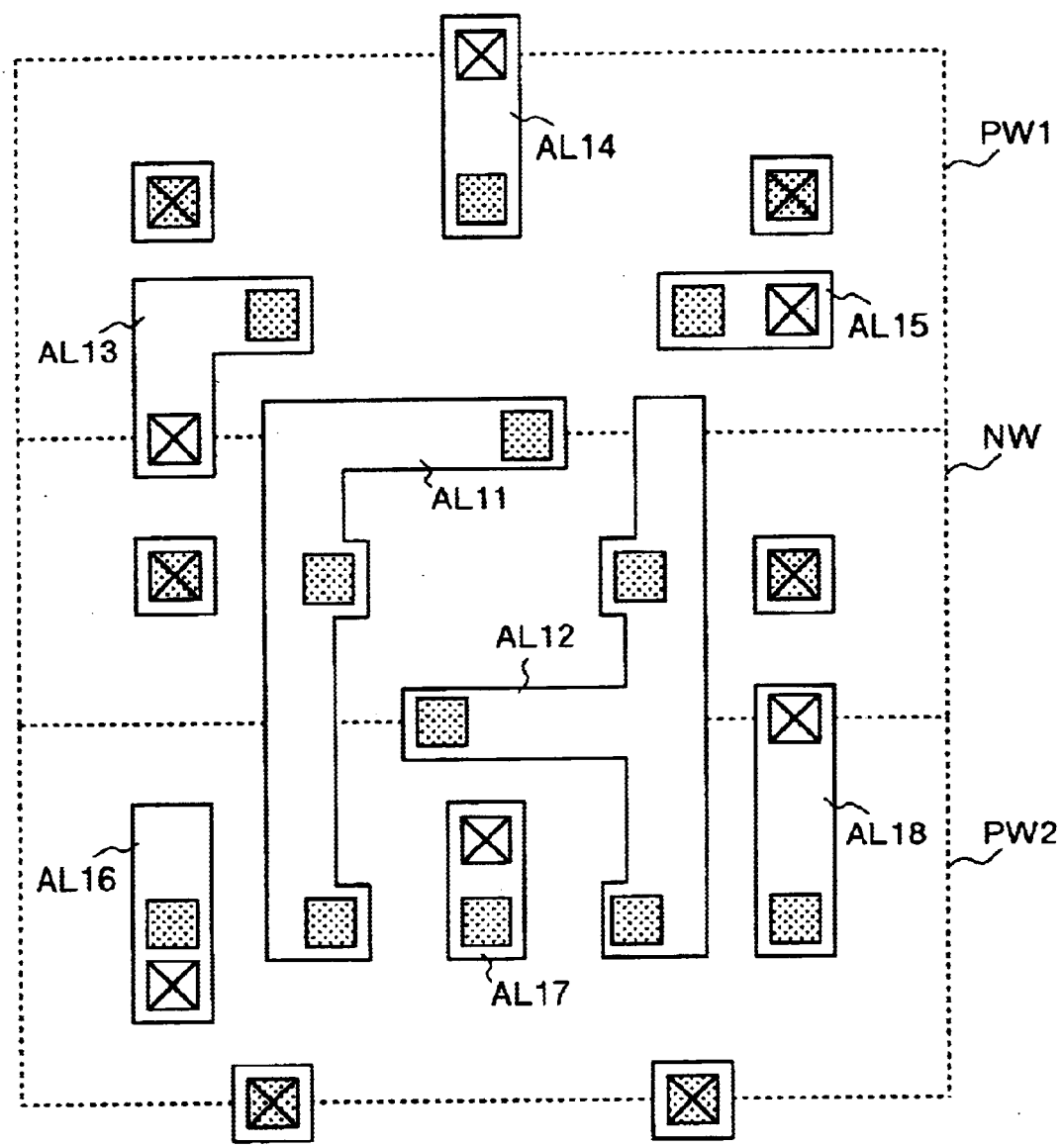
FIG. 37 is a diagram showing the layout of the SRAM memory cell comprising the semiconductor storage apparatus according to the twelfth embodiment.
Figure 38:
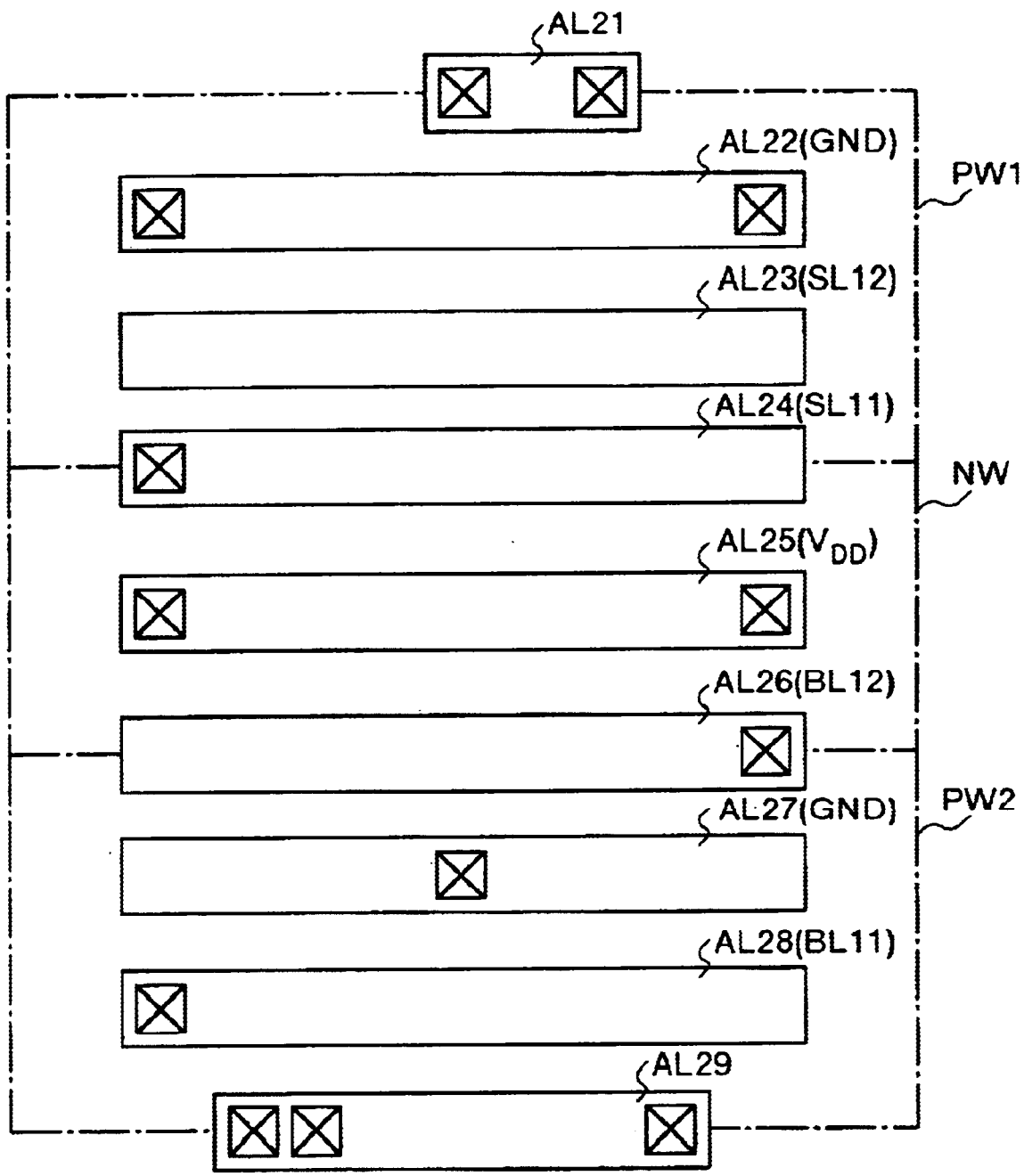
FIG. 38 is a diagram showing the layout of the SRAM memory cell comprising the semiconductor storage apparatus according to the twelfth embodiment.
Figure 39:
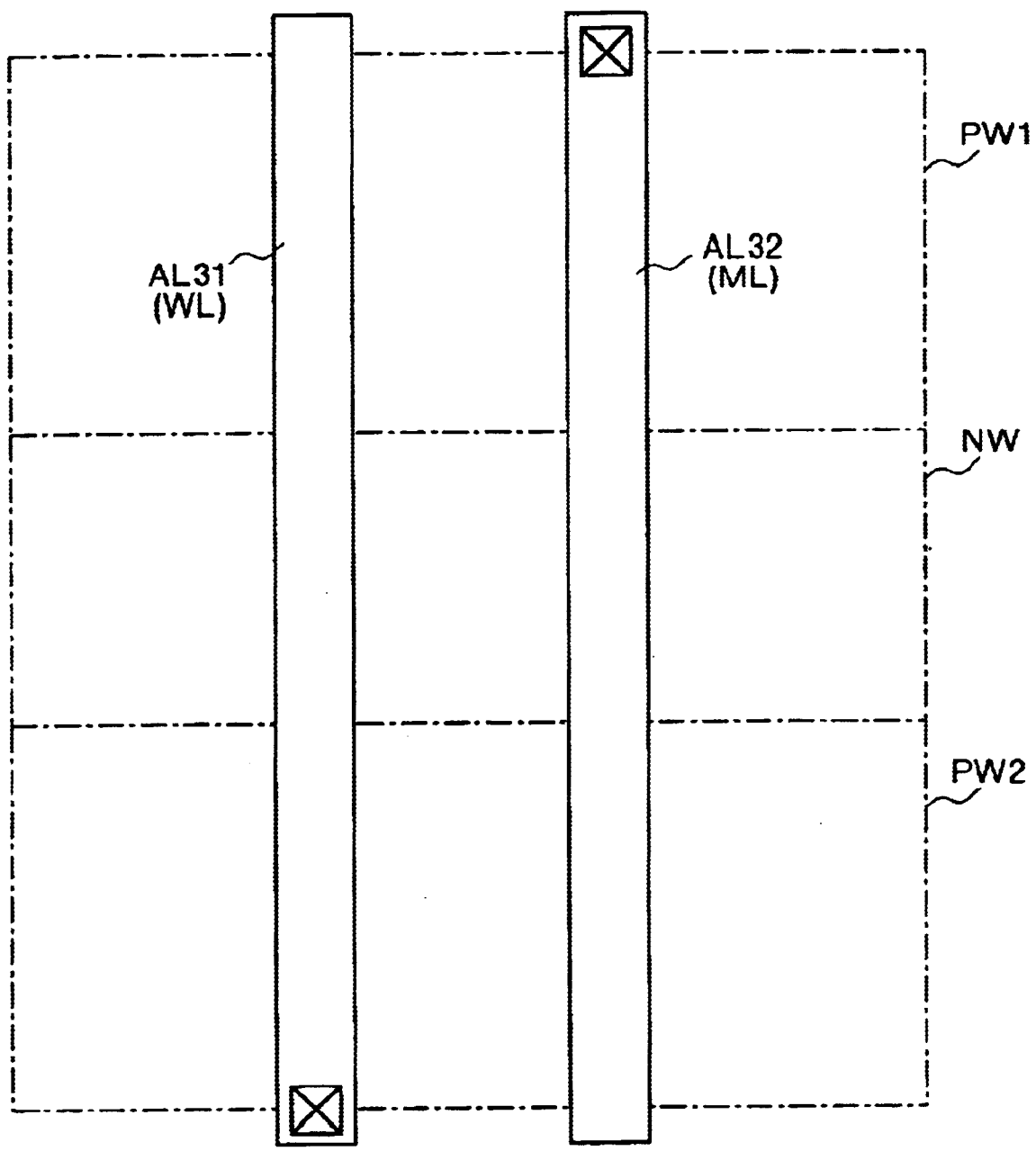
FIG. 39 is a diagram showing the layout of the SRAM memory cell comprising the semiconductor storage apparatus according to the twelfth embodiment.

FIG. 35 is a circuit diagram showing the SRAM memory cell of the semiconductor storage apparatus according to the twelfth embodiment. As shown in FIG. 35, the semiconductor storage apparatus of the twelfth embodiment is characterized in that, in the circuit shown in FIG. 32, the bit lines BL20 and BL30 are connected to the ground line, the sources of the NMOS transistors NM1 and NM2 are connected to each other and also to a match line ML. In FIG. 35, the first word line WL1, the second word line WL2 and the third word line WL3 of FIG. 32 are respectively termed the word line WL, the first search line SL11 and the second search line SL12. In other respects, the connection constitution is the same as FIG. 32 and will not be explained further.

The operation of the CAM cell will be explained briefly. The operations of writing and reading are the same as a conventional 6-CMOS SRAM and need not be described here. Operations in search mode will be explained. Firstly, data to be compared with stored data is applied from the outside to the search lines SL11 and SL12.

This example envisages a case where the stored data is "1", i.e. when the logical status of the storage node NA is "H" and the logical status of the storage node NB is "L". Ordinarily, the match line ML is precharged to "H" or kept at the power potential $V_{DD}$ level via a load resistance. An outside driver drives the search lines SL11 and SL12 at the "L" level. Therefore, the NMOS transistors N5 and N6 are both OFF, the NMOS transistor NM2 is ON, and the NMOS transistor NM1 is OFF.

In search mode, the precharging of the match line ML ends and the match line ML is kept at the weaker power potential $V_{DD}$. Subsequently, comparison data is applied from the outside driver to the search lines SL11 and SL12. The comparison data has the same value ("1") as the stored data. When "1" is applied to the search line SL11 and "0" is applied to the search line SL12, only the NMOS transistor N5 shifts from OFF to ON, but the match line ML maintains the power potential $V_{DD}$ since the NMOS transistor NM1 is OFF.

Let us consider a case where data of "0" which is opposite to the stored data is applied as the comparison data. In this case, only the NMOS transistor N6 shifts from OFF to ON. Since the NMOS transistor NM2 is ON, the match line ML is connected in the same row as the word line WL. When there is even a single mismatch in this row, the match line ML is retracted to the ground potential GND level.

Conversely, when the stored data and comparison data in the same row all match, the match line ML maintains the power potential $V_{DD}$ level, and a flag is raised to indicate that the result of the search is a match. A memory cell which determines whether the search result matches or not based on a result output from the match line ML in this way is termed a CAM cell.

Subsequently, the layout constitution of the semiconductor storage apparatus according to the twelfth embodiment will be explained. FIG. 36 to FIG. 39 are layout diagrams of the SRAM memory cell of the semiconductor storage apparatus according to the twelfth embodiment, and show the layers in the order in which they are laminated from the bottom layer. In FIG. 36 to FIG. 39, legends FL11 to FL15 and FL31 to FL35 represent N⁺ diffusion regions, legends PL11 to PL16 represent polysilicon interconnection layers, legends FL21 to FL25 represent P⁺ diffusion regions, legends AL11 to AL18 represent first metal interconnection layers, legends AL21 to AL29 represent second metal interconnection layers, and legends AL31 to AL32 represent third metal interconnection layers. The connections between these layers is the same as in the embodiments already described above, and will not be further explained here.

As described above, according to the semiconductor storage apparatus of the twelfth embodiment, soft error tolerance can be increased and the effects of the seventh embodiment can be achieved even when a CAM cell constitution is used.

Subsequently, the semiconductor storage apparatus according to a thirteenth embodiment will be explained. The semiconductor storage apparatus of the thirteenth embodiment describes an example constitution of a two-bit two-port SRAM memory cell.

Figure 40:
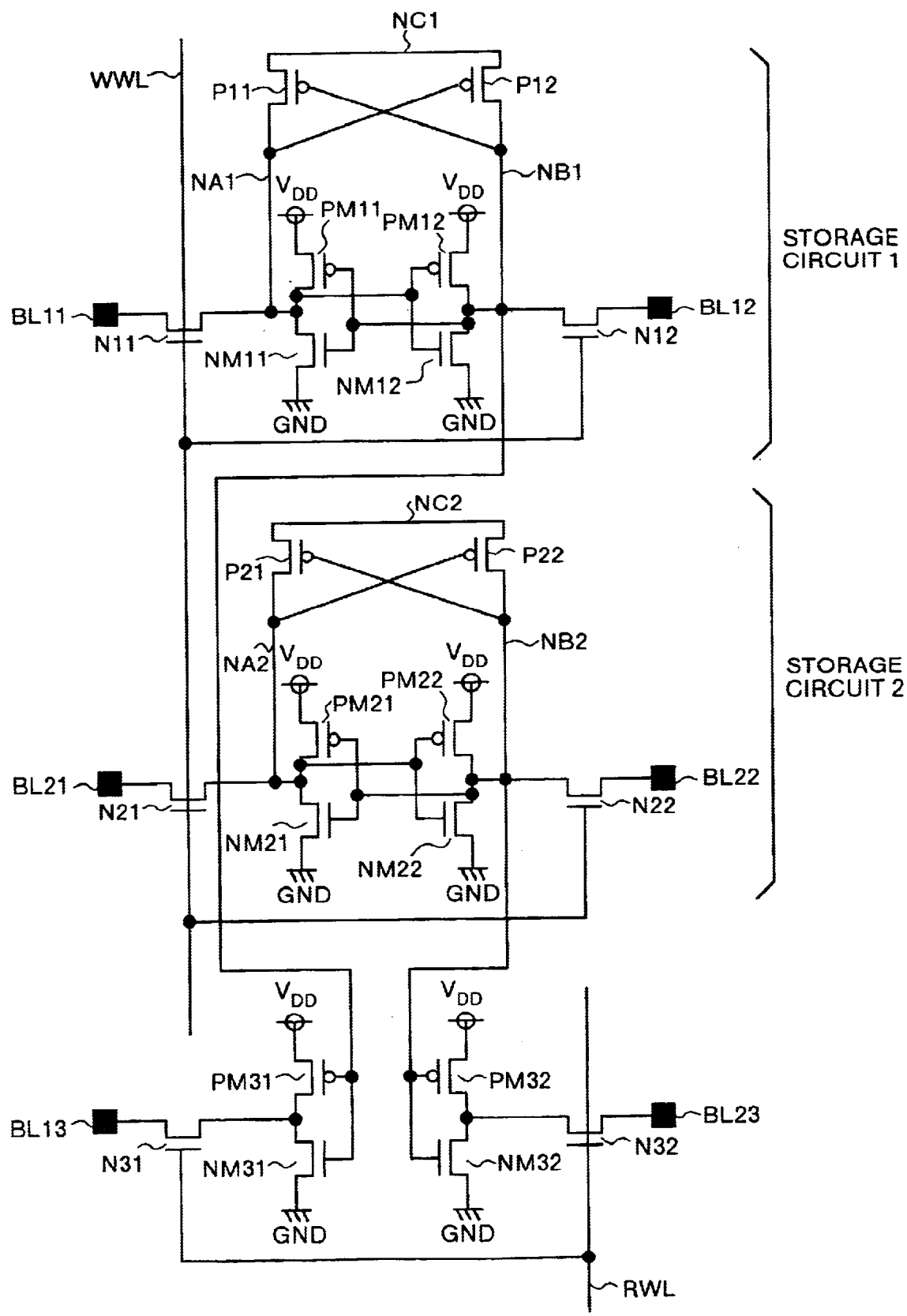
FIG. 40 is a circuit diagram showing an SRAM memory cell comprising the semiconductor storage apparatus according to a thirteenth embodiment.
Figure 41:
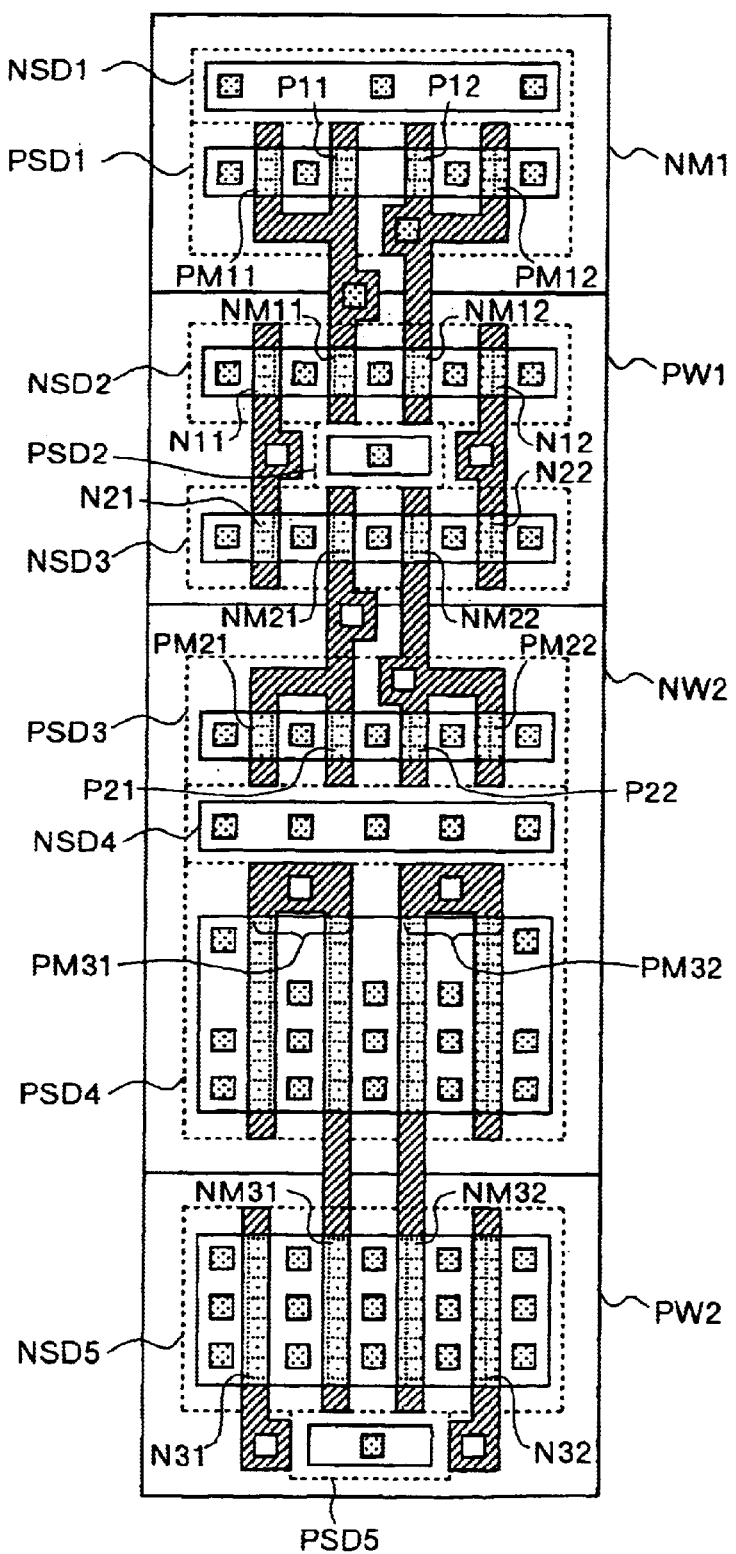
FIG. 41 is a diagram showing the layout of the SRAM memory cell comprising the semiconductor storage apparatus according to the thirteenth embodiment.
Figure 42:
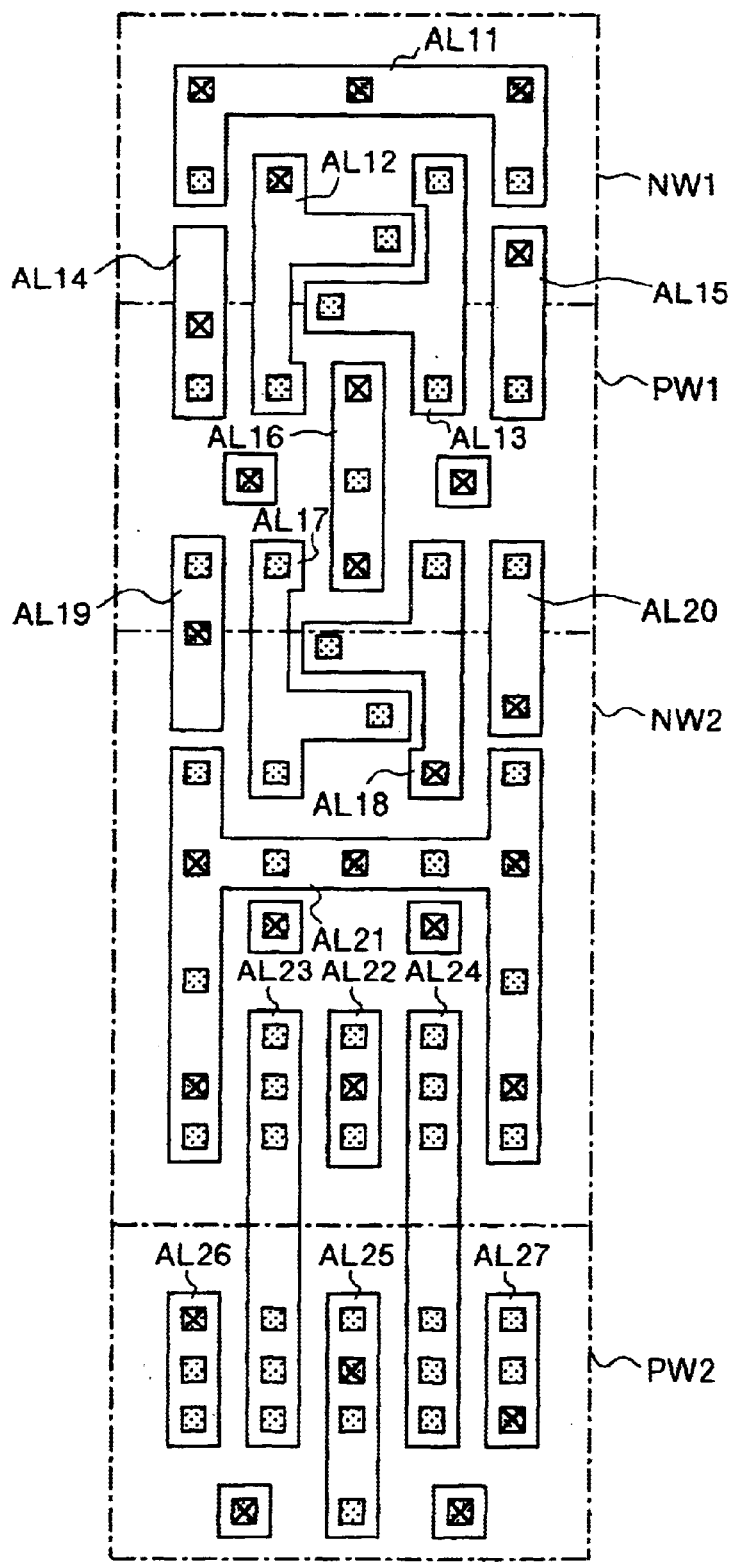
FIG. 42 is a diagram showing the layout of the SRAM memory cell comprising the semiconductor storage apparatus according to the thirteenth embodiment.
Figure 43:
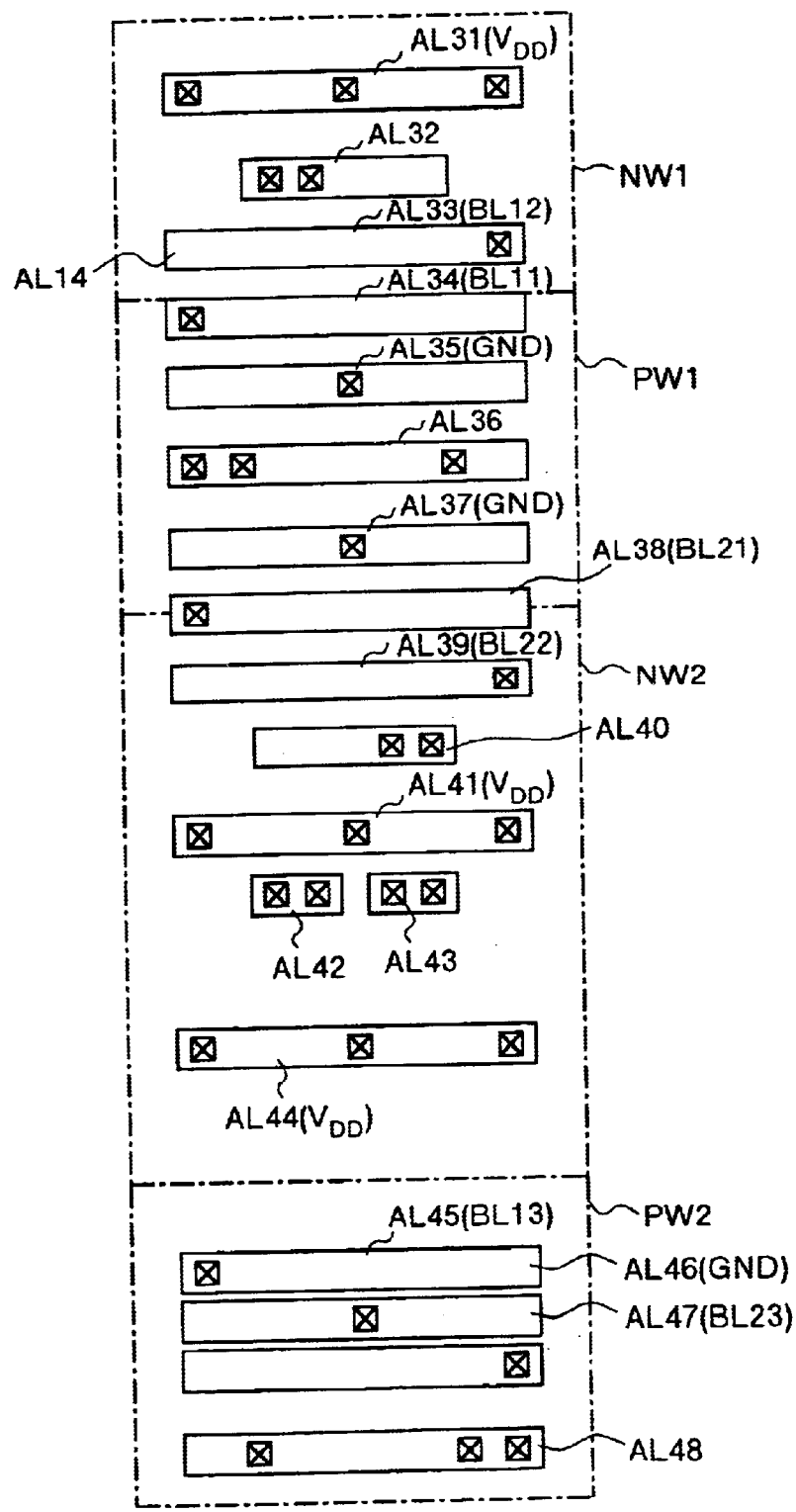
FIG. 43 is a diagram showing the layout of the SRAM memory cell comprising the semiconductor storage apparatus according to the thirteenth embodiment.
Figure 44:
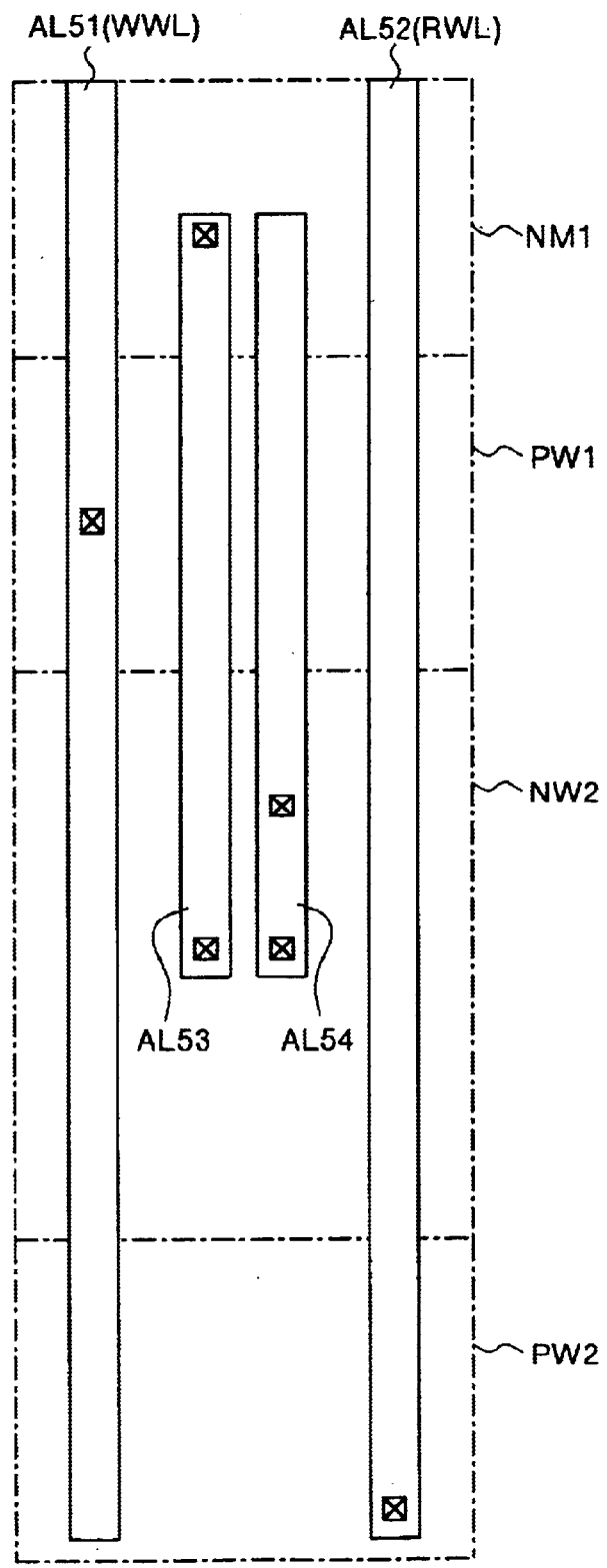
FIG. 44 is a diagram showing the layout of the SRAM memory cell comprising the semiconductor storage apparatus according to the thirteenth embodiment.

FIG. 40 is a circuit diagram showing the SRAM memory cell of the semiconductor storage apparatus according to the thirteenth embodiment. As shown in FIG. 40, the SRAM memory cell of the thirteenth embodiment comprises a pair of storage circuits 1 and 2, each having the constitution of the circuit of FIG. 17, which are connected to a common word line WWL.

The SRAM memory cell shown in FIG. 40 comprises an inverter comprising a PMOS transistor PM31 connected in complement with an NMOS transistor NM31, an inverter comprising a PMOS transistor PM32 connected in complement with an NMOS transistor NM32, and NMOS transistors for access N31 and N32 which are connected at the output terminals of the inverters. The gates of the NMOS transistors for access N31 and N32 connect to a common read word line RWL. This constitution obtains a two-bit two-port SRAM memory cell.

Subsequently, the layout constitution of the semiconductor storage apparatus according to the thirteenth embodiment will be explained. FIG. 41 to FIG. 44 are diagrams showing the layout of the SRAM memory cell of the semiconductor storage apparatus according to the thirteenth embodiment, and show the layers in the order in which they are laminated from the bottom layer. In FIG. 41 to FIG. 44, the parts corresponding to the MOS transistors shown in FIG. 40 are represented by the same legends. Legends AL11 to AL27 represent first metal interconnection layers, legends AL31 to AL48 represent second metal interconnection layers, and legends AL51 to AL54 represent third metal interconnection layers. The connections between the layers are the same as in the embodiments already described and will not be further explained here.

As described above, according to the semiconductor storage apparatus of the thirteenth embodiment, soft error tolerance can be increased and the effects of the seventh embodiment can be obtained even when the constitution of a two-bit two-port SRAM memory cell is applied.

Subsequently, the semiconductor storage apparatus according to a fourteenth embodiment will be explained. The fourteenth embodiment provides an example of a three-port SRAM memory cell comprising one write/read port and two read-only ports.

Figure 45:
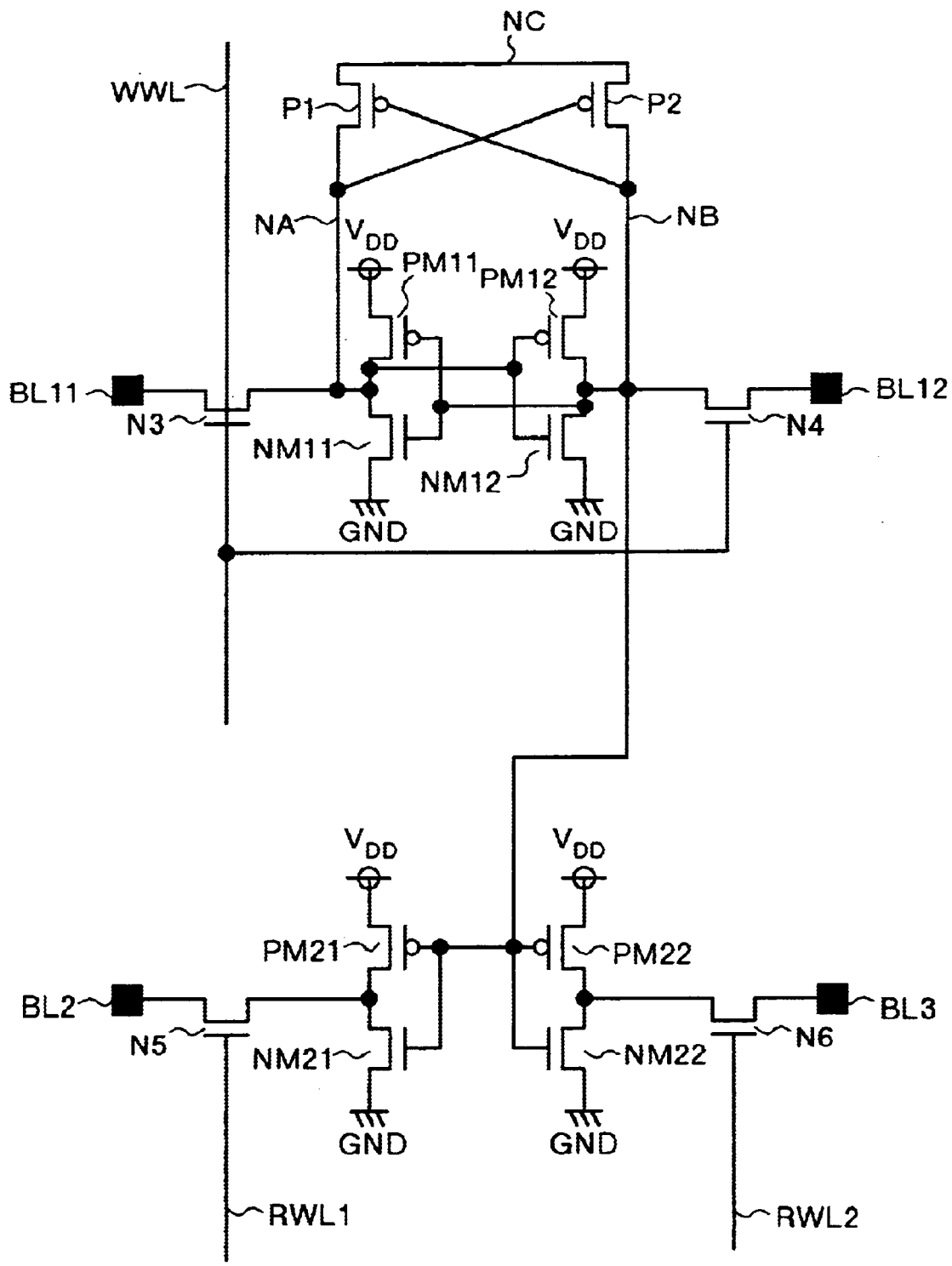
FIG. 45 is a circuit diagram showing an SRAM memory cell comprising the semiconductor storage apparatus according to a fourteenth embodiment.
Figure 46:
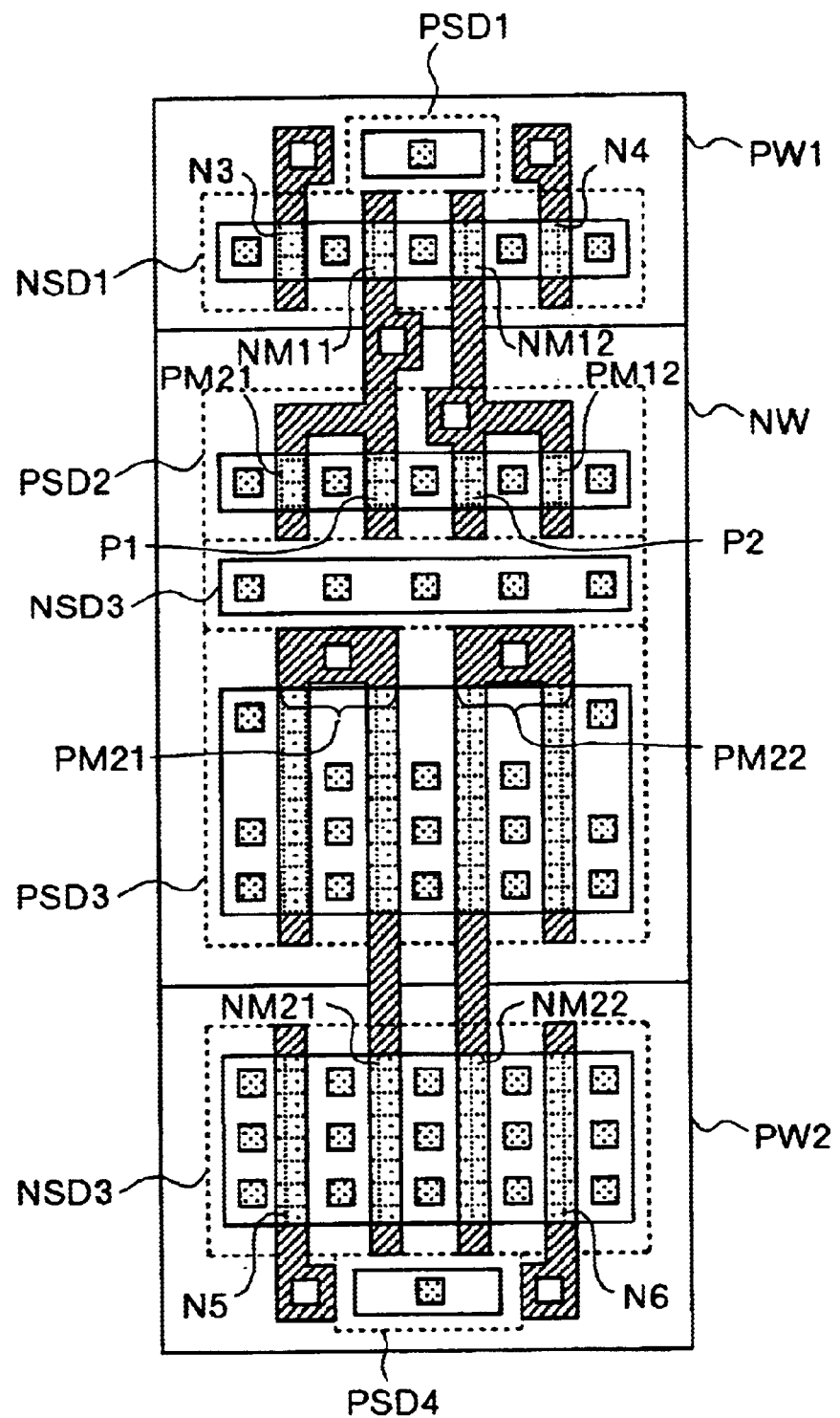
FIG. 46 is a diagram showing the layout of the SRAM memory cell comprising the semiconductor storage apparatus according to the fourteenth embodiment.
Figure 47:
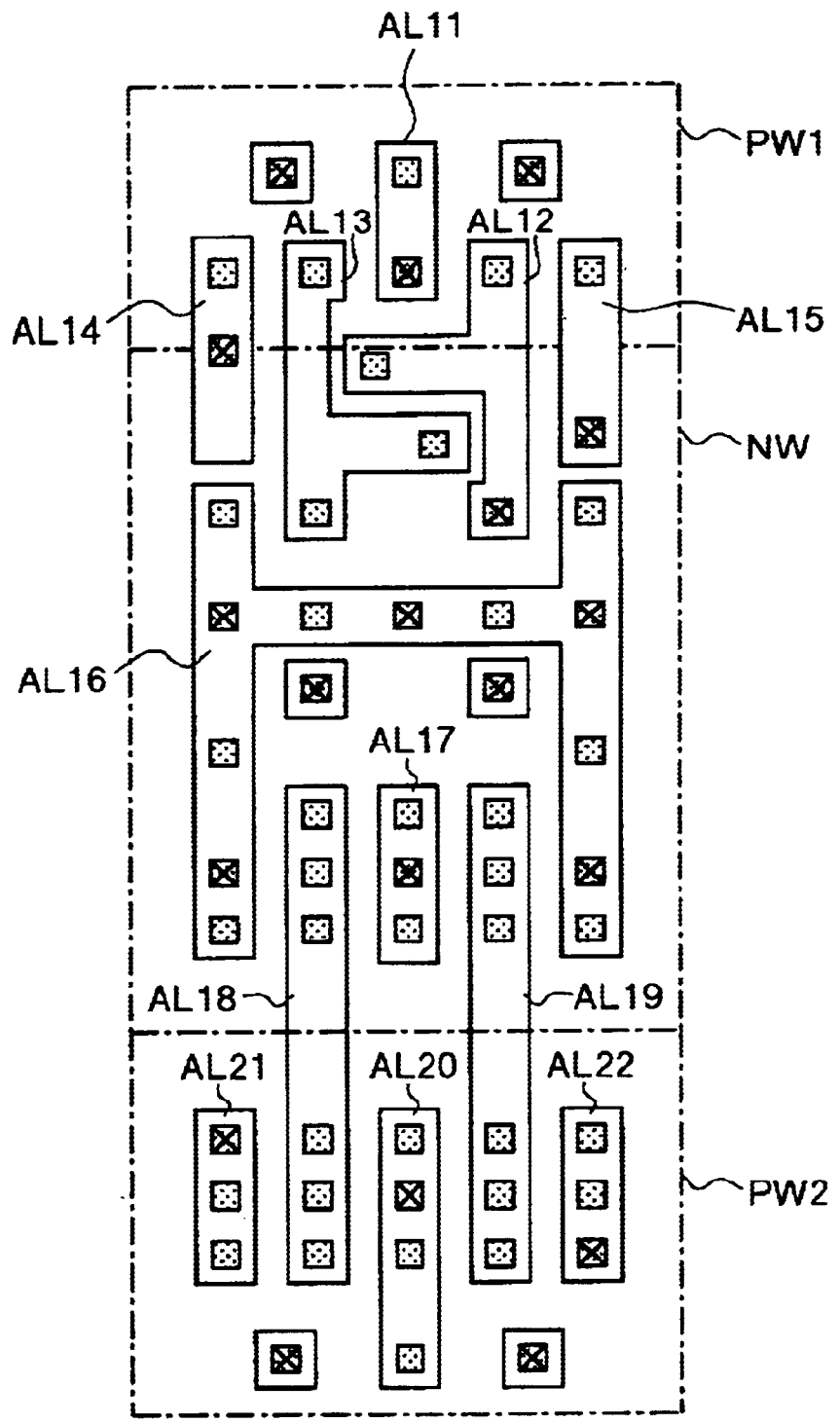
FIG. 47 is a diagram showing the layout of the SRAM memory cell comprising the semiconductor storage apparatus according to the fourteenth embodiment.
Figure 48:
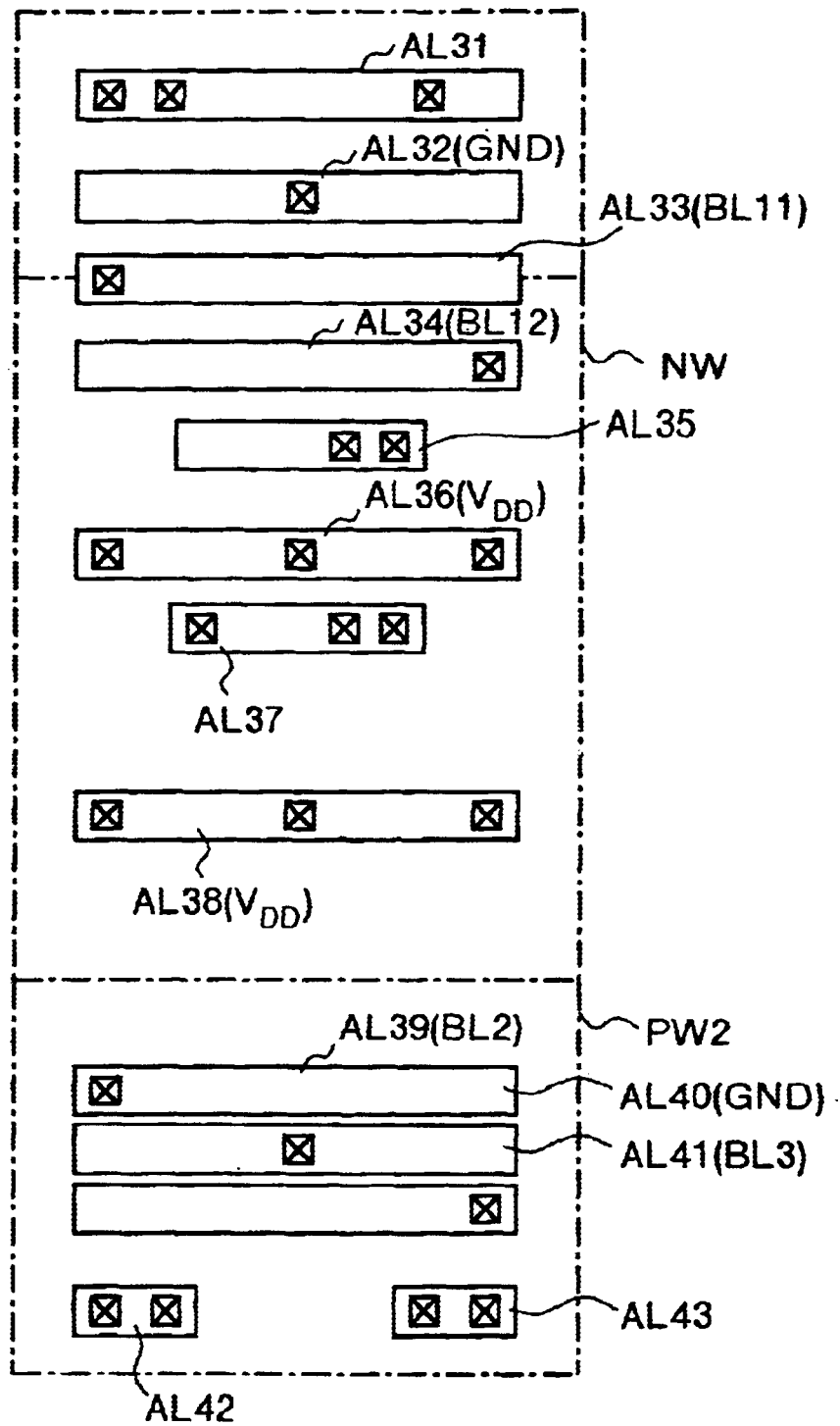
FIG. 48 is a diagram showing the layout of the SRAM memory cell comprising the semiconductor storage apparatus according to the fourteenth embodiment.
Figure 49:
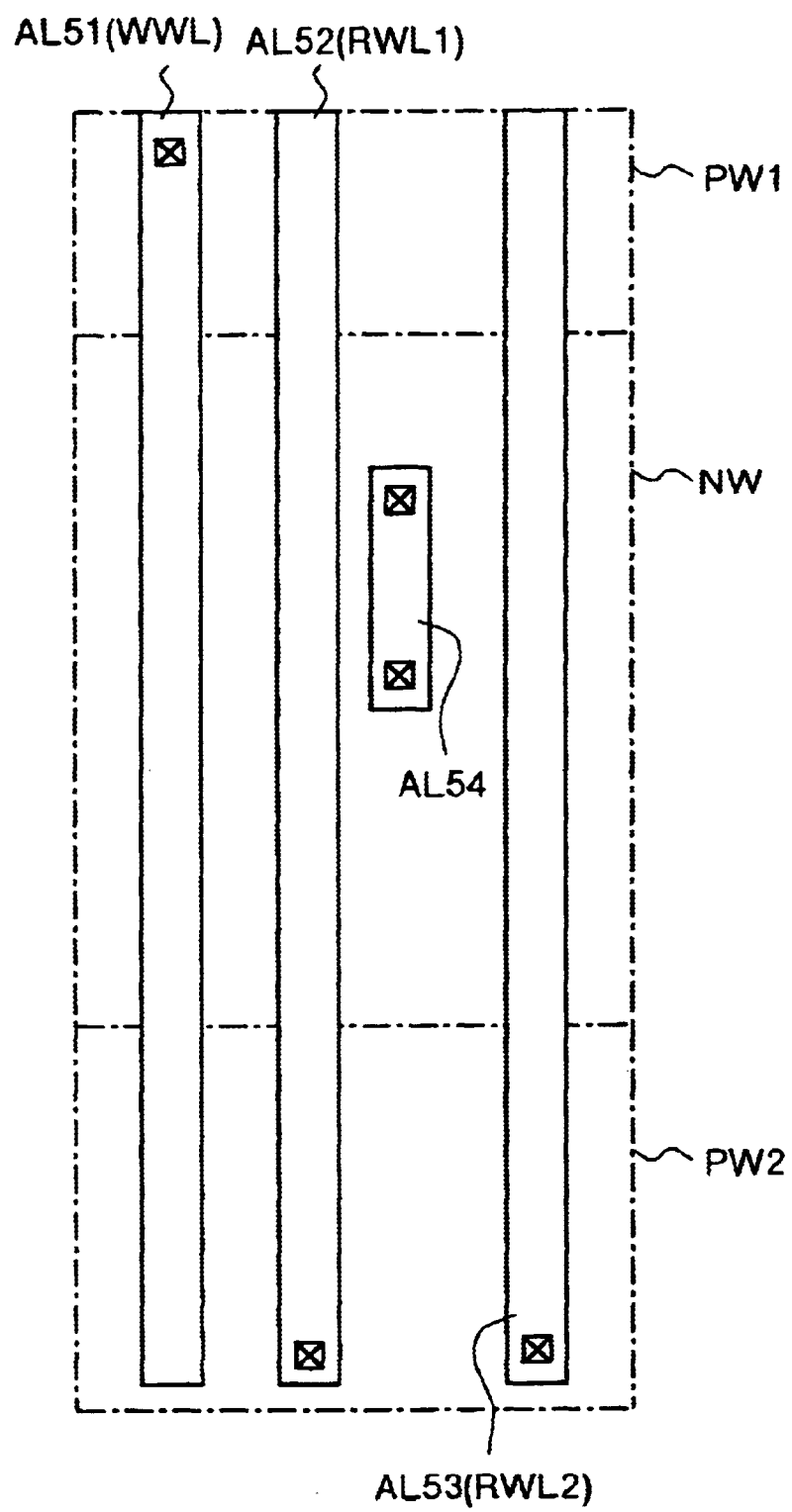
FIG. 49 is a diagram showing the layout of the SRAM memory cell comprising the semiconductor storage apparatus according to the fourteenth embodiment.

FIG. 45 is a circuit diagram showing the SRAM memory cell of the semiconductor storage apparatus according to the fourteenth embodiment. As shown in FIG. 45, the SRAM memory cell of the fourteenth embodiment comprises the circuit shown in FIG. 17. The SRAM memory cell of FIG. 45 further comprises an inverter comprising a PMOS transistor PM21 connected in complement with an NMOS transistor NM21, an inverter comprising a PMOS transistor PM22 connected in complement with an NMOS transistor NM22, and NMOS transistors for access N5 and N6 which are connected at the output terminals of the inverters. The gate of the NMOS transistor for access N5 is connected to a read word line RWL1. The gate of the NMOS transistor for access N6 is connected to a read word line RWL2.

The input terminals of the inverters are connected to the storage node NB of the section corresponding to the circuit of FIG. 17. This constitution obtains a three-port SRAM memory cell capable of writing/reading on the word line WWL and reading on the two read word lines RWL1 and RWL2.

Subsequently, the layout constitution of the semiconductor storage apparatus according to the fourteenth embodiment will be explained. FIG. 46 to FIG. 49 are diagrams showing the layout of the SRAM memory cell of the semiconductor storage apparatus according to the fourteenth embodiment, and show the layers in the order in which they are laminated from the bottom layer. In FIG. 46 to FIG. 49, the parts corresponding to the MOS transistors shown in FIG. 45 are represented by the same legends. Legends AL11 to AL22 represent first metal interconnection layers, legends AL31 to AL43 represent second metal interconnection layers, and legends AL51 to AL54 represent third metal interconnection layers. The layers are connected in the same manner as in the embodiments already described and will not be further explained here.

As described above, according to the semiconductor storage apparatus of the fourteenth embodiment, soft error tolerance can be increased and the effects of the seventh embodiment can be obtained even when using a three-port SRAM memory cell which comprises one write/read port and two read-only ports.

Subsequently, the semiconductor storage apparatus according to a fifteenth embodiment will be explained. The fifteenth embodiment adds two pairs of NMOS transistors for access to the SRAM memory cell constitution of FIG. 12 which was described in the fourth embodiment, and provides a specific layout constitution for a two-port SRAM memory cell.

Figure 50:
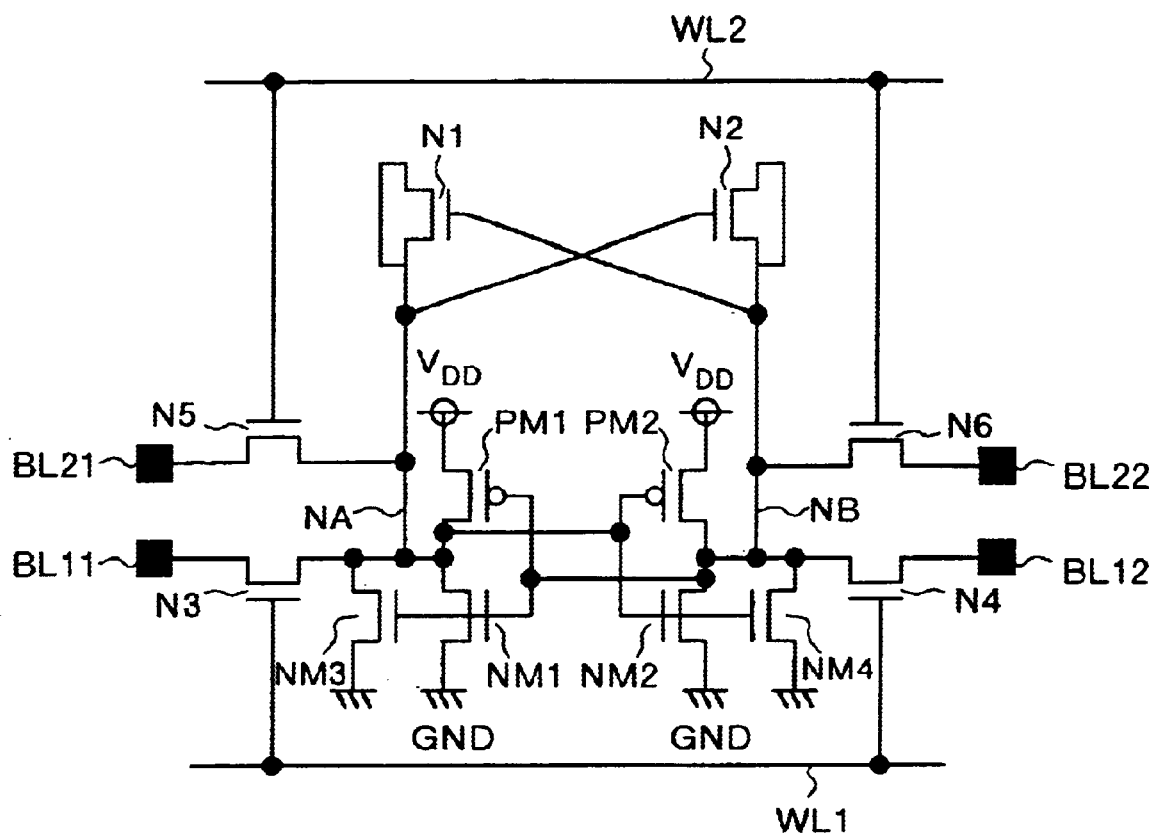
FIG. 50 is a circuit diagram showing an SRAM memory cell comprising the semiconductor storage apparatus according to a fifteenth embodiment.

FIG. 50 is a circuit diagram showing an SRAM memory cell of the semiconductor storage apparatus according to the fifteenth embodiment. In FIG. 50, the PMOS transistor PM1 and the NMOS transistors NM1 and NM3 form a first CMOS inverter. The PMOS transistor PM2 and the NMOS transistors NM2 and NM4 form a second CMOS inverter. The input and output terminal between the CMOS inverters are crisscross connected.

The MOS transistors PM1, PM2, NM1, NM2, NM3 and NM4 form a flip-flop. In FIG. 50, the logical statuses can be read and written at the storage node NA, which constitutes the output point of the first CMOS inverter and the input point of the second CMOS inverter, and at the storage node NB, which constitutes the output point of the second CMOS inverter and the input point of the first CMOS inverter.

The NMOS transistors N3, N4, N5 and N6 function as MOS transistors for access. The gate of the NMOS transistor N3 is connected to the first word line WL1, its source is connected to the storage node NA, and its drain is connected to a first regular-phase bit line BL11. The gate of the NMOS transistor N5 is connected to the second word line WL2, its source is connected to the storage node NA, and its drain is connected to a second regular-phase bit line BL21.

The gate of the NMOS transistor N4 is connected to the first word line WL1, its source is connected to the storage node NB, and its drain is connected to a first inverse-phase bit line BL12. The gate of the NMOS transistor N6 is connected to the second word line WL2, its source is connected to the storage node NB, and its drain is connected to a second inverse-phase bit line BL22.

The circuit diagram of FIG. 50 shows a case in which the terminals WL11 and WL12 shown in FIG. 3 are connected through a first word line WL1, and the terminals WL21 and WL22 are connected through a second word line WL2. Consequently, it is possible to read stored values at a first port by selecting the first word line WL1, the first regular-phase bit line BL11, and the first inverse-phase bit line BL12. Furthermore, it is possible to read stored values at a second port by selecting the second word line WL2, the second regular-phase bit line BL21, and the second inverse-phase bit line BL22.

In FIG. 50, the two NMOS transistor N1 and N2 are added and their sources and drains are connected together. In particular, the drain of the NMOS transistor N1 is connected to the storage node NA and its gate is connected to the storage node NB. The drain of the NMOS transistor N2 is connected to the storage node NB and its gate is connected to the storage node NA.

Figure 51:
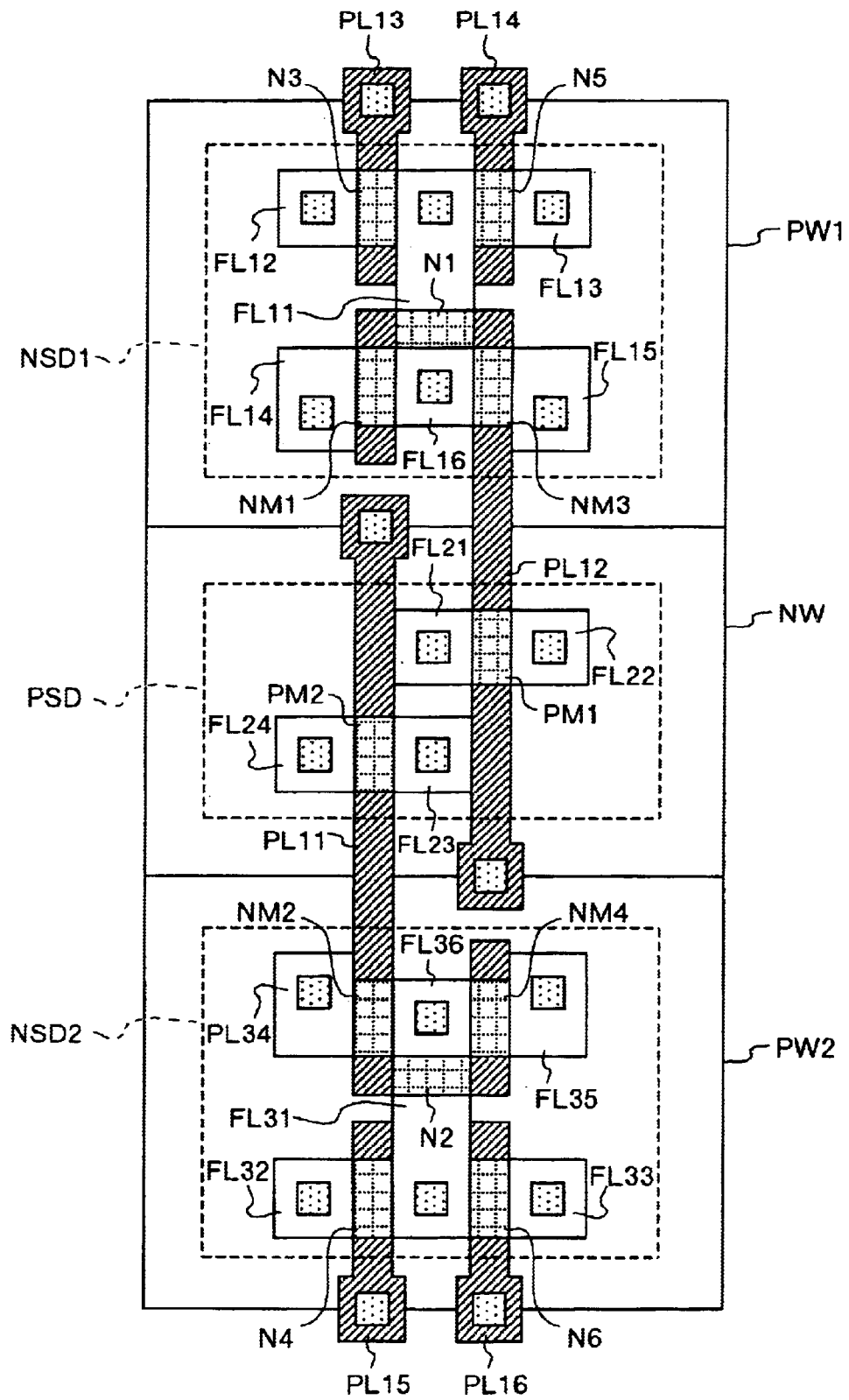
FIG. 51 is a diagram showing the layout of the SRAM memory cell comprising the semiconductor storage apparatus according to the fifteenth embodiment.

FIG. 51 to FIG. 54 show layouts of the SRAM memory cell of the semiconductor storage apparatus according to the fifteenth embodiment. FIG. 51 shows a layer which comprises a well region provided in a semiconductor substrate, a diffusion region provided in the well region, and a polysilicon interconnection layer provided thereabove.

As shown in FIG. 51, in the memory cell of the semiconductor storage apparatus according to the fifteenth embodiment, a first P well region PW1, an N well region NW and a second P well region PW2 are provided in that order parallel to the top face of the semiconductor substrate. That is, the two P well regions PW1 and PW2 are divided on either side of the N well region NW.

The well regions are arranged such that the interface between the first P well region PW1 and the N well region NW (hereinafter termed "first well interface") is parallel to the interface between the second P well region PW2 and the N well region NW (hereinafter termed "second well interface"). There are separating regions between the N well region NW and the first P well region PW1, and between the N well region NW and the second P well regions PW2, but these are not shown in FIG. 51.

An $N^+$ source drain region NSD1 is provided in the P well region PW1, a $P^+$ source drain region PSD is provided in the N well region NW by injecting P-type impurities, and an $N^+$ source drain region NSD2 is provided in the P well region PW2.

The NMOS transistors NM1, NM3, N1, N3 and N5 shown in FIG. 50 are provided in the $N^+$ source drain region NSD1, the PMOS transistors PM1 and PM2 shown in FIG. 50 are provided in the $P^+$ source drain region PSD, and the NMOS transistors NM2, NM4, N2, N4 and N6 shown in FIG. 50 are provided in the $N^+$ source drain region NSD2.

The structure of each of the layers shown in FIG. 51 to FIG. 54 will be explained in order. In the layer shown in FIG. 51, two polysilicon interconnection layers PL13 and PL14 are provided in the first P well region PW1 and extend at right angles to the first well interface. Similarly, two polysilicon interconnection layers PL15 and PL16 are provided in the second P well region PW2 and extend at right angles to the second well interface.

A hook-like polysilicon interconnection layer PL12 is provided from the N well region NW to the first P well region PW1. The polysilicon interconnection layer PL12 extends at at right angle to the first well interface and its hooked section is positioned in the first P well region PW1. As shown in FIG. 51, the two axes comprising the hooked section of the polysilicon interconnection layer PL12 (main axis and bent axis) are provided so as to match the axes of the two polysilicon interconnection layers PL13 and PL14 respectively. In FIG. 51, the main axis of the polysilicon interconnection layer PL12 matches the polysilicon interconnection layer PL14. The other end of the polysilicon interconnection layer PL12 is provided over the second well interface.

Similarly, a hook-like polysilicon interconnection layer PL11 is provided from the N well region NW to the second P well region PW2. The polysilicon interconnection layer PL11 extends at a right angle to the second well interface and its hooked section is positioned in the second P well region PW2. As shown in FIG. 51, the two axes comprising the hooked section of the polysilicon interconnection layer PL11 are provided so as to match the axes of the two polysilicon interconnection layers PL15 and PL16 respectively. In FIG. 51, the main axis of the polysilicon interconnection layer PL11 matches the polysilicon interconnection layer PL15. The other end of the polysilicon interconnection layer PL11 is provided over the first well interface.

$N^+$ diffusion regions FL11 and FL12 are provided by injecting N-type impurities on each side of the polysilicon interconnection layer PL13 in the first P well region PW1, thereby forming the NMOS transistor N3 which has the polysilicon interconnection layer PL13 as its gate electrode. $N^+$ diffusion regions FL11 and FL13 are provided on either side of the polysilicon interconnection layer PL14, thereby forming the NMOS transistor N5 which has the polysilicon interconnection layer PL14 as its gate electrode.

Since the NMOS transistors N3 and N5 are aligned with the polysilicon interconnection layers PL13 and PL14, the $N^+$ diffusion regions FL11 to FL13 can be provided in a straight line which is parallel to the first well interface. Therefore, the $N^+$ diffusion region FL11 can be shared by the NMOS transistors N3 and N5. According to the circuit diagram of FIG. 50, sharing the $N^+$ diffusion region FL11 has the effects of connecting the sources of the NMOS transistors N3 and N5 and reducing the area they occupy.

$N^+$ diffusion regions FL15 and FL16 are provided by injecting N-type impurities on each side of the main axis of the hooked section of the polysilicon interconnection layer PL12 in the first P well region PW1, thereby forming the NMOS transistor NW3 which has the main axis of the polysilicon interconnection layer PL12 as its gate electrode. Furthermore, $N^+$ diffusion regions FL14 and FL16 are provided on either side of the bent axis of the hooked section of the polysilicon interconnection layer PL12, thereby forming the NMOS transistor NM1 which has the bent axis of the polysilicon interconnection layer PL12 as its gate electrode. According to the circuit shown in FIG. 50, the hooked section of the polysilicon interconnection layer PL12 connects the gates of the NMOS transistors NM1 and NM3. The $N^+$ diffusion region FL16 is provided together with the $N^+$ diffusion region FL11.

As is the case with the NMOS transistors N3 and N5, since the NMOS transistors NM1 and NM3 are aligned with the main axis and bent axis of the hooked section of the polysilicon interconnection layer PL12, the N⁺ diffusion regions FL14 to FL16 can be provided in a straight line which is parallel to the first well interface. Therefore, the N⁺ diffusion region FL16 can be shared by the NMOS transistors NM1 and NM3. According to the circuit diagram of FIG. 50, sharing the N⁺ diffusion region FL16 has the effects of connecting the drains of the NMOS transistors NM1 and NM3, and reducing the area they occupy.

The bent section of the polysilicon interconnection layer PL12 inevitably forms the gate of the NMOS transistor N1 which has the N⁺ diffusion regions FL11 and FL16 as its source and drain respectively. Consequently, the source of the NMOS transistor N1, which has been newly appended in order to increase the capacity of the storage node NA, can be shared with the sources of the NMOS transistors N3 and N5. In addition, the drain of the NMOS transistor N1 can be shared with the drains of the NMOS transistors NM1 and NM3. Therefore, the area occupied by the NMOS transistor N1 can be reduced.

As shown in FIG. 51, the polysilicon interconnection layer PL14 and the main axis of the polysilicon interconnection layer PL12 are provided on the same straight line. This is also true of the polysilicon interconnection layer PL13 and the bent axis of the polysilicon interconnection layer PL12. Therefore, gaps between the NMOS transistors NM1 and NM3 and the NMOS transistor N3 and N5 can be made smaller, enabling the area occupied by the five NMOS transistors in the first P well region PW1 to be reduced.

Similarly, N⁺ diffusion regions FL31 and FL32 are provided by injecting N-type impurities on each side of the polysilicon interconnection layer PL15 in the second P well region PW2, thereby forming the NMOS transistor N4 which has the polysilicon interconnection layer PL15 as its gate electrode. Furthermore, N⁺ diffusion regions FL31 and FL33 are provided by injecting N-type impurities on each side of the polysilicon interconnection layer PL16, thereby forming the NMOS transistor N6 which has the polysilicon interconnection layer PL16 as its gate electrode.

Since the NMOS transistors N4 and N6 are aligned with the polysilicon interconnection layers PL15 and PL16, the N⁺ diffusion regions FL31 to FL33 can be provided in a straight line which is parallel to the second well interface. Therefore, the N⁺ diffusion region FL31 can be shared by the NMOS transistors N4 and N6. According to the circuit diagram of FIG. 50, sharing the N⁺ diffusion region FL16 has the effects of connecting the sources of the NMOS transistors N4 and N6, and reducing the area they occupy.

N⁺ diffusion regions FL34 and FL36 are provided by injecting N-type impurities on each side of the main axis of the hooked section of the polysilicon interconnection layer PL11 in the second P well region PW2, thereby forming the NMOS transistor NW2 which has the main axis of the polysilicon interconnection layer PL11 as its gate electrode. Furthermore, N⁺ diffusion regions FL35 and FL36 are provided on either side of the bent axis of the hooked section of the polysilicon interconnection layer PL11, thereby forming the NMOS transistor NM4 which has the bent axis of the polysilicon interconnection layer PL11 as its gate electrode. According to the circuit shown in FIG. 50, the hooked section of the polysilicon interconnection layer PL11 connects the gates of the NMOS transistors NM2 and NM4.

As is the case with the NMOS transistors N4 and N6 mentioned above, since the NMOS transistors NM2 and NM4 are aligned with the main axis and bent axis of the hooked section of the polysilicon interconnection layer PL11, the N⁺ diffusion regions FL34 to FL36 can be provided in a straight line which is parallel to the second well interface. Therefore, the N⁺ diffusion region FL36 can be shared by the NMOS transistors NM2 and NM4. According to the circuit diagram of FIG. 50, sharing the N⁺ diffusion region FL36 has the effects of connecting the drains of the NMOS transistors NM2 and NM4, and reducing the area they occupy.

The bent section of the polysilicon interconnection layer PL11 inevitably forms the gate of the NMOS transistor N2 which has the N⁺ diffusion regions FL31 and FL36 as its source and drain respectively. Consequently, the source of the NMOS transistor N2, which has been newly appended in order to increase the capacity of the storage node NB, can be shared with the sources of the NMOS transistors N4 and N6. In addition, the drain of the NMOS transistor N2 can be shared with the drains of the NMOS transistors NM2 and NM4. Therefore, the area occupied by the NMOS transistor N2 can be reduced.

As shown in FIG. 51, the polysilicon interconnection layer PL15 and the main axis of the polysilicon interconnection layer PL11 are provided on the same straight line. This is also true of the polysilicon interconnection layer PL16 and the bent axis of the polysilicon interconnection layer PL11. Therefore, gaps between the NMOS transistors NM2 and NM4 and the NMOS transistors N4 and N6 can be made smaller, enabling the area occupied by the five NMOS transistors in the second P well region PW2 to be reduced.

P⁺ diffusion regions FL21 and FL22 are provided by injecting P-type impurities on each side of the main axis of the polysilicon interconnection layer PL12 in the N well region NW, thereby forming the PMOS transistor PM1 which has the main axis of the polysilicon interconnection layer PL12 as its gate electrode. Furthermore, P⁺ diffusion regions FL23 and FL24 are provided on each side of the main axis of the polysilicon interconnection layer PL11, thereby forming the PMOS transistor PM2 which has the main axis of the polysilicon interconnection layer PL11 as its gate electrode.

The arrangement of the PMOS transistors PM1 and PM2 is determined according to the positions of the polysilicon interconnection layers PL11 and PL12. As shown in FIG. 51, the gap between the polysilicon interconnection layers PL11 and PL12 can be made approximately as narrow as the size of the P⁺ diffusion regions FL21 and FL23 (the minimum pitch of the transistors). The total area required by the memory cell layout can be reduced to a minimum by making the P⁺ diffusion regions FL21 and FL23 approximately the same size as the P⁺ diffusion regions FL11 and FL16 of the first P well region PW1 and the P⁺ diffusion regions FL31 and FL36 of the second P well region PW2.

As shown in FIG. 51, one connector hole is provided in each of the polysilicon interconnection layers PL11, PL12, PL13, PL14, PL15 and PL16, the P⁺ diffusion regions FL21 to FL24, and the N⁺ diffusion regions FL11 to FL16, and FL31 to FL36. The connector holes electrically connect these layers/regions with the layer above.

Figure 52:
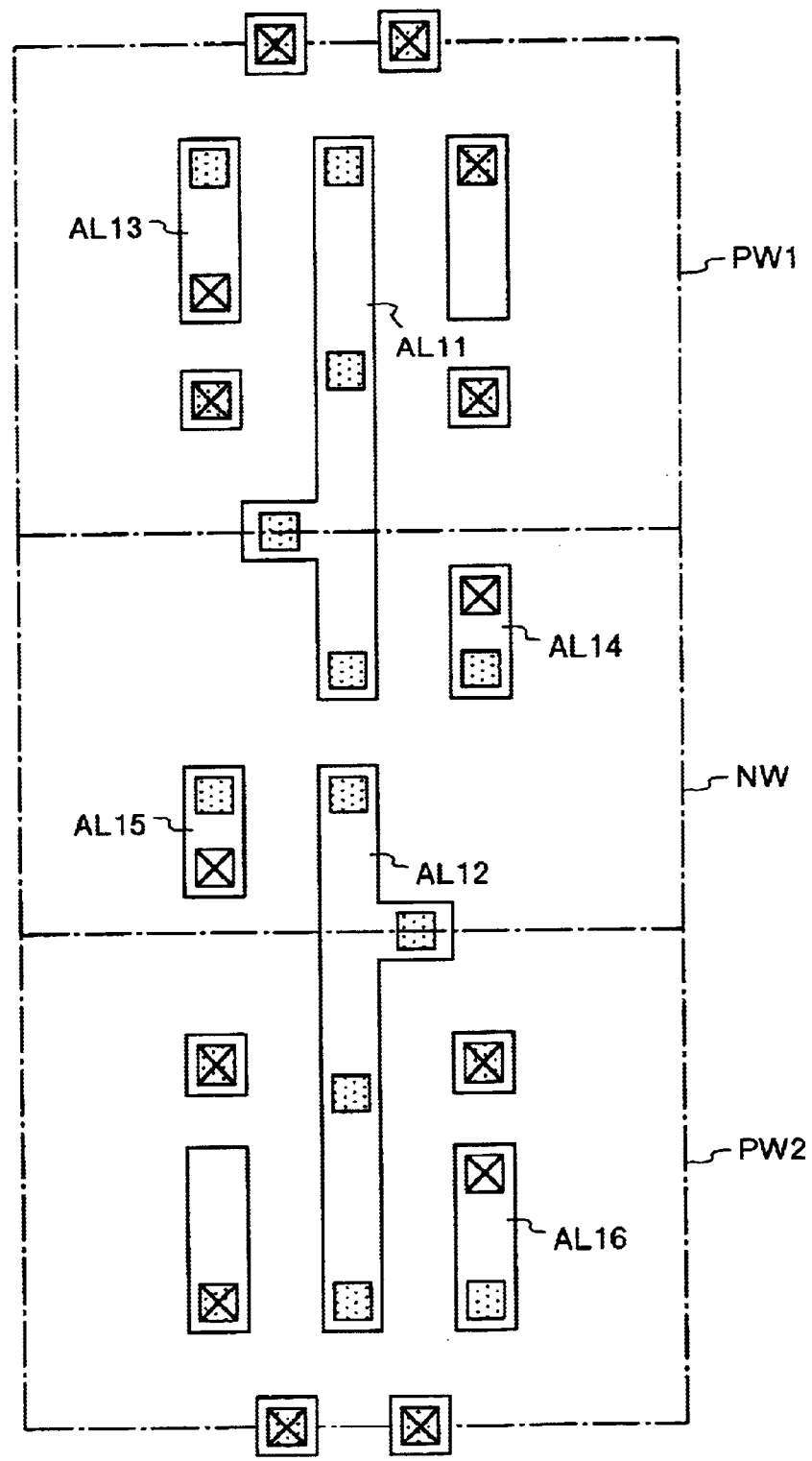
FIG. 52 is a diagram showing the layout of the SRAM memory cell comprising the semiconductor storage apparatus according to the fifteenth embodiment.

Subsequently, the layer provided on the layer shown in FIG. 51 will be explained. FIG. 52 shows a layer comprising a first metal interconnection layer which is provided on the layer shown in FIG. 51. The layer shown in FIG. 52 comprises a first metal interconnection layer AL11 for electrically connecting the N⁺ diffusion regions FL11 and FL16, the P⁺ diffusion region FL21, and the polysilicon interconnection layer PL11. According to the circuit constitution shown in FIG. 50, the first metal interconnection layer AL11 connects the drain of the PMOS transistor PM1, the drain of the NMOS transistor NM1, the drain of the NMOS transistor NM3, the drain of the NMOS transistor N1, the gate of the NMOS transistor N2, the gate of the PMOS transistor PM2, the gate of the NMOS transistor NM2, the source of the NMOS transistor N3, the gate of the NMOS transistor NM4, and the source of the NMOS transistor N5.

A first metal interconnection layer AL12 is also provided, and electrically connects the $N^+$ diffusion regions FL31 and FL36, the $P^+$ diffusion region FL23, and the polysilicon interconnection layer PL12. According to the circuit constitution shown in FIG. 50, the first metal interconnection layer AL12 connects the drain of the PMOS transistor PM2, the drain of the NMOS transistor NM2, the drain of the NMOS transistor NM4, the drain of the NMOS transistor N2, the gate of the NMOS transistor N1, the gate of the PMOS transistor PM1, the gate of the NMOS transistor NM1, the gate of the NMOS transistor NM3, the source of the NMOS transistor N4, and the source of the NMOS transistor N6.

In the first metal interconnection layer AL11, since the connections with the $P^+$ diffusion region FL21 and the $N^+$ diffusion regions FL11 and FL16 are provided in a straight line as described above, the interconnection which connects these three points can be made linear. The same goes for the second metal interconnection layer AL12.

The layer shown in FIG. 52 further comprises a first metal interconnection layer AL13 for moving the connection point of the $N^+$ diffusion region FL12 of the layer below, a first metal interconnection layer AL14 for moving the connection point of the $P^+$ diffusion region FL22, a first metal interconnection layer AL15 for moving the connection point of the $P^+$ diffusion region FL24, and a first metal interconnection layer AL16 for moving the connection point of the $N^+$ diffusion region FL33.

Figure 53:
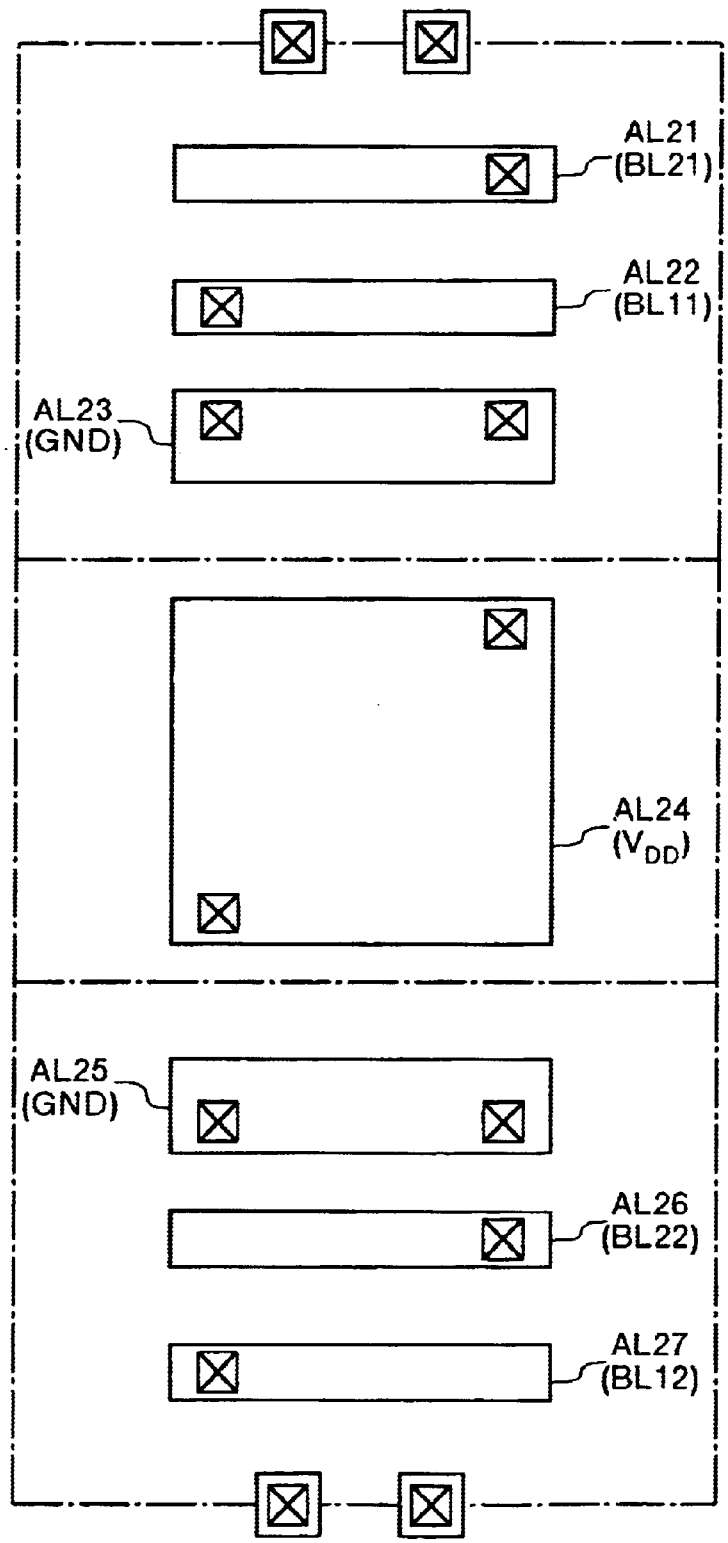
FIG. 53 is a diagram showing the layout of the SRAM memory cell comprising the semiconductor storage apparatus according to the fifteenth embodiment.

Subsequently, a layer which is provided on the layer shown in FIG. 52 will be explained. FIG. 53 shows a layer comprising a second metal interconnection layer which is provided on the layer shown in FIG. 52. The layer shown in FIG. 53 comprises a second metal interconnection layer AL24 for applying a power potential $V_{DD}$ via the first metal interconnection layer AL14 of FIG. 52 to the $P^+$ diffusion region FL22, and applying the power potential $V_{DD}$ via the first metal interconnection layer AL15 to the $P^+$ diffusion region FL24. The second metal interconnection layer AL24 functions as a power line and, according to the circuit constitution of FIG. 50, connects the sources of the PMOS transistors PM1 and PM2 to the power source.

Second metal interconnection layers AL23 and AL25 are also provided, and apply a ground potential GND via the contact hole+via hole shown in FIG. 52 to the $N^+$ diffusion regions FL14 and FL15, and the $N^+$ diffusion regions FL34 and FL35 respectively. The second metal interconnection layers AL23 and AL25 function as ground lines and, according to the circuit constitution of FIG. 50, ground the sources of the NMOS transistors NM1 to NM4.

As shown in FIG. 51, since the $N^+$ diffusion regions FL14 and FL15 are provided in a straight line which is parallel to the first well interface, the contact holes on these $N^+$ diffusion regions can be provided such that a straight line linking the holes is parallel to the first well interface. That is, the second metal interconnection layer AL23 shown in FIG. 53 can be made linear and parallel to the first well interface. The same goes for the second metal interconnection layer AL25.

The layer shown in FIG. 53 further comprises a second metal interconnection layer AL21 which is connected via the contact hole+via hole of FIG. 52 to the $N^+$ diffusion region FL13 of the layer below, and functions as a second regular-phase bit line BL21, a second metal interconnection layer AL22 which is connected to the $N^+$ diffusion region FL12 and functions as a first regular-phase bit line BL11, a second metal interconnection layer AL26 which is connected to the $N^+$ diffusion region FL33 and functions as a second inverse-phase bit line BL22, and a second metal interconnection layer AL27 which is connected to the $N^+$ diffusion region FL32 and functions as a first inverse-phase bit line BL12.

In the circuit diagram shown in FIG. 50, these second metal interconnection layers AL21, AL22, AL26 and AL27 respectively connect the drain of the NMOS transistor N3 to the first regular-phase bit line BL11, the drain of the NMOS transistor N5 to the second regular-phase bit line BL21, the drain of the NMOS transistor N4 to the first inverse-phase bit line BL12, and the drain of the NMOS transistor N6 to the second inverse-phase bit line BL22.

The second metal interconnection layers AL21, AL22, AL26 and AL27 can be provided in a straight line which extends parallel to the first well interface. In a single memory cell, this makes it possible to shorten the lengths of the first regular-phase bit line BL11, the second regular-phase bit line BL12, the first inverse-phase bit line BL12, and the second inverse-phase bit line BL22.

Figure 54:
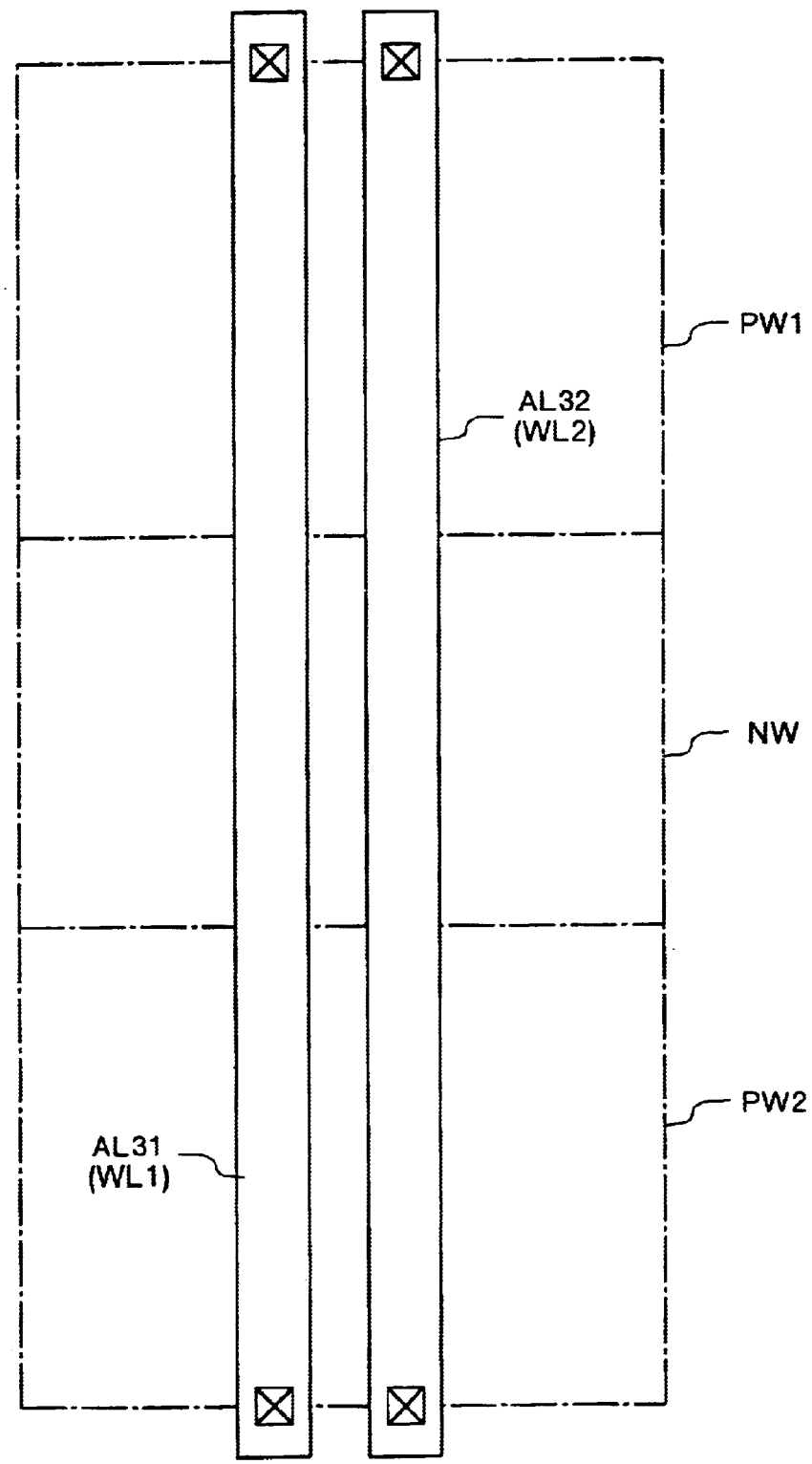
FIG. 54 is a diagram showing the layout of the SRAM memory cell comprising the semiconductor storage apparatus according to the fifteenth embodiment.
Figure 55:
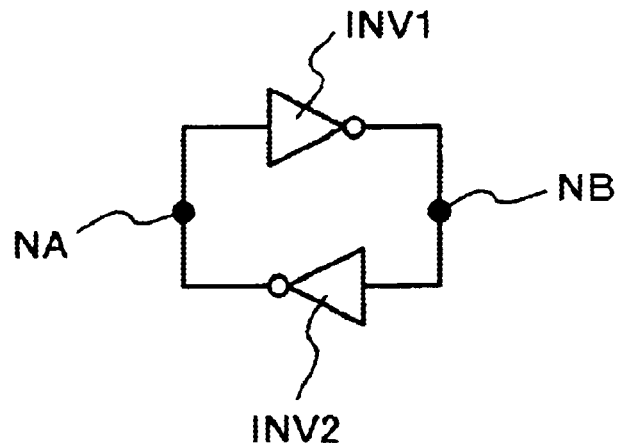
FIG. 55 is a circuit diagram showing a conventional CMOS SRAM memory cell.
Figure 56:
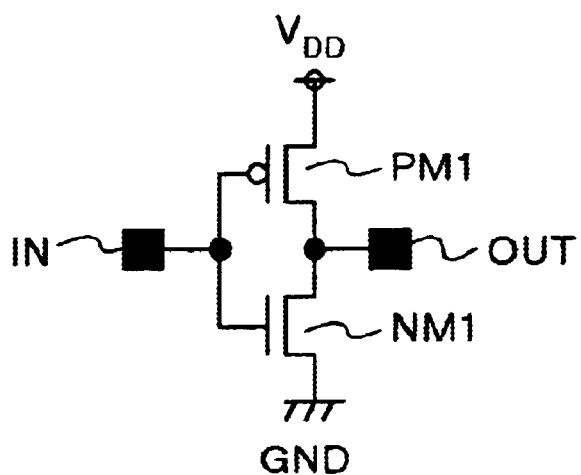
FIG. 56 is a circuit diagram showing a conventional CMOS inverter.

Subsequently, a layer provided on the layer shown in FIG. 53 will be explained. FIG. 54 shows a layer comprising a third metal interconnection layer which is provided on the layer shown in FIG. 53. The layer shown in FIG. 54 comprises a third metal interconnection layer AL31 which connects the polysilicon interconnection layers PL13 and PL15 via the via hole, and functions as a first word line WL1. In the circuit constitution of FIG. 50, the third metal interconnection layer AL31 connects the gates of the NMOS transistors N3 and N4 to the first word line WL1.

The layer shown in FIG. 54 further comprises a third metal interconnection layer AL32 which connects the polysilicon interconnection layers PL14 and PL16 via the via hole, and functions as a second word line WL2. In the circuit constitution of FIG. 50, the third metal interconnection slayer AL32 connects the gates of the NMOS transistors N5 and N6 to the second word line WL2.

As shown in FIG. 51, since the polysilicon interconnection layers PL13 and PL15 are provided on the same straight line extending at a right angle to the first well interface, the contact holes and the like on the polysilicon interconnection layers and the straight line linking both contacts holes and the like can be provided at a right angle to the first well interface. Therefore, the third metal interconnection layer AL31 shown in FIG. 54 can be made linear and extending at a right angle to the first well interface. The same goes for the third metal interconnection layer AL32. This enables the length of the first metal interconnection layer AL31 and the second metal interconnection layer AL32 to be made even shorter within a single memory cell.

As described above, according to the semiconductor storage apparatus of the fifteenth embodiment, the PMOS transistors P1 and P2 for increasing the capacity of the storage nodes NA and NB share the $P^+$ diffusion region FL16. The connection between the drain of the NMOS transistor N1 and the drain of the NMOS transistor NM1, that is, the connection between the storage node NA and the NMOS transistor N1 is achieved by sharing the $P^+$ diffusion region FL16. The connection between the drain of the NMOS transistor N2 and the drain of the NMOS transistor NM2, that is, the connection between the storage node NB and the NMOS transistor N2 is achieved by sharing the P$^+$ diffusion region FL36. Therefore, the area occupied by the newly appended NMOS transistors N1 and N2 can be reduced, thereby enabling the memory cell array to be integrated more highly.

As described above, according to this invention, load transistors such as, for example, diode-connected MOS transistors are connected to the drains of a first NMOS transistor and a second NMOS transistor NM1, there by obtaining an SRAM memory cell. The drain of a first PMOS transistor and the gate of a second PMOS transistor are connected to a first node which is a storage node. The drain of the second PMOS transistor and the gate of the first PMOS transistor are connected to a second node which is another storage node. The gate capacity and drain capacity of the PMOS transistors can be added to the storage nodes, achieving the advantages that mistaken operations such as inversion of stored data caused by external factors such as a rays are unlikely to happen, and soft error tolerance can be increased.

Further, an inverter comprising the first NMOS transistor and the third PMOS transistor is connected in complement with an inverter comprising the second NMOS transistor and the fourth PMOS transistor, thereby forming an SRAM memory cell. The drain of the first PMOS transistor and the gate of a second PMOS transistor are connected to the first node which is the storage node. The drain of the second PMOS transistor and the gate of the first PMOS transistor are connected to the second node which is the other storage node. The gate capacity and drain capacity of the PMOS transistors can be added to the storage nodes, achieving the advantages that mistaken operations such as inversion of stored data caused by external factors such as α rays are unlikely to happen, and soft error tolerance can be increased.

Further, a common P$^+$ diffusion region is provided between the first PMOS transistor and the third PMOS transistor and is connected to their drains, and a common P$^+$ diffusion region is provided between the second PMOS transistor and the fourth PMOS transistor and is connected to their drains. Therefore, the area occupied by the PMOS transistors can be reduced even when the first and second PMOS transistors, which are not involved with the operation of storing, have been appended.

Further, the sources of the first PMOS transistor and the second PMOS transistor appended to the first and second nodes which function as the storage nodes are connected together. Therefore, when the first PMOS transistor or the second PMOS transistor has switched ON in accordance with the storage status of the storage nodes, the source capacity of the PMOS transistor which has switched ON can be appended to the storage node, thereby achieving the advantages that mistaken operations such as inversion of stored data caused by external factors such as α rays are unlikely to happen, and soft error tolerance can be increased.

Further, a common P$^+$ diffusion region is provided between the first PMOS transistor and the second PMOS transistor and is connected to their sources. Therefore, the area occupied by the first and second PMOS transistors can be reduced.

Further, the source and drain of the first PMOS transistor are connected together, and the source and drain of the second PMOS transistor are connected together. Consequently, the source capacity and drain capacity of the first PMOS transistor, and the gate capacity of the second PMOS transistor, can be appended to the first node comprising a storage node, and the source capacity and drain capacity of the second PMOS transistor, and the gate capacity of the first PMOS transistor, can be appended to the second node comprising a storage node. This achieves the advantages that mistaken operations such as inversion of stored data caused by external factors such as a rays are unlikely to happen, and soft error tolerance can be increased.

Further, NMOS transistors can be used instead of the first and/or second PMOS transistor(s) added in order to append capacity to the storage nodes. Depending on the constitution of the layout of the memory cell, using an NMOS transistor as the newly added MOS transistor is particularly effective in reducing the cell area.

Further, the above-mentioned first and second PMOS transistors and the like are added to an SRAM memory cell in which one NMOS transistor for access for reading and writing stored data is connected to each of the first node and the second node which are the storage nodes, or to a two-port SRAM memory cell in which two of the NMOS transistors for access are connected to each storage node. Therefore, the gate capacity and the like of the PMOS transistors can be appended to the storage nodes, increasing the soft error tolerance.

Further, the first, second, third and fourth PMOS transistors are provided in the same N well region. Therefore, the shared diffusion region which forms the drains and sources of the PMOS transistors and connects the PMOS transistor together can be provided easily, and the area can be reduced.

Further, the SRAM memory cell comprises an inverter comprising the first NMOS transistor and the third PMOS transistor, and an inverter comprising a second NMOS transistor and a fourth PMOS transistor, the two inverters being connected together in complement. The drain of the first PMOS transistor and the gate of the second PMOS transistor are connected to the first node which is a storage node, and the drain of the second PMOS transistor and the gate of the first PMOS transistor are connected to the second node which is a storage node. Therefore, a constitution which the gate capacities and drain capacities of the PMOS transistors are appended to the storage nodes can be realized by using a CMOS gate array. In particular, the MOS transistor which needed to be isolated in the conventional constitution can be used as the newly added first and second PMOS transistors. Therefore, it is possible to prevent the scale of the circuit from increasing.

According to another aspect of this invention, shared diffusion regions for providing the drains and sources of the first, third, fifth and seventh NMOS transistors and connecting them together can easily be provided therebetween. Furthermore, shared diffusion regions for providing the drains and sources of the second, fourth, sixth and eighth NMOS transistors and connecting them together can easily be provided therebetween. Therefore, their area can be reduced even further.

Further, a shared diffusion region for providing the drains and connections of the seventh NMOS transistor, the first NMOS transistor and the first PMOS transistor can be provided easily. Furthermore, a shared diffusion region for providing the drains and connections of the eighth NMOS transistor, the second NMOS transistor and the second PMOS transistor can be provided easily. Therefore, their area can be reduced even further.

Further, a seventh NMOS transistor can be provided in a common N$^+$ diffusion region which provides the drain of the first NMOS transistor and the sources of the third and fifth NMOS transistors. Therefore, the seventh NMOS transistor can be provided near to the first, third and fifth NMOS transistors. Further, an eighth NMOS transistor can be provided in a common N+ diffusion region which provides the drain of the second NMOS transistor and the sources of the fourth and sixth NMOS transistors. Therefore, the eighth NMOS transistor can be provided near to the second, fourth and sixth NMOS transistors. Consequently, the area of the NMOS transistors can be further reduced.

Further, the gates of the seventh NMOS transistor, the first NMOS transistor and the first PMOS transistor can easily be provided near to the shared diffusion region which provides the drains of and connects the seventh NMOS transistor, the first NMOS transistor and the first PMOS transistor. Further, the gates of the eighth NMOS transistor, the second NMOS transistor and the second PMOS transistor can easily be provided near to the shared diffusion region which provides the drains of and connects the eighth NMOS transistor, the second NMOS transistor and the second PMOS transistor. Therefore, their area can be further reduced.

Further, the gates of the first NMOS transistor, the first NMOS transistor and the seventh NMOS transistor can be connected by a single first polysilicon interconnection layer. Further, the gates of the second NMOS transistor, the second PMOS transistor and the eighth NMOS transistor can be connected by a single second polysilicon interconnection layer. Therefore, a layout which reduces the area of the MOS transistors can easily be applied.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor data storage apparatus comprising:
   a first inverter having an input connected to a first node and an output connected to a second node;
   a second inverter having an input connected to the second node and an output connected to the first node;
   a first MOS transistor having a gate electrode connected to the second node and a source electrode and a drain electrode, one of the source and drain electrodes being connected to the first node; and
   a second MOS transistor having a gate electrode connected to the first node and a source electrode and a drain electrode, one of the source and drain electrodes being connected to the second node, wherein
      said first inverter includes a third MOS transistor of a first conductivity type, having a gate electrode connected to the first node and a source electrode and a drain electrode, one of the source and drain electrodes being connected to the second node, and a fourth MOS transistor of a second conductivity type, having a gate electrode connected to the first node and a source electode and a drain electrode, one of the source and drain electrodes being connected to the second node;
      said second inverter includes a fifth MOS transistor of the first conductivity type, having a gate electrode connected to the second node and a source electrode and a drain electrode, one of the source and drain electrodes being connected to the first node, and a sixth MOS transistor of the second conductivity type, having a gate electrode connected to the second node and a source electrode and a drain electrode, one of the source and drain electrodes being connected to the first node;
      one of the source and drain electrodes of said second MOS transistor and one of the source and drain electrodes of the one of said third and fourth MOS transistors, which is of the same conductivity type as said second MOS transistor, share a common diffusion region, and
      one of the source and drain electrodes of said first MOS transistor and one of the source and drain electrodes of one said fifth and sixth MOS transistors, which is of the same conductivity type as said first MOS transistor, share a common diffusion region.

2. The semiconductor data storage apparatus according to claim 1, further comprising at least one seventh MOS transistor having a source electrode and a drain electrode, one of the source and drain electrodes being connected to at least one of said first and second nodes, said at least one seventh MOS transistor reading stored data held at said first and second nodes and writing data to said first and second nodes.

3. A semiconductor data storage apparatus comprising:
   a first inverter having an input connected to a first node and an output connected to a second node;
   a second inverter having an input connected to the second node and an output connected to the first node;
   a first MOS transistor having a gate electrode connected to the second node and a source electrode and a drain electrode, one of the source and drain electrodes being connected to the first node; and
   a second MOS transistor having a gate electrode connected to the first node and a source electrode and a drain electrode, one of the source and drain electrodes being connected to the second node, wherein
      said first inverter includes a third MOS transistor of a first conductivity type, having a gate electrode connected to the first node and a source electrode and a drain electrode, one of the source and drain electrodes being connected to the second node, and a fourth MOS transistor of a second conductivity type, having a gate electrode connected to the first node and a source electrode and a drain electrode, one of the source and drain electrodes being connected to the second node;
      said second inverter includes a fifth MOS transistor of the first conductivity type, having a gate electrode connected to the second node and a source electrode and a drain electrode, one of the source and drain electrodes being connected to the first node, and a sixth MOS transistor of the second conductivity type, having a gate electrode connected to the second node and a source electrode and a drain electrode, one of the source and drain electrodes being connected to the first node; and
      said first and second MOS transistors are of the first conductivity type, and said first, second, third, and fifth MOS transistors are located in a common well region of the second conductivity type.

4. The semiconductor data storage apparatus according to claim 3, further comprising at least one seventh MOS transistor having a source electrode and a drain electrode, one of the source and drain electrodes being connected to at least one of said first and second nodes, said at least one seventh MOS transistor reading stored data held at said first and second nodes and writing data to said first and second nodes.

5. A semiconductor data storage apparatus comprising:
   a first inverter having an input connected to a first node and an output connected to a second node;

a second inverter having an input connected to the second node and an output connected to the first node;

a first MOS transistor having a gate electrode connected to the second node and a source electrode and a drain electrode, one of the source and drain electrodes being connected to the first node;

a second MOS transistor having a gate electrode connected to the first node and a source electrode and a drain electrode, one of the source and drain electrodes being connected to the second node, wherein said first inverter includes a third MOS transistor of a first conductivity type, having a gate electrode connected to the first node and a source electrode and a drain electrode, one of the source and drain electrodes being connected to the second node, and a fourth MOS transistor of a second conductivity type, having a gate electrode connected to the first node and a source electrode and a drain electrode, one of the source and drain electrodes being connected to the second node; and said second inverter includes a fifth MOS transistor of the first conductivity type, having a gate electrode connected to the second node and a source electrode and a drain electrode, one of the source and drain electrodes being connected to the first node, and a sixth MOS transistor of the second conductivity type, having a gate electrode connected to the second node and a source electrode and a drain electrode, one of the source and drain electrodes being connected to the first node;

a seventh MOS transistor of the first conductivity type, having a source electrode and a drain electrode, one of the source and drain electrodes being connected to the first node, the other of the source and drain electrodes being connected to a first bit line transmitting data, and having a gate electrode connected to a first word line; and an eight MOS transistor of the first conductivity type, having a source electrode and a drain electrode, one of the source and drain electrodes being connected to the second node, the other of the source and drain electrodes being connected to a second bit line transmitting data, and having a gate electrode connected to the first word line, wherein said first and second MOS transistors are of the second conductivity type, said first, second, fourth, and sixth MOS transistors are arranged in a first row, said third, fifth, seventh, and eighth MOS transistors are arranged in a second row adjacent to the first row.

6. The semiconductor data storage apparatus according to claim 5, further comprising at least one ninth MOS transistor having a source electrode and a drain electrode, one of the source and drain electrodes being connected to at least one of said first and second nodes, said at least one ninth MOS transistor reading stored data held at said first and second nodes and writing data to said first and second nodes.

7. The semiconductor data storage apparatus according to claim 5, further comprising:

a ninth MOS transistor of the first conductivity type, having a source electrode and a drain electrode, one of the source and drain electrodes being connected to the first node, the other of the source and drain electrodes being connected to a third bit line transmitting data, and having a gate electrode connected to a second word line;

a tenth MOS transistor of the first conductivity type, having a source electrode and a drain electrode, one of the source and drain electrodes being connected to the second node, the other of the source and drain electrodes being connected to a fourth bit line transmitting data, and having a gate electrode connected to the second word line;

an eleventh MOS transistor of the first conductivity type, having a source electrode and a drain electrode, one of the source and drain electrodes being connected to the first node, and having a gate electrode connected to the second node; and a twelfth MOS transistor of the first conductivity type, having a source electrode and a drain electrode, one of the source and drain electrodes being connected to the second node, and having a gate electrode connected to the first node, wherein said ninth to twelfth MOS transistors are arranged in a third row, adjacent to and on an opposite side of the first row from the second row.

8. The semiconductor data storage device according to claim 5, further comprising:

a ninth MOS transistor of the first conductivity type, having a source electrode and a drain electrode, one of the source and drain electrodes being connected to a third node, the other of the source and drain electrodes being connected to a second bit line transmitting data, and having a gate electrode connected to a second word line;

a tenth MOS transistor of the first conductivity type having a source electrode and a drain electrode, one of the source and drain electrodes being connected to a third bit line transmitting data, and having a gate electrode connected to a word line which may be the second word line;

an eleventh MOS transistor of the first conductivity type having a source electrode and a drain electrode, one of the source and drain electrodes being connected to the third node, and having gate electrode connected to the first node; and a twelfth MOS transistor of the first conductivity type, having a source electrode and a drain electrode, one of the source and drain electrodes being connected to the fourth node, and having a gate electrode connected to the second node, wherein said ninth, tenth, and twelfth MOS transistors are arranged in a third row, adjacent to and on an opposite side of the first row from the second row.

9. A semiconductor data storage apparatus comprising:

a first inverter having an input connected to a first node and an output connected to a second node;

a second inverter having an input connected to the second node and an output connected to the first node;

a first MOS transistor having a sate electrode connected to the second node and a source electrode and a drain electrode, one of the source and drain electrodes being connected to the first node; and a second MOS transistor having a gate electrode connected to the first node and a source electrode and a drain electrode, one of the source and drain electrodes being connected to the second node, wherein said first and second MOS transistors are of the same conductivity type, and the source electrodes and drain electrodes of said first and second MOS transistors not connected to the first and second nodes share a common diffusion region.

10. The semiconductor data storage apparatus according to claim 9, further comprising at least one third MOS transistor having a source electrode and a drain electrode, one of the source and drain electrodes being connected to at least one of said first and second nodes, said at least one third MOS transistor reading stored data held at said first and second nodes and writing data to said first and second nodes.

11. The semiconductor data storage apparatus according to claim 9, further comprising:
- a first contact extending from a first diffusion region and connected to the first node, the first diffusion region being the one of source and drain electrodes of said first MOS transistor connected to the first node; and
- a second contact extending from a second diffusion region and connected to the second node, the second diffusion region being the one of source and drain electrodes of said second MOS transistor connected to the second node, wherein the first and second contacts extend from the first and second diffusion regions in first and second directions, but no contacts extend from the common diffusion region in the first or second directions.

12. The semiconductor data storage apparatus according to claim 9, wherein
- said first inverter includes a third MOS transistor of a first conductivity type, having a gate electrode connected to the first node and a source electrode and a drain electrode, one of the source and drain electrodes being connected to the second node, and a fourth MOS transistor of a second conductivity type, having a gate electrode connected to the first node and a source electrode and a drain electrode, one of the source and drain electrodes being connected to the second node; and
- said second inverter includes a fifth MOS transistor of the first conductivity type, having a gate electrode connected to the second note and a source electrode and a drain electrode, one of the source and drain electrodes being connected to the first node, and a sixth MOS transistor of the second conductivity type, having a gate electrode connected to the second node and a source electrode and a drain electrode, one of the source and drain electrodes being connected to the first node.

13. A semiconductor data storage apparatus comprising:
- a first MOS transistor having a gate electrode connected to a first node, a first of a source electrode and a drain electrode receiving a fixed voltage, and a second of said source electrode and said drain electrode connected to a second node;
- a second MOS transistor of the same conductivity type as said first MOS transistor, having a gate connected to the second node, a first of a source electrode and a drain electrode receiving the fixed voltage, and a second of the source electrode an the drain electrode connected to the first node;
- a third MOS transistor having a gate electrode connected to the second node, a first of a source electrode and a drain electrode connected to the first node, and a second of the source electrode and the drain electrode connected to a third node; and
- a fourth MOS transistor of the same conductivity type as said third MOS transistor, having a gate electrode connected to the first node, a first of a source electrode and a drain electrode connected to the second node, and a second of the source electrode and the drain electrode connected to the third node, wherein only said second of the source electrodes and the drain electrodes of said third and fourth MOS transistors are connected to said third node, wherein the second of the source electrodes and the drain electrodes of said third and fourth MOS transistors share a common diffusion region.

14. The semiconductor data storage apparatus according to claim 13, further comprising:
- a fifth MOS transistor having a gate electrode connected to a word line, and a source electrode and a drain electrode, one of the source and drain electrodes being connected to a first bit line, the other of the source and drain electrodes being connected to the first node, and
- a sixth MOS transistor having a gate electrode connected to the word line, and a source electrode and a drain electrode, one of the source and drain electrodes being connected to a second bit line, the other of the source and drain electrodes being connected to the second node.

15. The semiconductor data storage apparatus according to claim 13, further comprising:
- a first contact extending from a first diffusion region and connected to the first node, the first diffusion region being the one of source and drain electrodes of said first MOS transistor connected to the first node; and
- a second contact extending from a second diffusion region and connected to the second node, the second diffusion region being the one of source and drain electrodes of said second MOS transistor connected to the second node, wherein the first and second contacts extend from the first and second diffusion regions in first and second directions, but no contacts extend from common diffusion region in the first or second directions.

* * * * *